United States Patent
Lee et al.

(10) Patent No.: US 12,107,150 B2
(45) Date of Patent: *Oct. 1, 2024

(54) ELECTROLESS PLATING METHOD FOR METAL GATE FILL

(71) Applicant: Taiwan Semiconductor Manufacturing Co., Ltd., Hsinchu (TW)

(72) Inventors: Hsin-Yi Lee, Hsinchu (TW); Chi On Chui, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/324,442

(22) Filed: May 26, 2023

(65) Prior Publication Data

US 2023/0299177 A1 Sep. 21, 2023

Related U.S. Application Data

(63) Continuation of application No. 17/190,267, filed on Mar. 2, 2021, now Pat. No. 11,699,740.

(Continued)

(51) Int. Cl.
*H01L 29/66* (2006.01)
*C23C 18/16* (2006.01)
(Continued)

(52) U.S. Cl.
CPC .... *H01L 29/66545* (2013.01); *C23C 18/1657* (2013.01); *H01L 21/823871* (2013.01);
(Continued)

(58) Field of Classification Search
CPC ....... H01L 29/66545; H01L 21/823871; H01L 29/0665; H01L 29/401; H01L 29/42392; H01L 29/66742; H01L 21/28088; H01L 29/0673; H01L 29/513; H01L 29/66439; H01L 29/78696; H01L 21/288; H01L 21/76877; H01L 29/0847; H01L 29/1079; H01L 29/165; H01L 29/7848; H01L 29/775; H01L 21/823821; H01L 21/823828; H01L 21/823807; H01L 21/823857; H01L 27/092; H01L 29/4966;
(Continued)

(56) References Cited

U.S. PATENT DOCUMENTS

| 11,699,740 B2 * | 7/2023 | Lee ................... H01L 29/78696 438/678 |
| 2006/0160342 A1 | 7/2006 | Doczy et al. |

(Continued)

FOREIGN PATENT DOCUMENTS

| KR | 20080024235 A | 3/2008 |
| KR | 101221376 B1 | 1/2013 |

(Continued)

*Primary Examiner* — Tong-Ho Kim
(74) *Attorney, Agent, or Firm* — Slater Matsil, LLP

(57) ABSTRACT

Embodiments utilize an electro-chemical process to deposit a metal gate electrode in a gate opening in a gate replacement process for a nanosheet FinFET device. Accelerators and suppressors may be used to achieve a bottom-up deposition for a fill material of the metal gate electrode.

20 Claims, 80 Drawing Sheets

Related U.S. Application Data

(60) Provisional application No. 63/081,397, filed on Sep. 22, 2020.

(51) Int. Cl.
*H01L 21/8238* (2006.01)
*H01L 29/06* (2006.01)
*H01L 29/40* (2006.01)
*H01L 29/423* (2006.01)

(52) U.S. Cl.
CPC ........ *H01L 29/0665* (2013.01); *H01L 29/401* (2013.01); *H01L 29/42392* (2013.01); *H01L 29/66742* (2013.01)

(58) Field of Classification Search
CPC ............ C23C 18/1657; C23C 18/1653; C23C 18/1889; C25D 7/123; B82Y 10/00
USPC ........................................................ 438/678
See application file for complete search history.

(56) References Cited

U.S. PATENT DOCUMENTS

| | | |
|---|---|---|
| 2008/0157155 A1 | 7/2008 | Wang |
| 2011/0162969 A1 | 7/2011 | Zhou |
| 2017/0222024 A1* | 8/2017 | Bergendahl ........... H01L 29/785 |
| 2018/0294331 A1 | 10/2018 | Cho et al. |
| 2019/0067121 A1 | 2/2019 | Chiang et al. |
| 2019/0237336 A1* | 8/2019 | Wang ................ H01L 29/78696 |
| 2019/0378911 A1 | 12/2019 | Lee et al. |
| 2020/0006154 A1 | 1/2020 | Chiang et al. |
| 2020/0105889 A1 | 4/2020 | Liaw |
| 2020/0135729 A1 | 4/2020 | Ng et al. |
| 2020/0168722 A1 | 5/2020 | Hung et al. |

FOREIGN PATENT DOCUMENTS

| | | |
|---|---|---|
| KR | 20180113118 A | 10/2018 |
| KR | 20190140564 A | 12/2019 |
| KR | 20200003737 A | 1/2020 |

\* cited by examiner

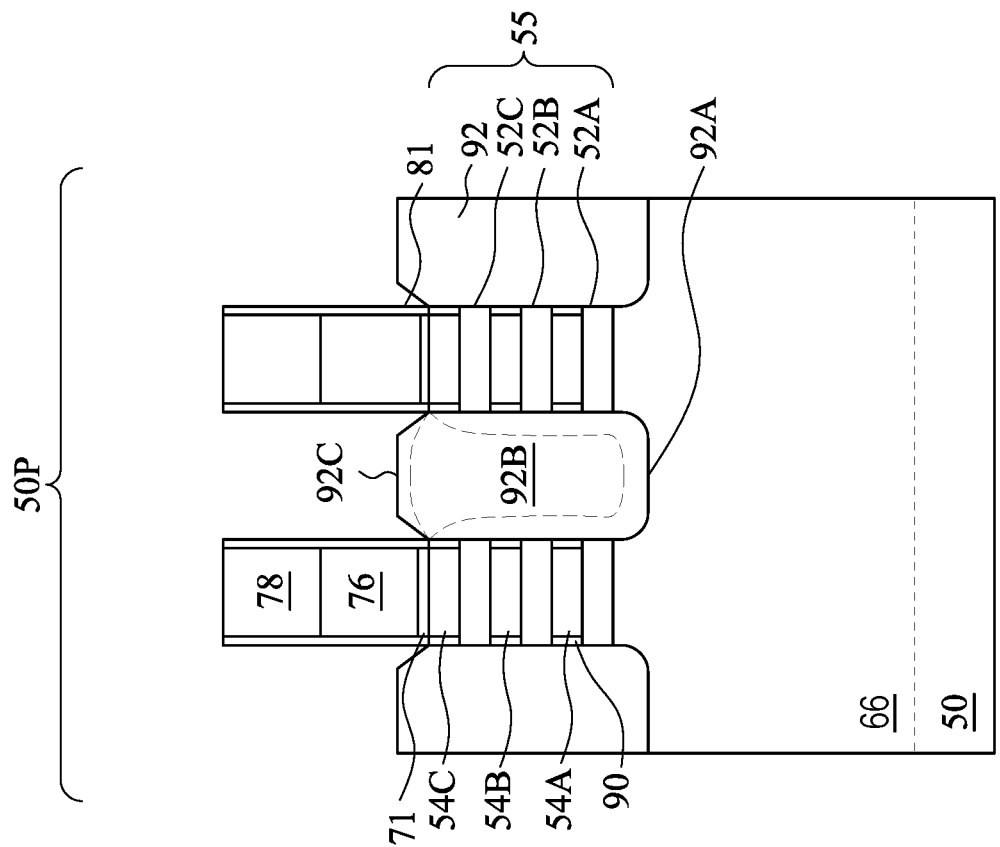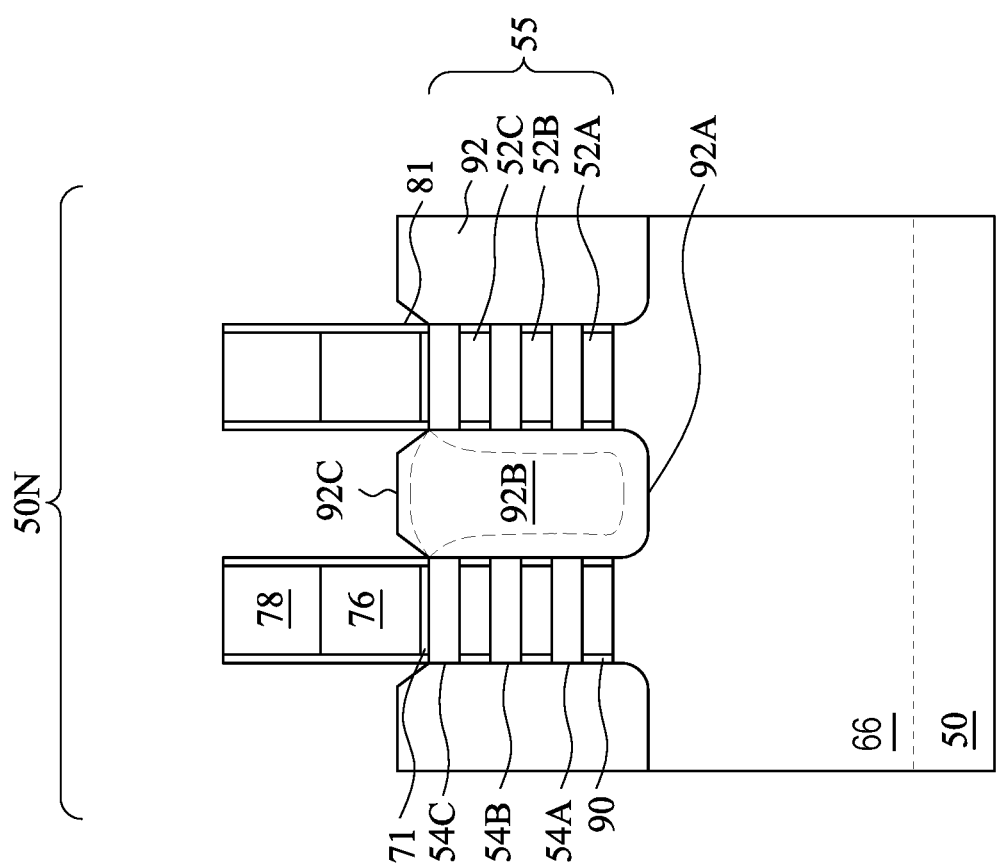
Fig. 12B

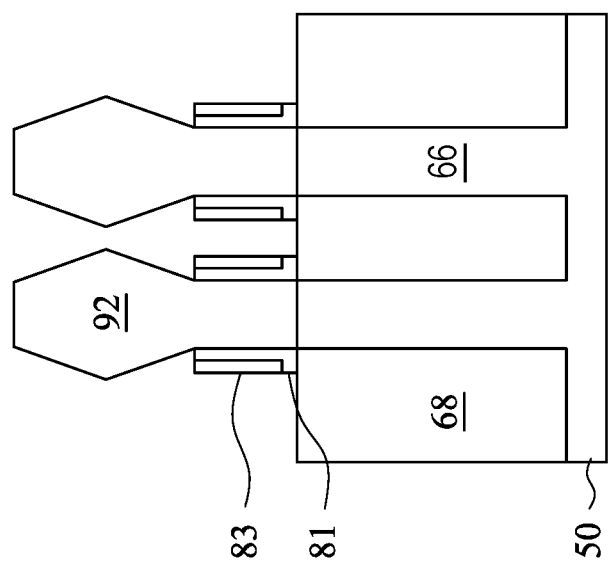

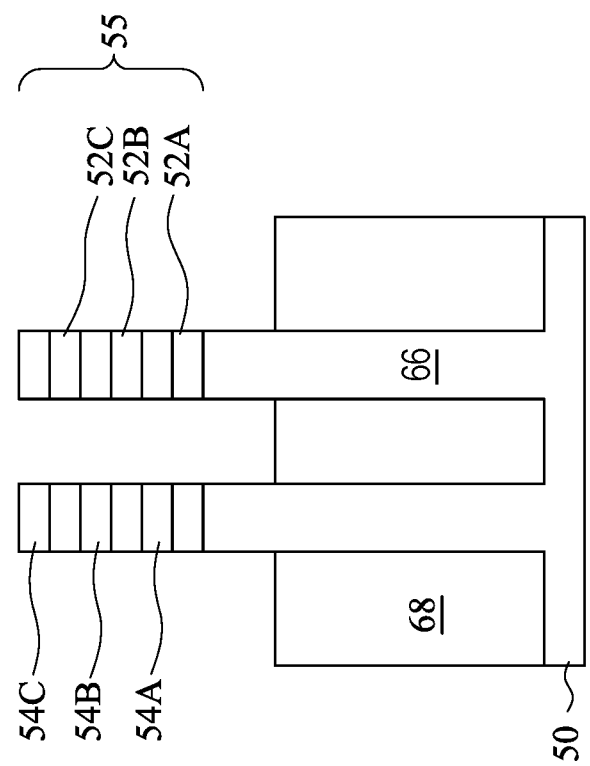

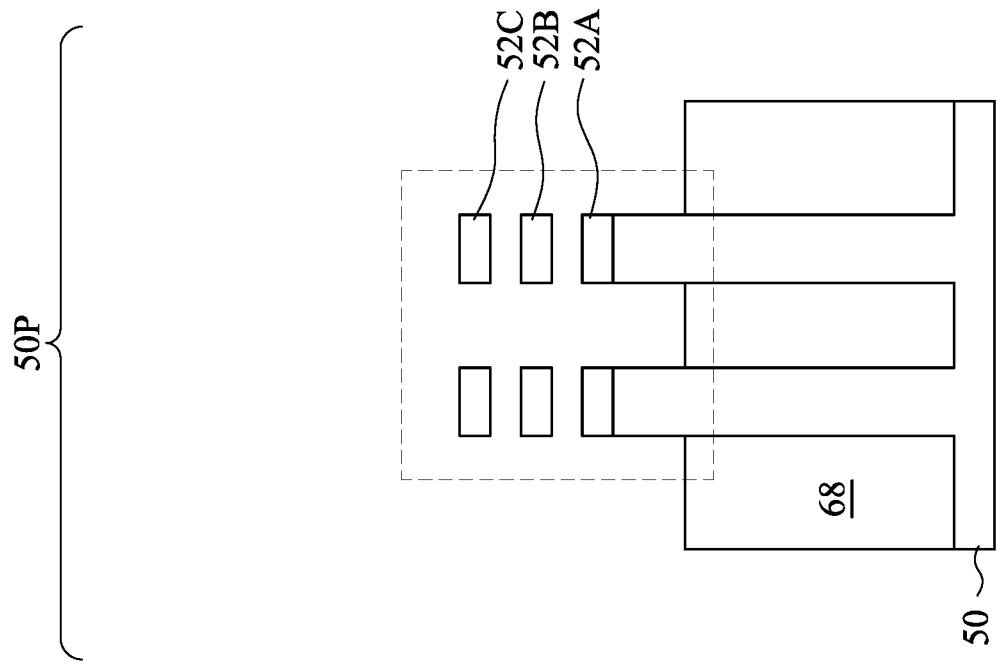
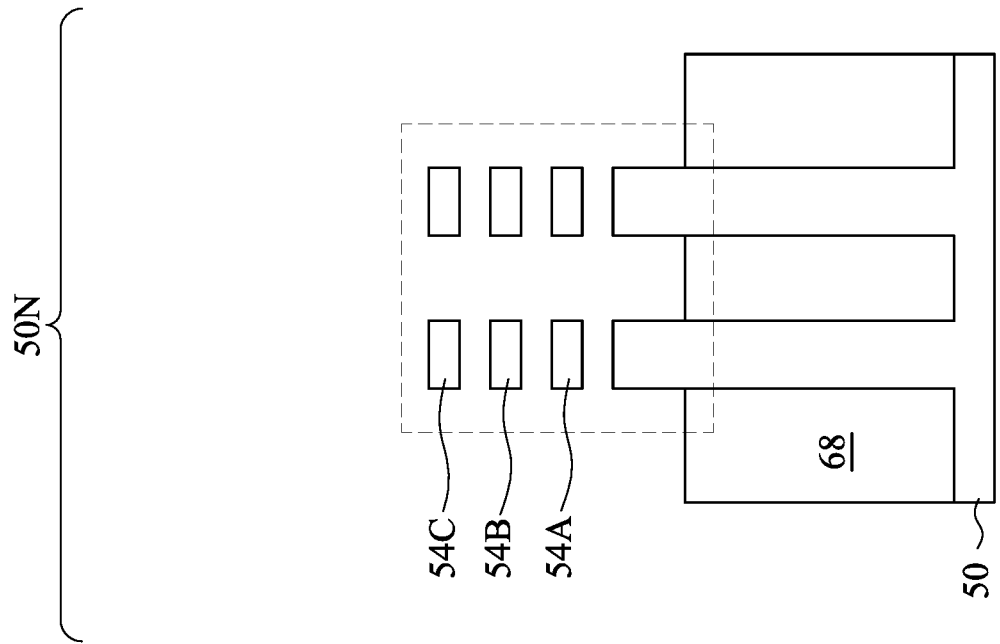
Fig. 16A

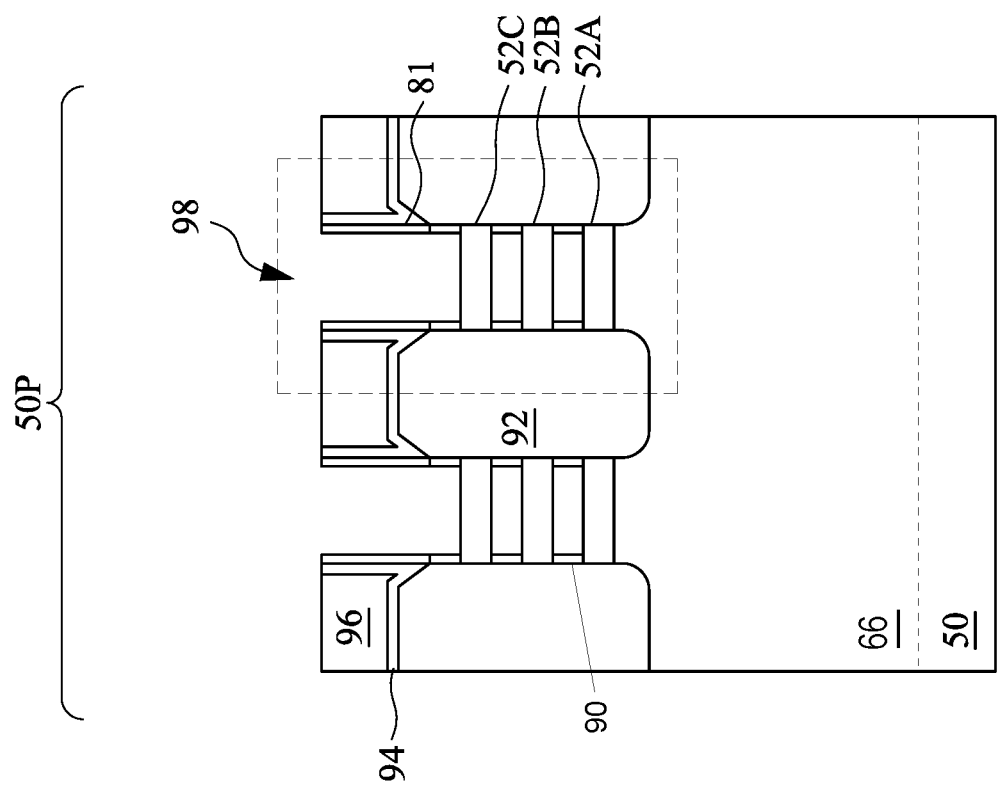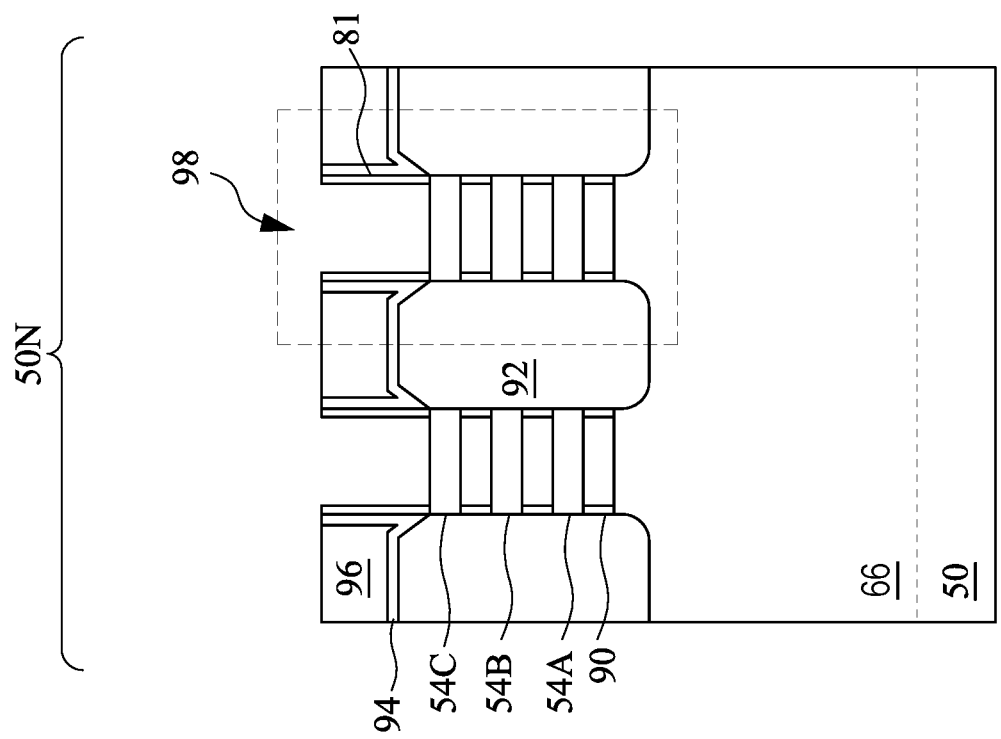
Fig. 16B

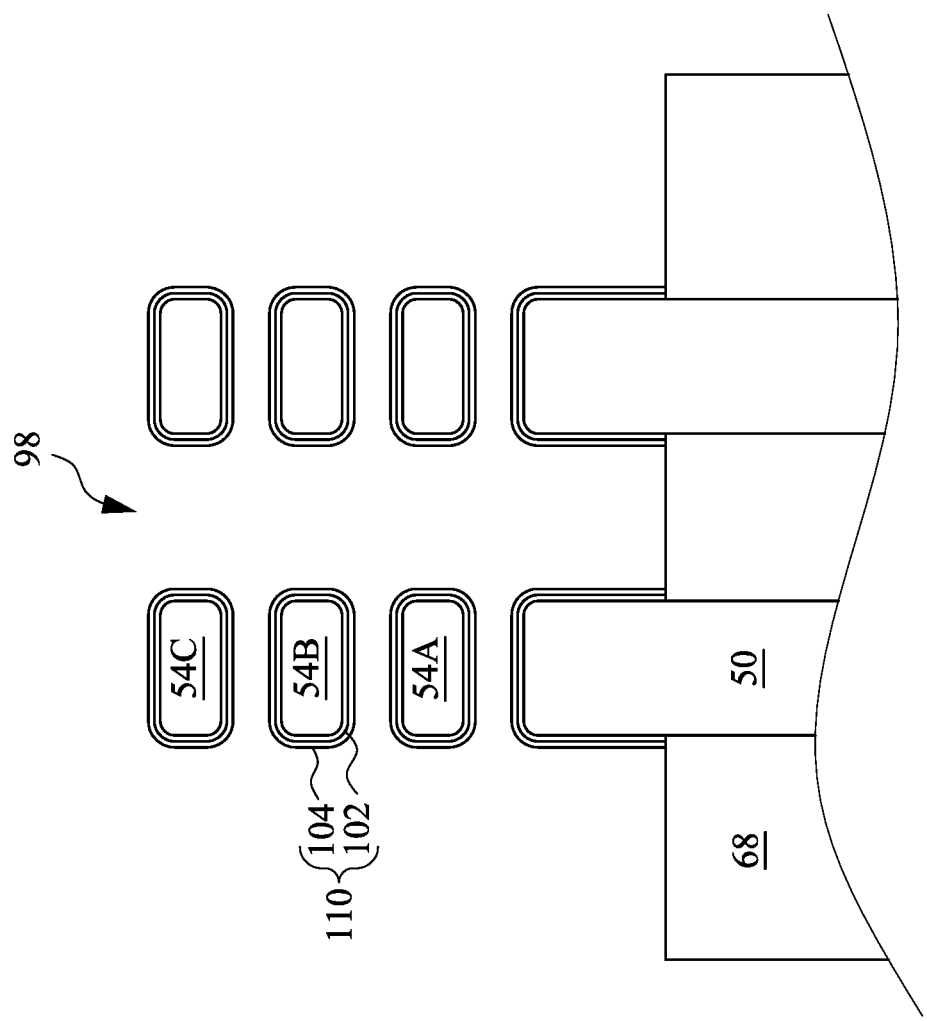

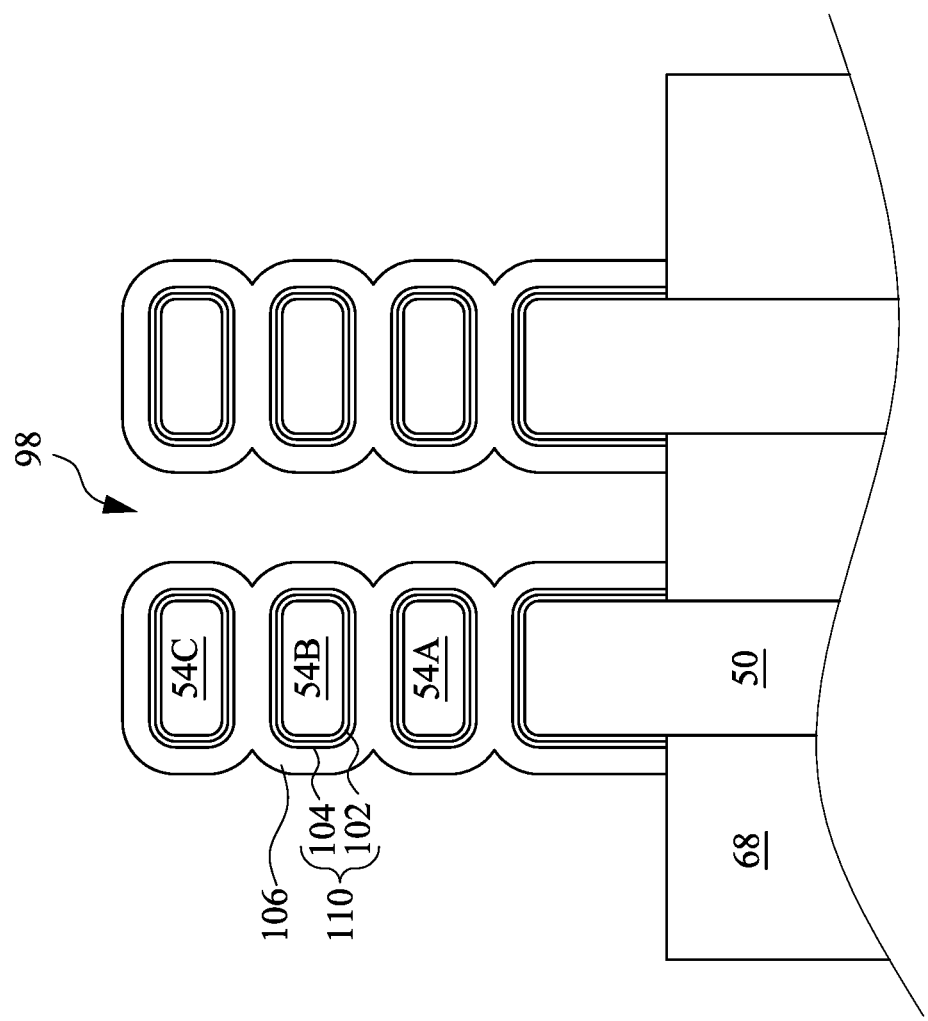

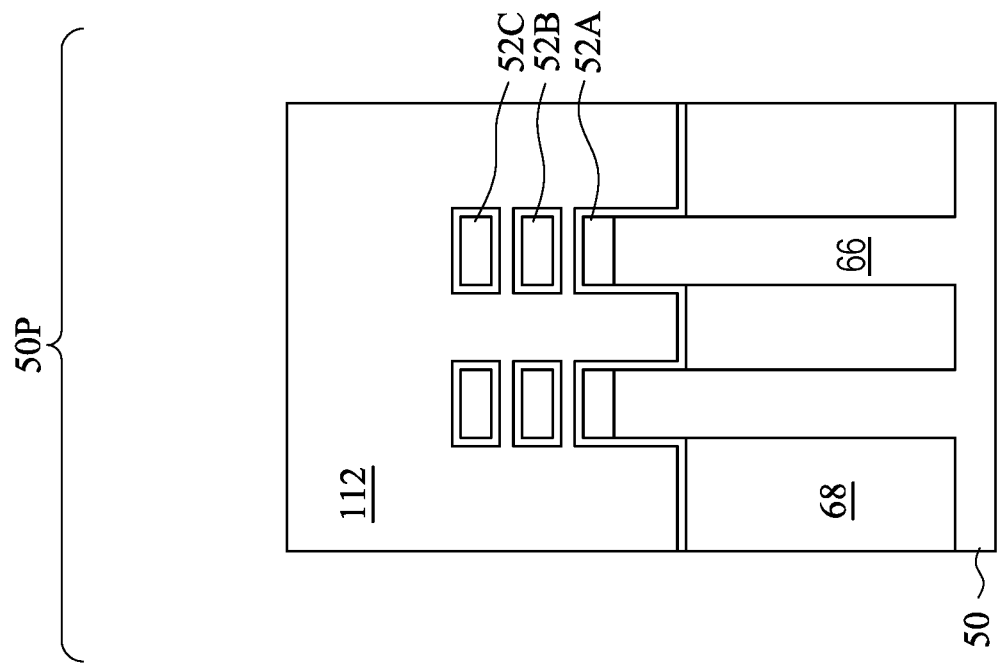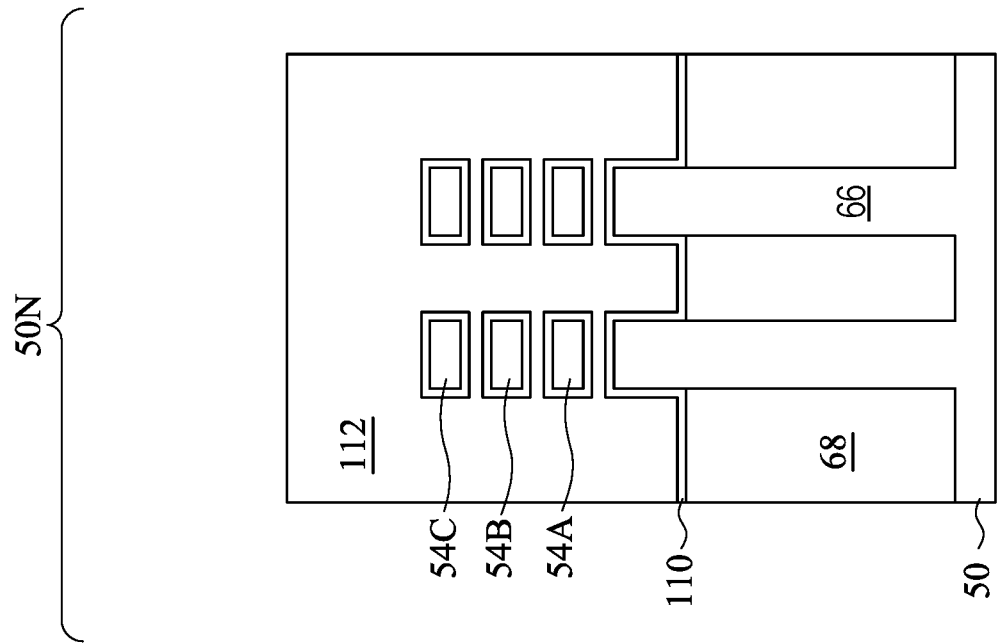
Fig. 28A

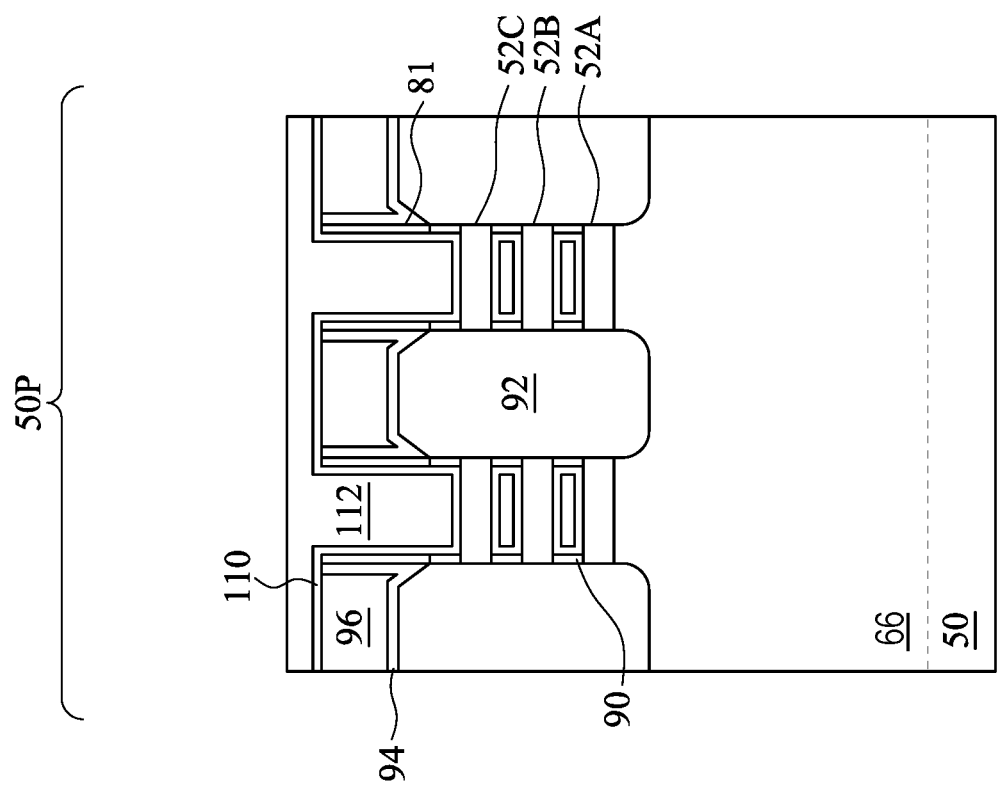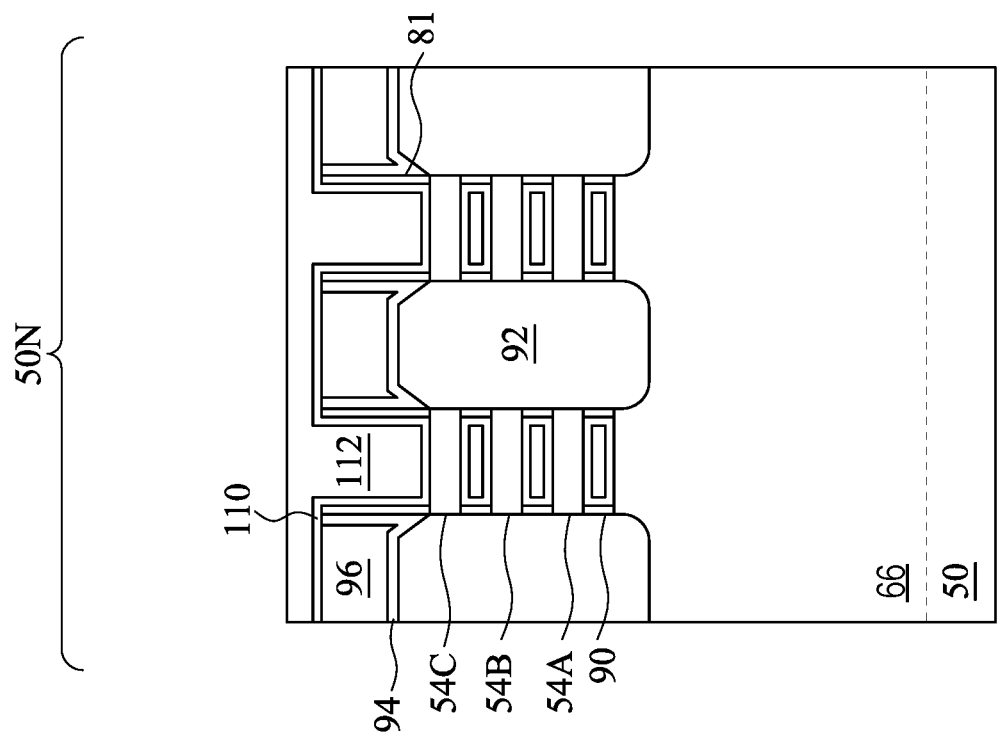
Fig. 28B

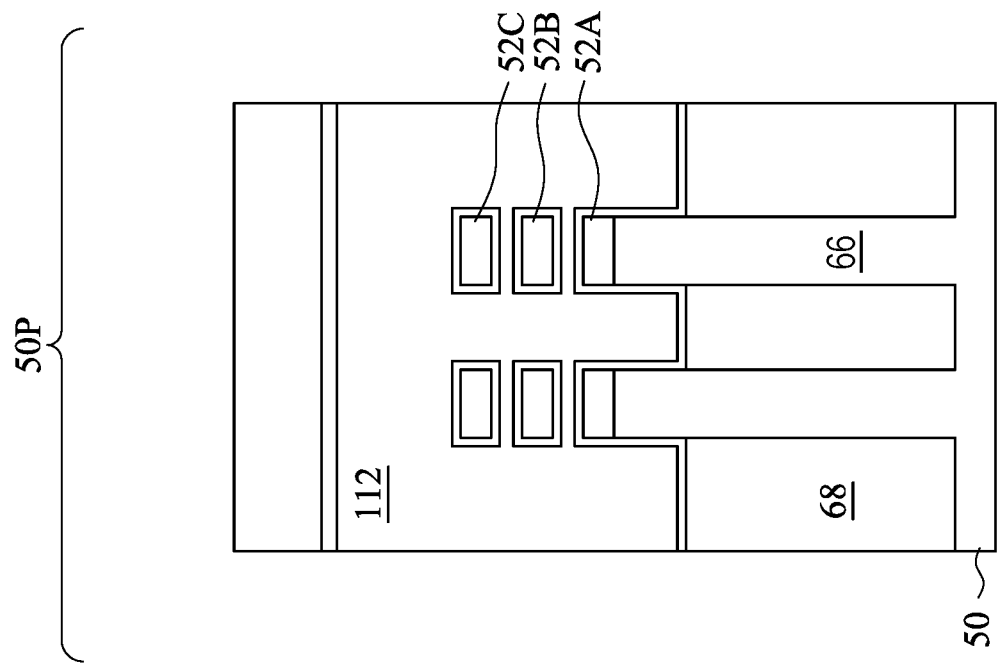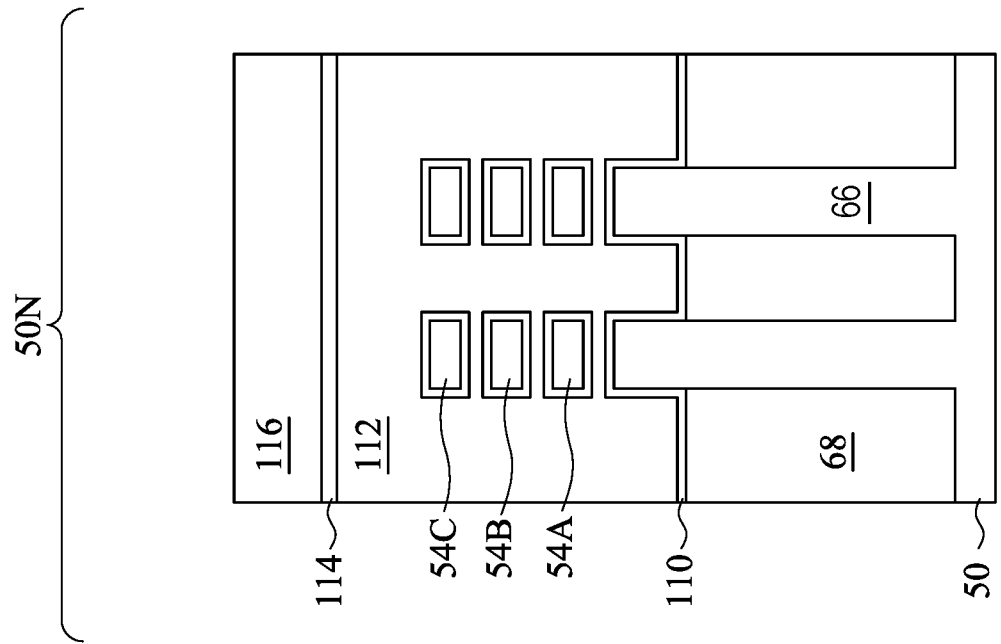
Fig. 29A

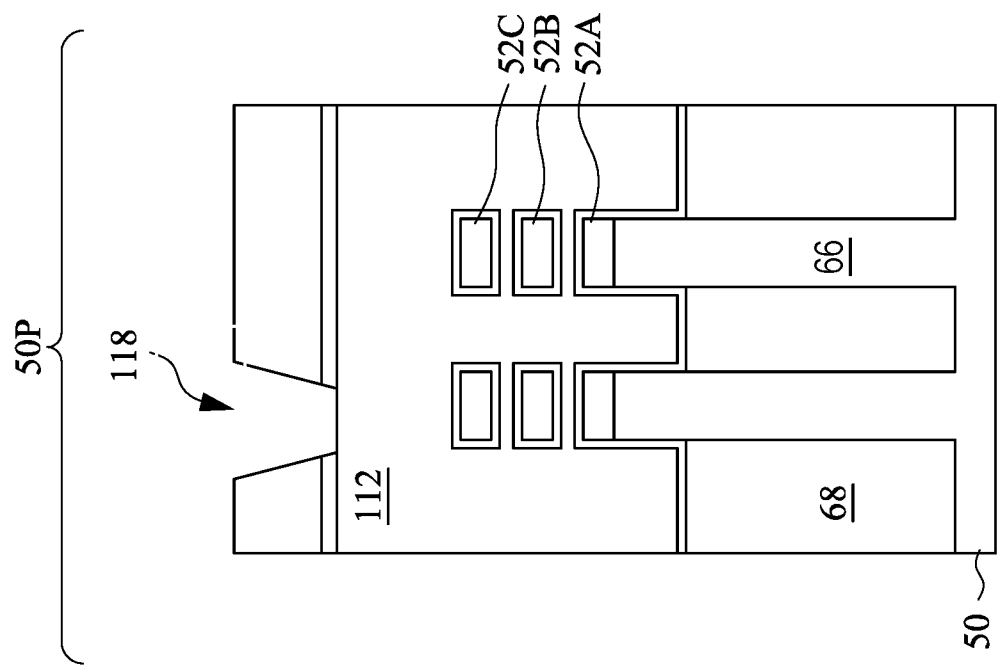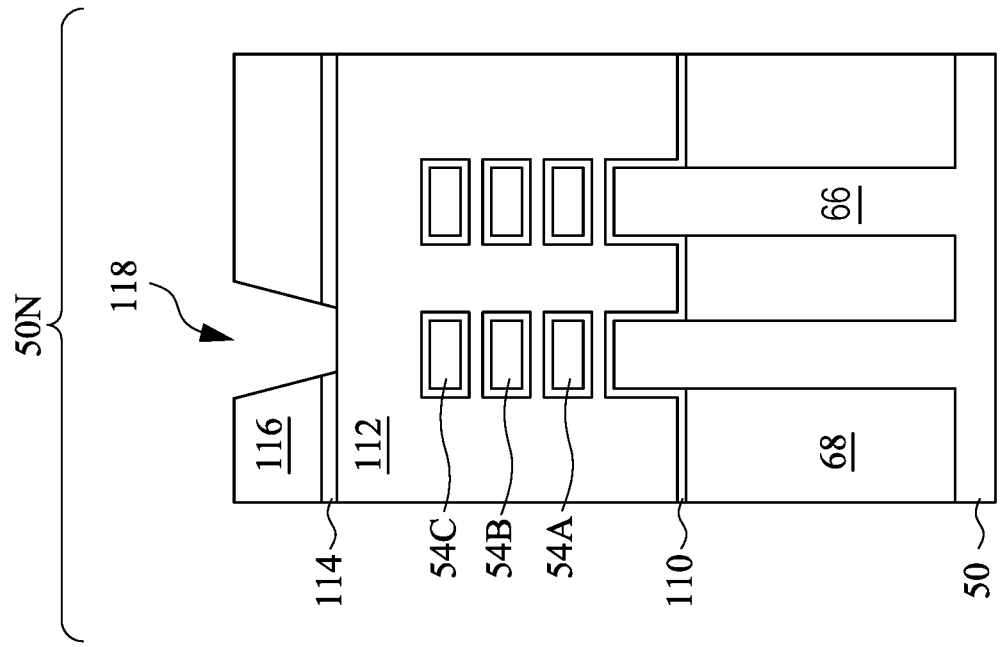
Fig. 30A

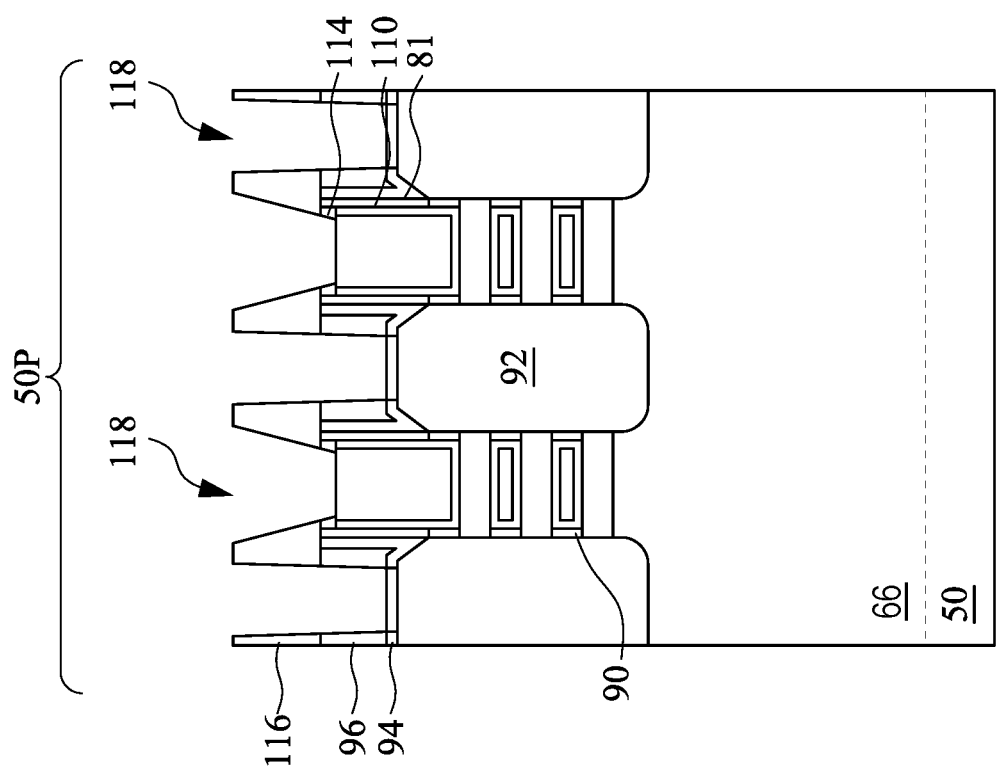
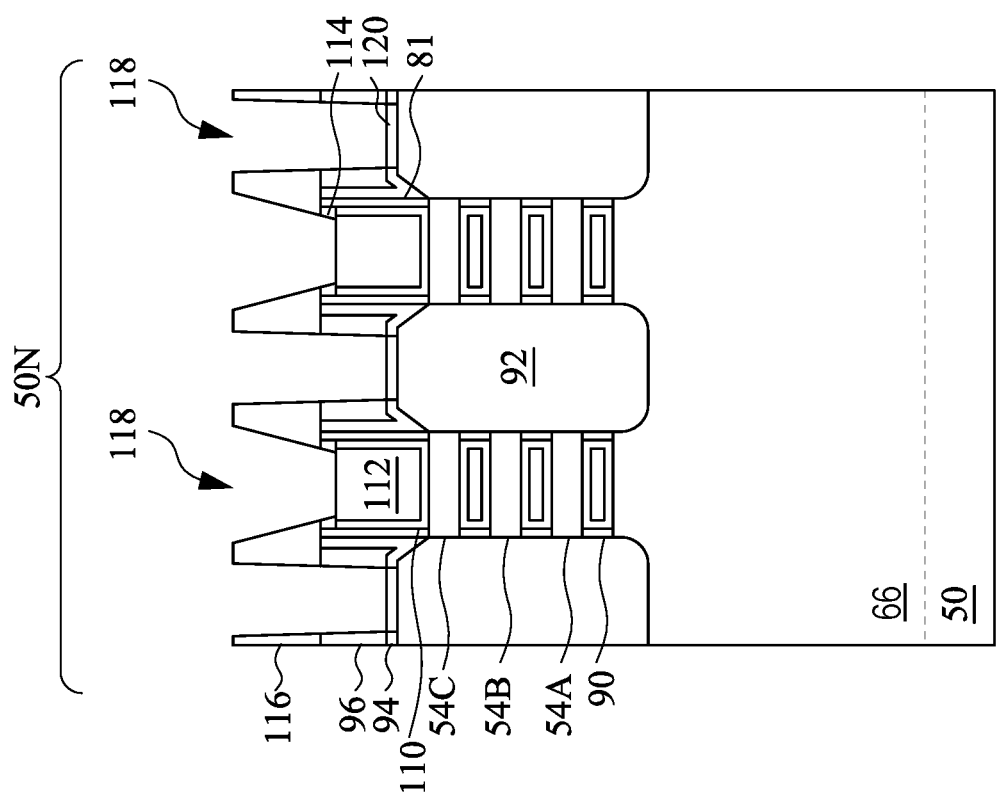
Fig. 30B

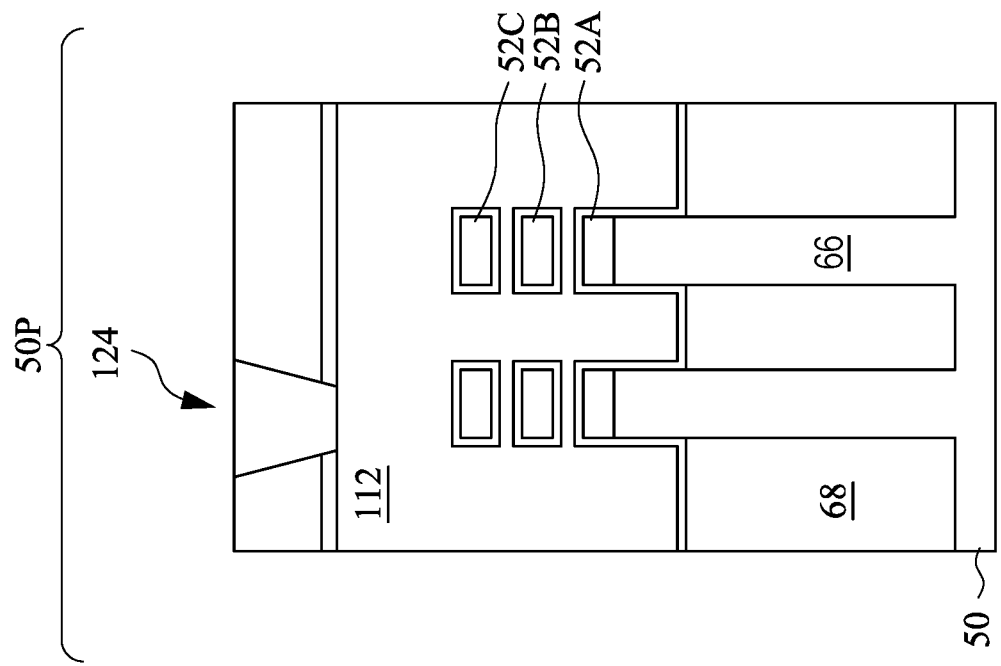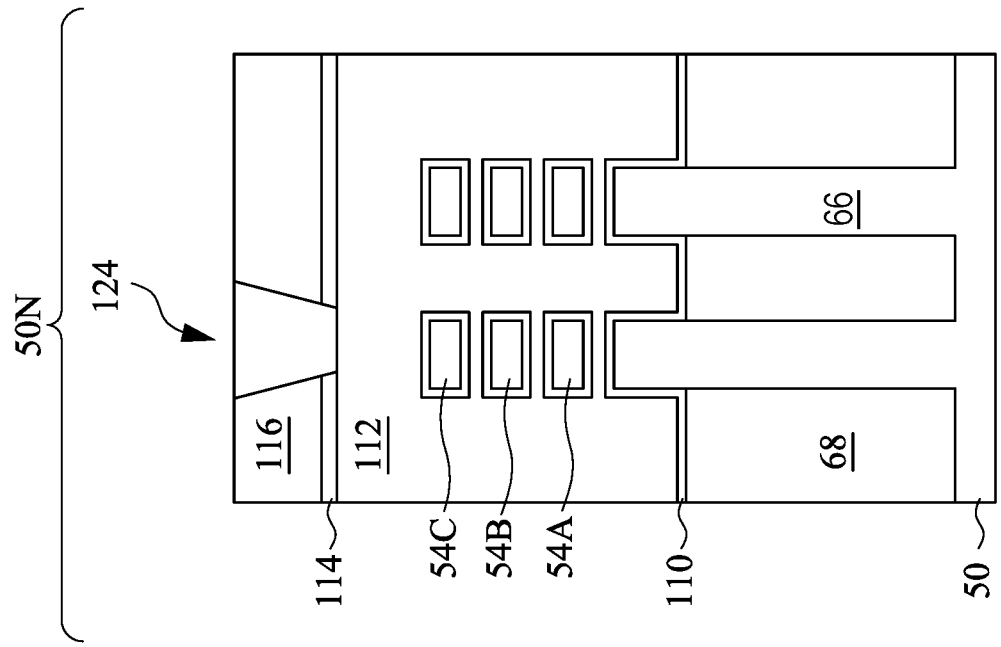
Fig. 31A

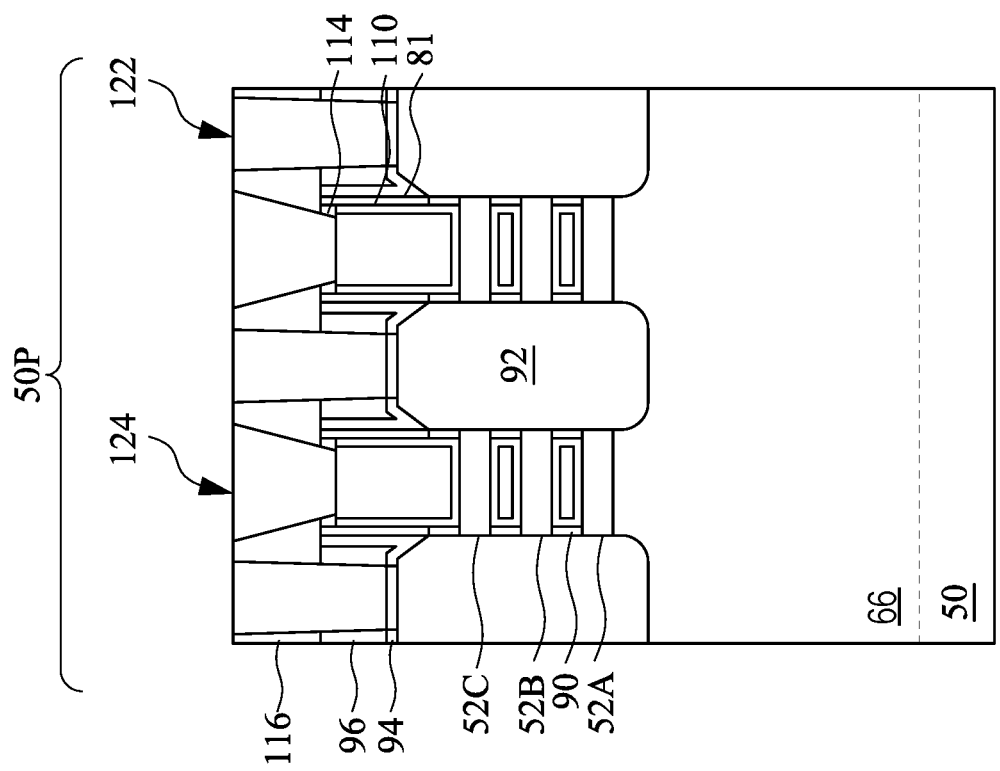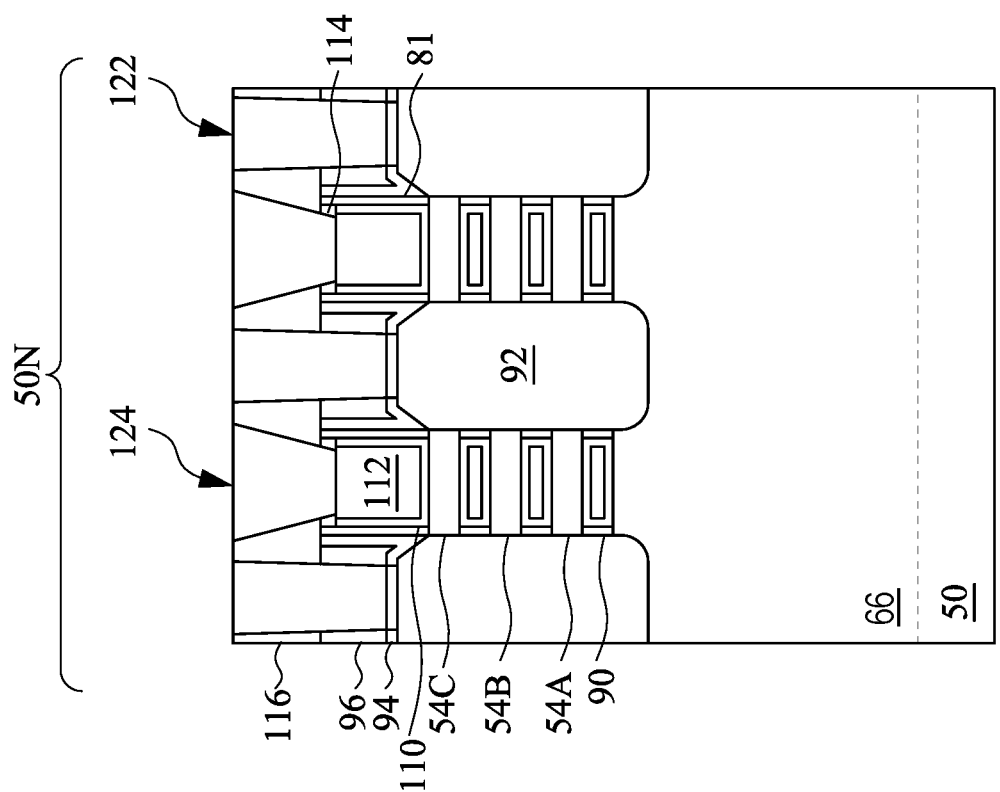
Fig. 31B

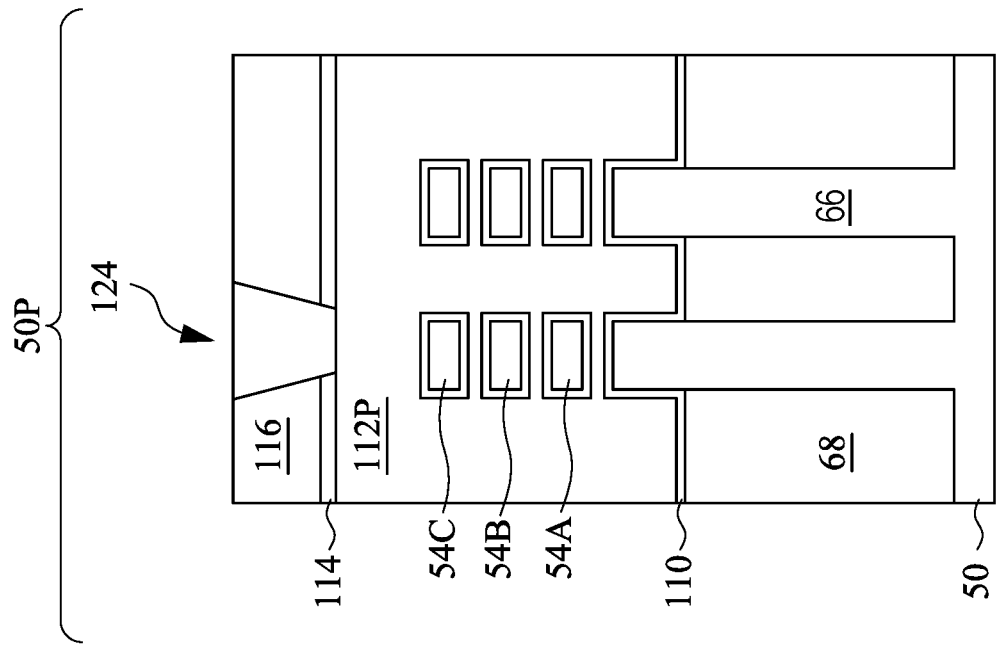
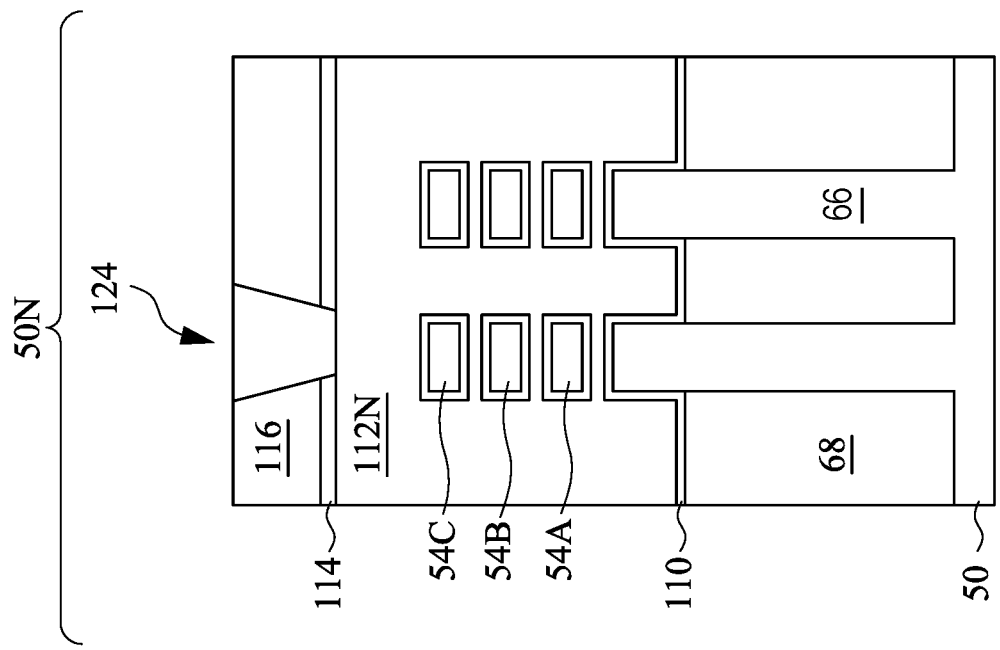
Fig. 32A

ELECTROLESS PLATING METHOD FOR METAL GATE FILL

PRIORITY CLAIM AND CROSS-REFERENCE

This application is a continuation of U.S. application Ser. No. 17/190,267, filed on Mar. 2, 2021, now U.S. Pat. No. 11,699,740, issued Jul. 11, 2023, which claims priority to U.S. Provisional Application No. 63/081,397, filed on Sep. 22, 2020, which applications is hereby incorporated by reference herein as if reproduced in its entirety.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2, 3, 4, 5, 6A, 6B, 7A, 7B, 8A, 8B, 9A, 9B, 10A, 10B, 11A, 11B, 11C, 12A, 12B, 12C, 12D, 13A, 13B, 13C, 14A, 14B, 15A, 15B, 16A, 16B, 17A, 17B, 17C, 17D, 18A, 18B, 18C, 18D, 19A, 19B, 19C, 19D, 20A, 20B, 20C, 20D, 23A, 23B, 23C, 23D, 24A, 24B, 24C, 24D, 25A, 25B, 25C, 25D, 26A, 26B, 26C, 26D, 27A, 27B, 27C, 27D, 28A, 28B, 29A, 29B, 29C, 30A, 30B, 30C, 31A, 31B, and 31C are cross-sectional views of intermediate stages in the manufacturing of nano-FETs, in accordance with some embodiments.

FIGS. 32A, 32B, and 32C are cross-sectional views of a nano-FET, in accordance with some embodiments.

DETAILED DESCRIPTION

Figure 1:
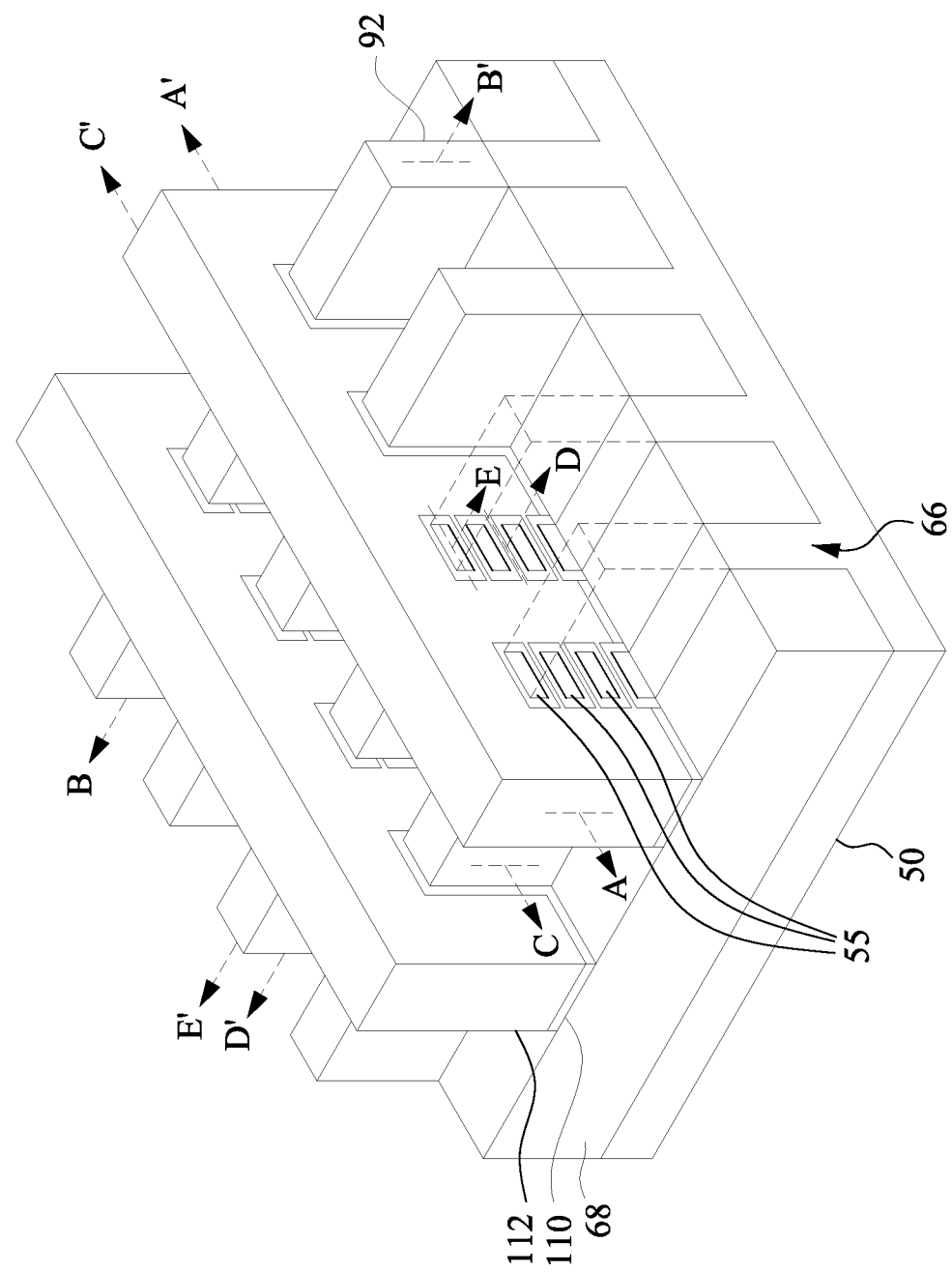
FIG. 1 illustrates an example of a nanostructure field-effect transistor (nano-FET) in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Nano-FET devices use multiple nanostructures as gate channel regions. In fabrication of the nano-FETs, a gate replacement process may be used to replace a dummy gate, which is used as a temporary structure, with a replacement gate. The replacement gate may be a metal gate, for example, and may include multiple layers, including work function tuning layers, as discussed in greater detail below. The dummy gates are removed by forming a recess where the dummy gates were, which exposes the nanostructure channel regions of the nano-FET. After exposing the channel regions of the nano-FET, various layers of the replacement gate are deposited in the recess. After the various layers of the replacement gate are deposited in the recess, the remaining recess is filled with a gate electrode fill, which completes the replacement gate deposition. Rather than use a combination ALD/CVD process to deposit the gate electrode fill, embodiment processes utilize an electroless plating (also referred to as electro-chemical plating) technique to deposit the gate electrode fill. The recess may have a large height to width ratio and traditional deposition techniques may leave voids or seams in the recess where the deposition technique pinches off access to the underlying area. These voids or seams may severely inhibit designed operation of the subsequently formed gate. Embodiment processes utilize the electro-chemical plating technique and accelerators and suppressors to achieve deposition of the gate electrode fill in a bottom up manner. That is, the recess is predominately filled from the bottom up rather than on all surfaces at once.

Embodiments are described below in a particular context, a die comprising nano-FETs. Various embodiments may be applied, however, to dies comprising other types of transistors (e.g., fin field effect transistors (FinFETs), planar transistors, or the like) in lieu of or in combination with the nano-FETs.

FIG. 1 illustrates an example of nano-FETs (e.g., nanowire FETs, nanosheet FETs (NSFETs), or the like) in a three-dimensional view, in accordance with some embodiments. The nano-FETs comprise nanostructures 55 (e.g., nanosheets, nanowire, or the like) over fins 66 on a substrate 50 (e.g., a semiconductor substrate), wherein the nanostructures 55 act as channel regions for the nano-FETs. The nanostructure 55 may include p-type nanostructures, n-type nanostructures, or a combination thereof. Isolation regions 68 are disposed between adjacent fins 66, which may protrude above and from between neighboring isolation regions 68. Although the isolation regions 68 are described/illustrated as being separate from the substrate 50, as used herein, the term "substrate" may refer to the semiconductor substrate alone or a combination of the semiconductor substrate and the isolation regions. Additionally, although a bottom portion of the fins 66 are illustrated as being single, continuous materials with the substrate 50, the bottom portion of the fins 66 and/or the substrate 50 may comprise a single material or a plurality of materials. In this context, the fins 66 refer to the portion extending between the neighboring isolation regions 68.

Gate dielectric layers no are over top surfaces of the fins 66 and along top surfaces, sidewalls, and bottom surfaces of the nanostructures 55. Gate electrodes 112 are over the gate dielectric layers no. Epitaxial source/drain regions 92 are disposed on the fins 66 on opposing sides of the gate dielectric layers no and the gate electrodes 112.

FIG. 1 further illustrates reference cross-sections that are used in later figures. Cross-section A-A' is along a longitudinal axis of a gate electrode 98 and in a direction, for example, perpendicular to the direction of current flow between the epitaxial source/drain regions 92 of a nano-FET. Cross-section B-B' is perpendicular to cross-section A-A' and is parallel to a longitudinal axis of a fin 66 of the nano-FET and in a direction of, for example, a current flow between the epitaxial source/drain regions 92 of the nano-FET. Cross-section C-C' is parallel to cross-section A-A' and extends through epitaxial source/drain regions of the nano-FETs. Cross-section D-D' is a horizontal cross-section parallel to the substrate 50 between nanostructures 55. Cross-section E-E' is parallel to cross-section D-D' and is through nanostructures 55. Subsequent figures refer to these reference cross-sections for clarity.

Some embodiments discussed herein are discussed in the context of nano-FETs formed using a gate-last process. In other embodiments, a gate-first process may be used. Also, some embodiments contemplate aspects used in planar devices, such as planar FETs or in fin field-effect transistors (FinFETs).

Figure 21:
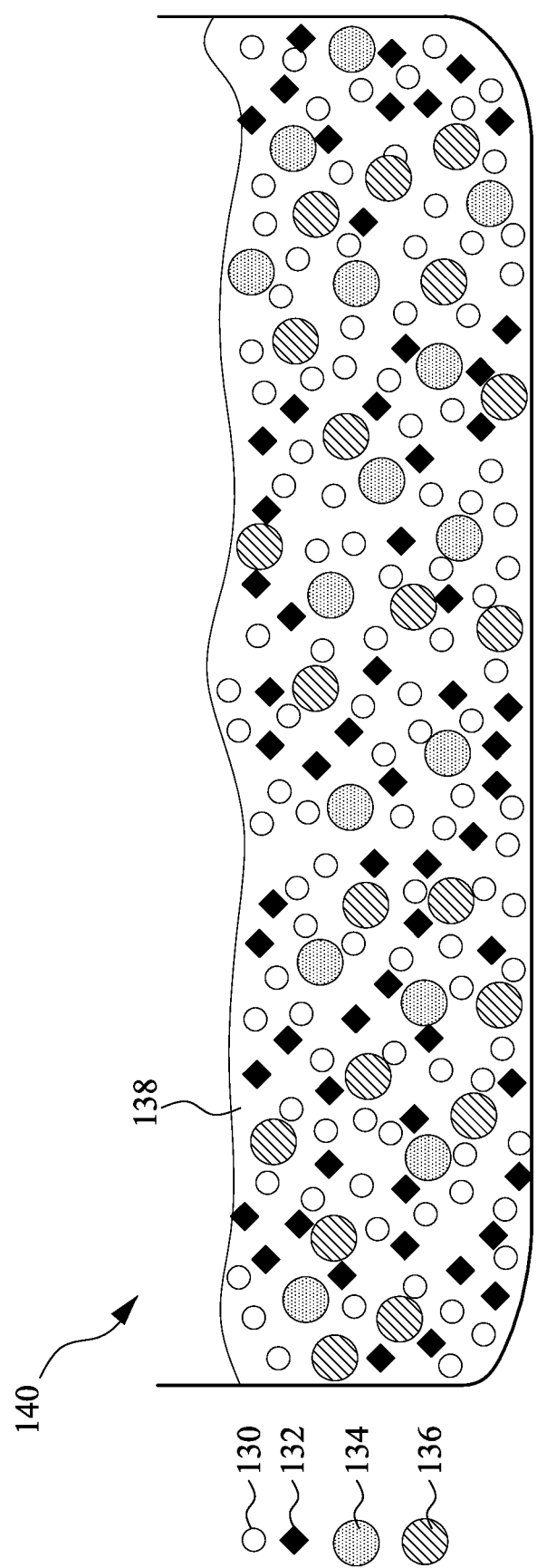
FIG. 21 illustrates an electrochemical bath, in accordance with some embodiments.

FIGS. 2 through 32C are cross-sectional views of intermediate stages in the manufacturing of nano-FETs, in accordance with some embodiments. FIGS. 2 through 5, 6A, 13A, 14A, 15A, 16A, 17A, 18A, 19A, 20A, 23A, 24A, 25A, 26A, 27A, 28A, 29A, 30A, 31A, and 32A illustrate reference cross-section A-A' illustrated in FIG. 1. FIGS. 6B, 7B, 8B, 9B, 10B, 11B, 11C, 12B, 12D, 13B, 14B, 15B, 16B, 17B, 18B, 19B, 20B, 23B, 24B, 25B, 26B, 27B, 28B, 29B, 30B, 31B, and 32B illustrate reference cross-section B-B' illustrated in FIG. 1. FIGS. 7A, 8A, 9A, 10A, 11A, 12A, 12C, 13C, 29C, 30C, 31C, and 32C illustrate reference cross-section C-C' illustrated in FIG. 1. FIGS. 17C, 18C, 19C, 23C, 24C, 25C, 26C, and 27C illustrate reference cross-section D-D' illustrated in FIG. 1. FIGS. 17D, 18D, 19D, 23D, 24D, 25D, 26D, and 27D illustrate reference cross-section E-E' illustrated in FIG. 1. FIG. 21 illustrates an electroless plating bath and FIGS. 22A, 22B, 22C, and 22D illustrate an electroless plating process for filling an opening.

Figure 2:
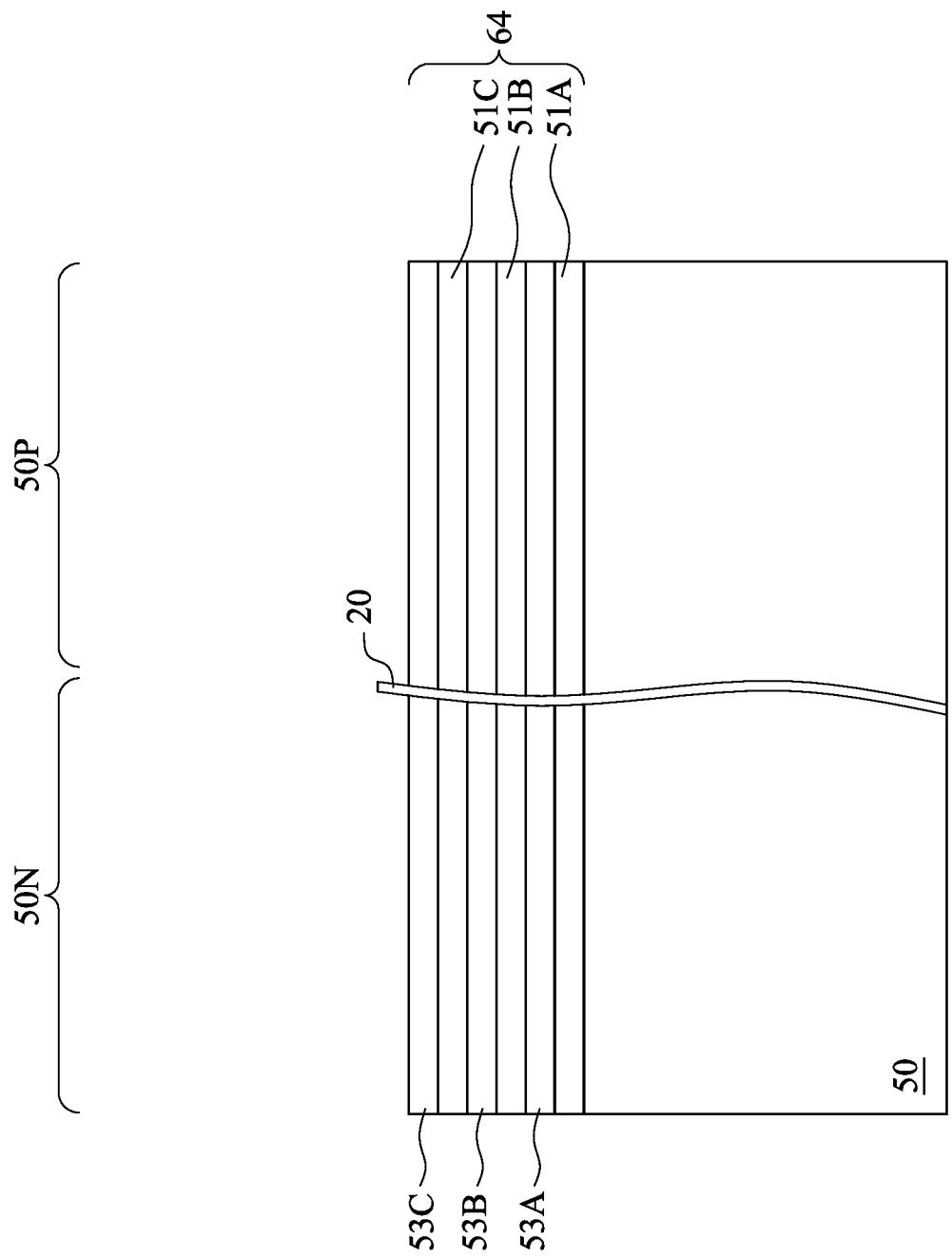

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

The substrate 50 has an n-type region 50N and a p-type region 50P. The n-type region 50N can be for forming n-type devices, such as NMOS transistors, e.g., n-type nano-FETs, and the p-type region 50P can be for forming p-type devices, such as PMOS transistors, e.g., p-type nano-FETs. The n-type region 50N may be physically separated from the p-type region 50P (as illustrated by divider 20), and any number of device features (e.g., other active devices, doped regions, isolation structures, etc.) may be disposed between the n-type region 50N and the p-type region 50P. Although one n-type region 50N and one p-type region 50P are illustrated, any number of n-type regions 50N and p-type regions 50P may be provided.

Further in FIG. 2, a multi-layer stack 64 is formed over the substrate 50. The multi-layer stack 64 includes alternating layers of first semiconductor layers 51A-C (collectively referred to as first semiconductor layers 51) and second semiconductor layers 53A-C (collectively referred to as second semiconductor layers 53). For purposes of illustration and as discussed in greater detail below, the second semiconductor layers 53 will be removed and the first semiconductor layers 51 will be patterned to form channel regions of nano-FETs in the p-type region 50P. Also, the first semiconductor layers 51 will be removed and the second semiconductor layers 53 will be patterned to form channel regions of nano-FETs in the n-type regions 50N. Nevertheless, in some embodiments the first semiconductor layers 51 may be removed and the second semiconductor layers 53 may be patterned to form channel regions of nano-FETs in the n-type region 50N, and the second semiconductor layers 53 may be removed and the first semiconductor layers 51 may be patterned to form channel regions of nano-FETs in the p-type regions 50P.

Figure 32B:
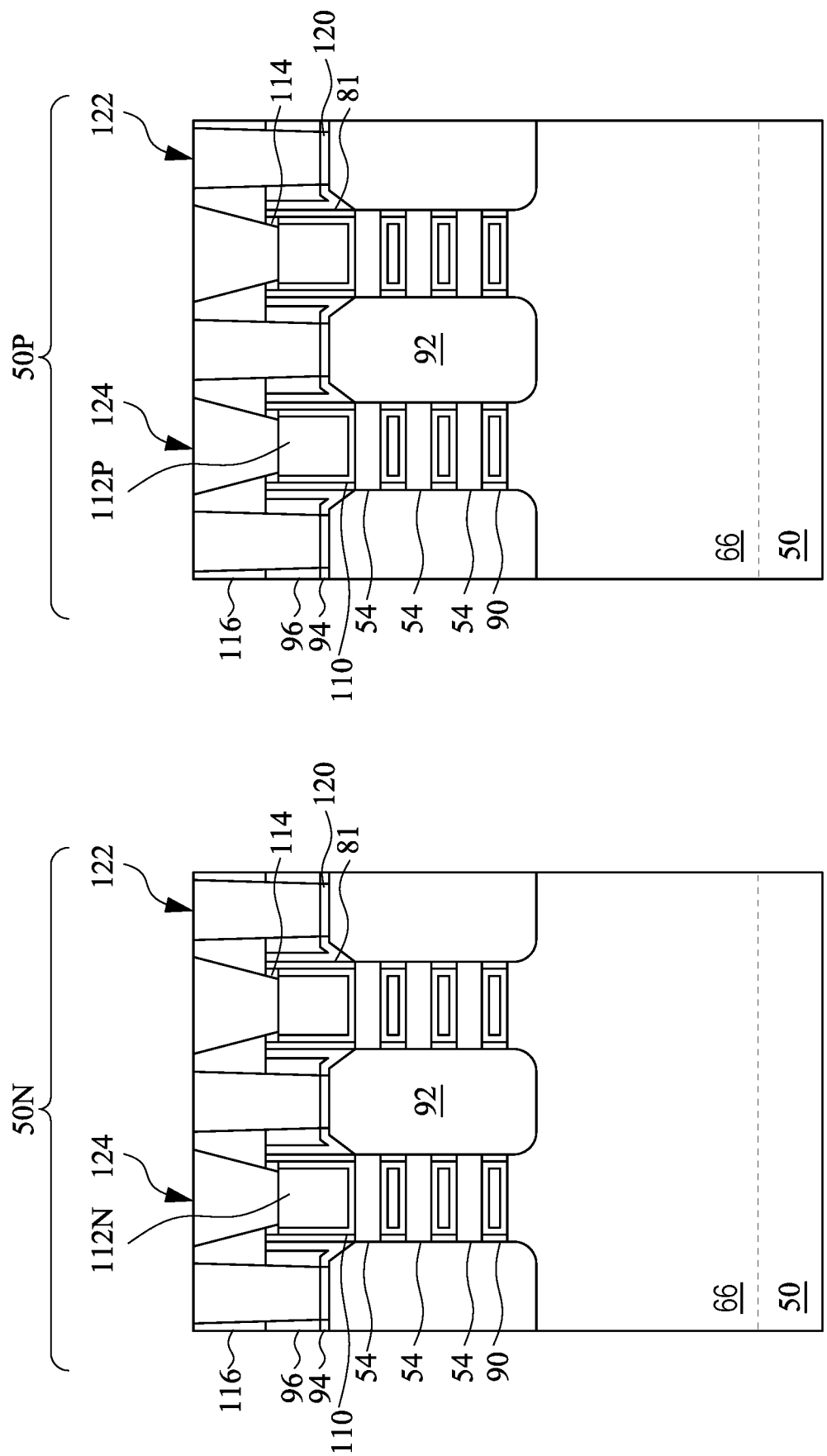
Figure 32C:
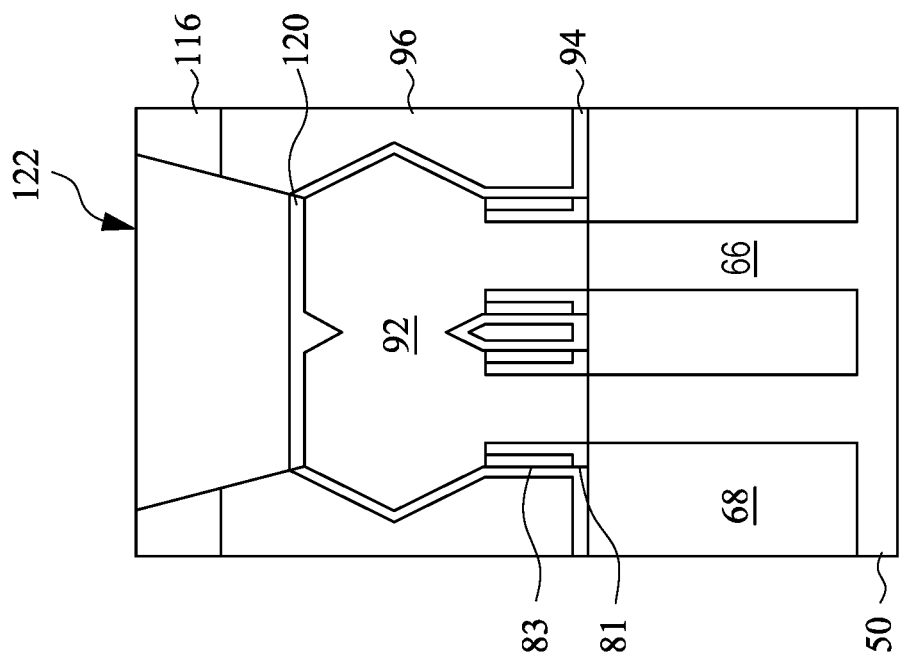

In still other embodiments, the first semiconductor layers 51 may be removed and the second semiconductor layers 53 may be patterned to form channel regions of nano-FETS in both the n-type region 50N and the p-type region 50P. In other embodiments, the second semiconductor layers 53 may be removed and the first semiconductor layers 51 may be patterned to form channel regions of nano-FETs in both the n-type region 50N and the p-type region 50P. In such embodiments, the channel regions in both the n-type region 50N and the p-type region 50P may have a same material composition (e.g., silicon, or the another semiconductor material) and be formed simultaneously. FIGS. 32A, 32B, and 32C illustrate a structure resulting from such embodiments where the channel regions in both the p-type region 50P and the n-type region 50N comprise silicon, for example.

The multi-layer stack 64 is illustrated as including three layers of each of the first semiconductor layers 51 and the second semiconductor layers 53 for illustrative purposes. In some embodiments, the multi-layer stack 64 may include any number of the first semiconductor layers 51 and the second semiconductor layers 53. Each of the layers of the multi-layer stack 64 may be epitaxially grown using a process such as chemical vapor deposition (CVD), atomic layer deposition (ALD), vapor phase epitaxy (VPE), molecular beam epitaxy (MBE), or the like. In various embodiments, the first semiconductor layers 51 may be formed of a first semiconductor material suitable for p-type nano-FETs, such as silicon germanium, or the like, and the second semiconductor layers 53 may be formed of a second semiconductor material suitable for n-type nano-FETs, such as silicon, silicon carbon, or the like. The multi-layer stack 64 is illustrated as having a bottommost semiconductor layer suitable for p-type nano-FETs for illustrative purposes. In some embodiments, multi-layer stack 64 may be formed such that the bottommost layer is a semiconductor layer suitable for n-type nano-FETs.

The first semiconductor materials and the second semiconductor materials may be materials having a high-etch selectivity to one another. As such, the first semiconductor layers 51 of the first semiconductor material may be removed without significantly removing the second semiconductor layers 53 of the second semiconductor material in the n-type region 50N, thereby allowing the second semiconductor layers 53 to be patterned to form channel regions of n-type nano-FETs. Similarly, the second semiconductor layers 53 of the second semiconductor material may be removed without significantly removing the first semiconductor layers 51 of the first semiconductor material in the p-type region 50P, thereby allowing the first semiconductor layers 51 to be patterned to form channel regions of p-type nano-FETs.

Figure 3:
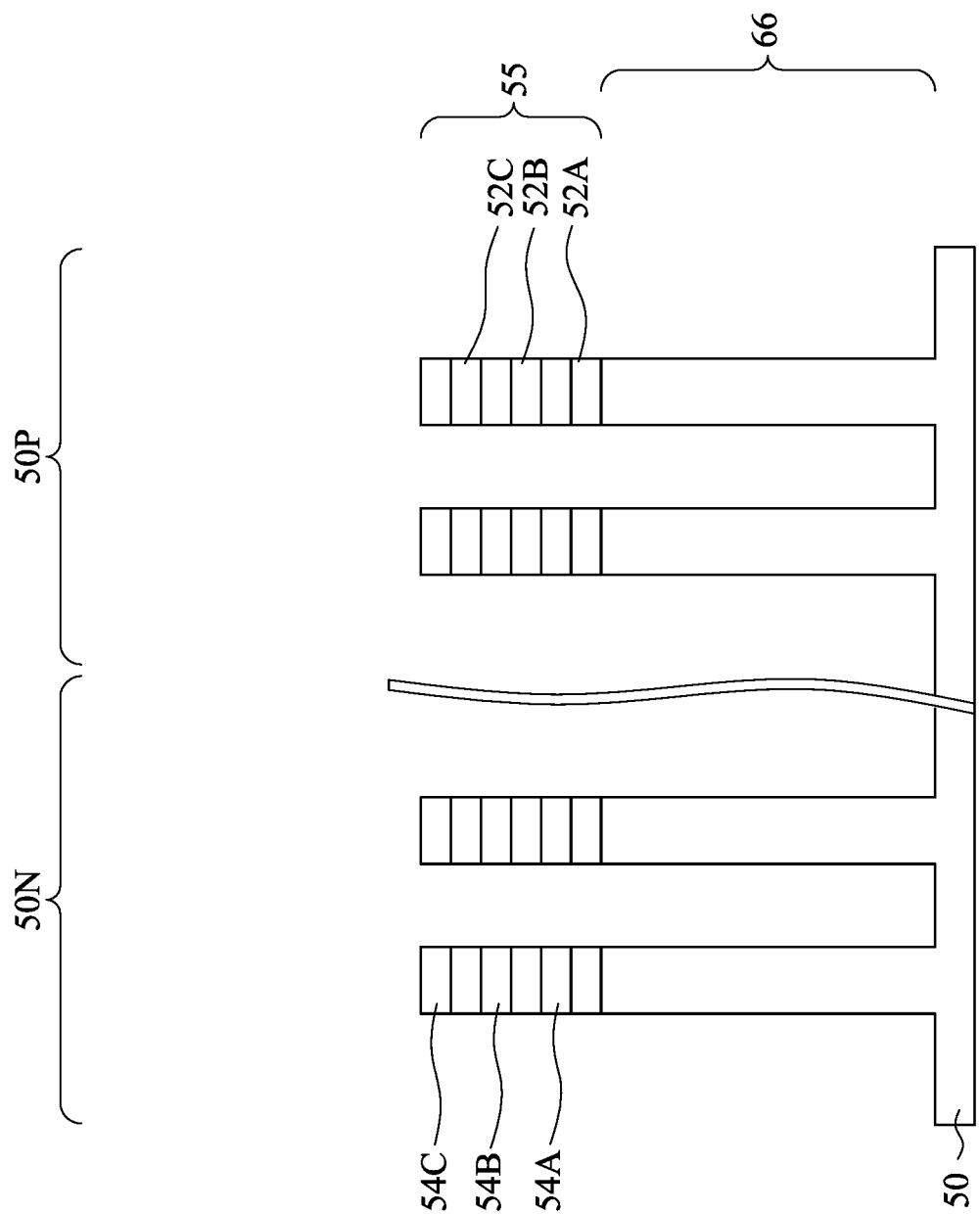

Referring now to FIG. 3, fins 66 are formed in the substrate 50 and nanostructures 55 are formed in the multi-layer stack 64, in accordance with some embodiments. In some embodiments, the nanostructures 55 and the fins 66 may be formed in the multi-layer stack 64 and the substrate 50, respectively, by etching trenches in the multi-layer stack 64 and the substrate 50. The etching may be any acceptable etch process, such as a reactive ion etch (RIE), neutral beam etch (NBE), the like, or a combination thereof. The etching may be anisotropic. Forming the nanostructures 55 by etching the multi-layer stack 64 may further define first nanostructures 52A-C (collectively referred to as the first nanostructures 52) from the first semiconductor layers 51 and define second nanostructures 54A-C (collectively referred to as the second nanostructures 54) from the second semiconductor layers 53. The first nanostructures 52 and the second nanostructures 54 may further be collectively referred to as nanostructures 55.

The fins 66 and the nanostructures 55 may be patterned by any suitable method. For example, the fins 66 and the nanostructures 55 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins 66.

FIG. 3 illustrates the fins 66 in the n-type region 50N and the p-type region 50P as having substantially equal widths for illustrative purposes. In some embodiments, widths of the fins 66 in the n-type region 50N may be greater or thinner than the fins 66 in the p-type region 50P. Further, while each of the fins 66 and the nanostructures 55 are illustrated as having a consistent width throughout, in other embodiments, the fins 66 and/or the nanostructures 55 may have tapered sidewalls such that a width of each of the fins 66 and/or the nanostructures 55 continuously increases in a direction towards the substrate 50. In such embodiments, each of the nanostructures 55 may have a different width and be trapezoidal in shape.

Figure 4:
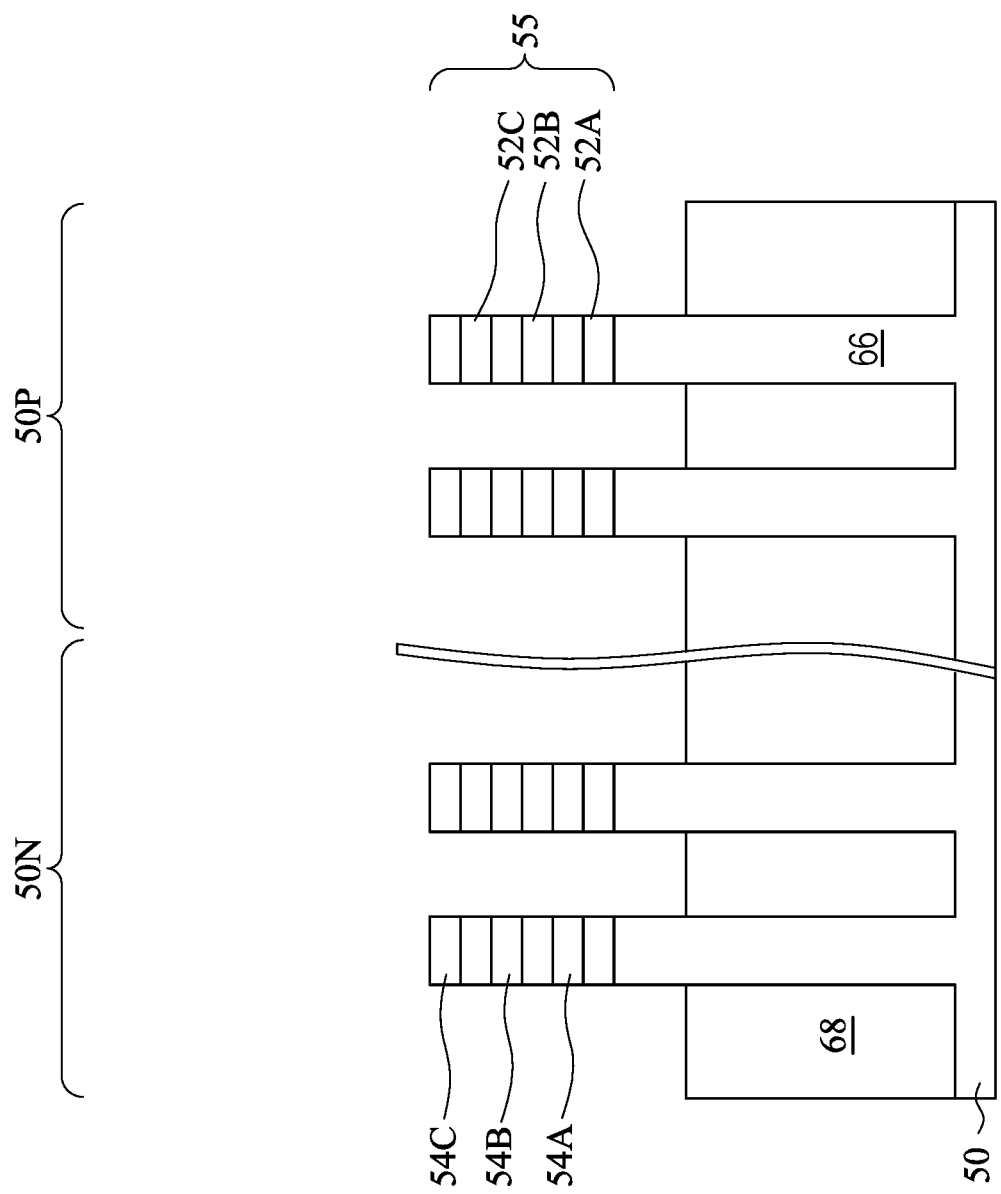

In FIG. 4, shallow trench isolation (STI) regions 68 are formed adjacent the fins 66. The STI regions 68 may be formed by depositing an insulation material over the substrate 50, the fins 66, and nanostructures 55, and between adjacent fins 66. The insulation material may be an oxide, such as silicon oxide, a nitride, the like, or a combination thereof, and may be formed by high-density plasma CVD (HDP-CVD), flowable CVD (FCVD), the like, or a combination thereof. Other insulation materials formed by any acceptable process may be used. In the illustrated embodiment, the insulation material is silicon oxide formed by an FCVD process. An anneal process may be performed once the insulation material is formed. In an embodiment, the insulation material is formed such that excess insulation material covers the nanostructures 55. Although the insulation material is illustrated as a single layer, some embodiments may utilize multiple layers. For example, in some embodiments a liner (not separately illustrated) may first be formed along a surface of the substrate 50, the fins 66, and the nanostructures 55. Thereafter, a fill material, such as those discussed above may be formed over the liner.

A removal process is then applied to the insulation material to remove excess insulation material over the nanostructures 55. In some embodiments, a planarization process such as a chemical mechanical polish (CMP), an etch-back process, combinations thereof, or the like may be utilized. The planarization process exposes the nanostructures 55 such that top surfaces of the nanostructures 55 and the insulation material are level after the planarization process is complete.

The insulation material is then recessed to form the STI regions 68. The insulation material is recessed such that upper portions of fins 66 in the n-type regions 50N and the p-type regions 50P protrude from between neighboring STI regions 68. Further, the top surfaces of the STI regions 68 may have a flat surface as illustrated, a convex surface, a concave surface (such as dishing), or a combination thereof. The top surfaces of the STI regions 68 may be formed flat, convex, and/or concave by an appropriate etch. The STI regions 68 may be recessed using an acceptable etching process, such as one that is selective to the material of the insulation material (e.g., etches the material of the insulation material at a faster rate than the material of the fins 66 and the nanostructures 55). For example, an oxide removal using, for example, dilute hydrofluoric (dHF) acid may be used.

The process described above with respect to FIGS. 2 through 4 is just one example of how the fins 66 and the nanostructures 55 may be formed. In some embodiments, the fins 66 and/or the nanostructures 55 may be formed using a mask and an epitaxial growth process. For example, a dielectric layer can be formed over a top surface of the substrate 50, and trenches can be etched through the dielectric layer to expose the underlying substrate 50. Epitaxial structures can be epitaxially grown in the trenches, and the dielectric layer can be recessed such that the epitaxial structures protrude from the dielectric layer to form the fins 66 and/or the nanostructures 55. The epitaxial structures may comprise the alternating semiconductor materials discussed above, such as the first semiconductor materials and the second semiconductor materials. In some embodiments where epitaxial structures are epitaxially grown, the epitaxially grown materials may be in situ doped during growth, which may obviate prior and/or subsequent implantations, although in situ and implantation doping may be used together.

Additionally, the first semiconductor layers 51 (and resulting first nanostructures 52) and the second semiconductor layers 53 (and resulting second nanostructures 54) are illustrated and discussed herein as comprising the same materials in the p-type region 50P and the n-type region 50N for illustrative purposes only. As such, in some embodiments one or both of the first semiconductor layers 51 and the second semiconductor layers 53 may be different materials or formed in a different order in the p-type region 50P and the n-type region 50N.

Further in FIG. 4, appropriate wells (not separately illustrated) may be formed in the fins 66, the nanostructures 55, and/or the STI regions 68. In embodiments with different well types, different implant steps for the n-type region 50N and the p-type region 50P may be achieved using a photoresist or other masks (not separately illustrated). For example, a photoresist may be formed over the fins 66 and the STI regions 68 in the n-type region 50N and the p-type region 50P. The photoresist is patterned to expose the p-type region 50P. The photoresist can be formed by using a spin-on technique and can be patterned using acceptable photolithography techniques. Once the photoresist is patterned, an n-type impurity implant is performed in the p-type region 50P, and the photoresist may act as a mask to substantially prevent n-type impurities from being implanted into the n-type region 50N. The n-type impurities may be phosphorus, arsenic, antimony, or the like implanted in the region to a concentration in a range from about $10^{13}$ atoms/cm$^3$ to about $10^{14}$ atoms/cm$^3$. After the implant, the photoresist is removed, such as by an acceptable ashing process.

Following or prior to the implanting of the p-type region 50P, a photoresist or other masks (not separately illustrated) is formed over the fins 66, the nanostructures 55, and the STI regions 68 in the p-type region 50P and the n-type region 50N. The photoresist is patterned to expose the n-type region 50N. The photoresist can be formed by using a spin-on technique and can be patterned using acceptable photolithography techniques. Once the photoresist is patterned, a p-type impurity implant may be performed in the n-type region 50N, and the photoresist may act as a mask to substantially prevent p-type impurities from being implanted into the p-type region 50P. The p-type impurities may be boron, boron fluoride, indium, or the like implanted in the region to a concentration in a range from about $10^{13}$ atoms/cm$^3$ to about $10^{14}$ atoms/cm$^3$. After the implant, the photoresist may be removed, such as by an acceptable ashing process.

After the implants of the n-type region 50N and the p-type region 50P, an anneal may be performed to repair implant damage and to activate the p-type and/or n-type impurities that were implanted. In some embodiments, the grown materials of epitaxial fins may be in situ doped during growth, which may obviate the implantations, although in situ and implantation doping may be used together.

Figure 5:
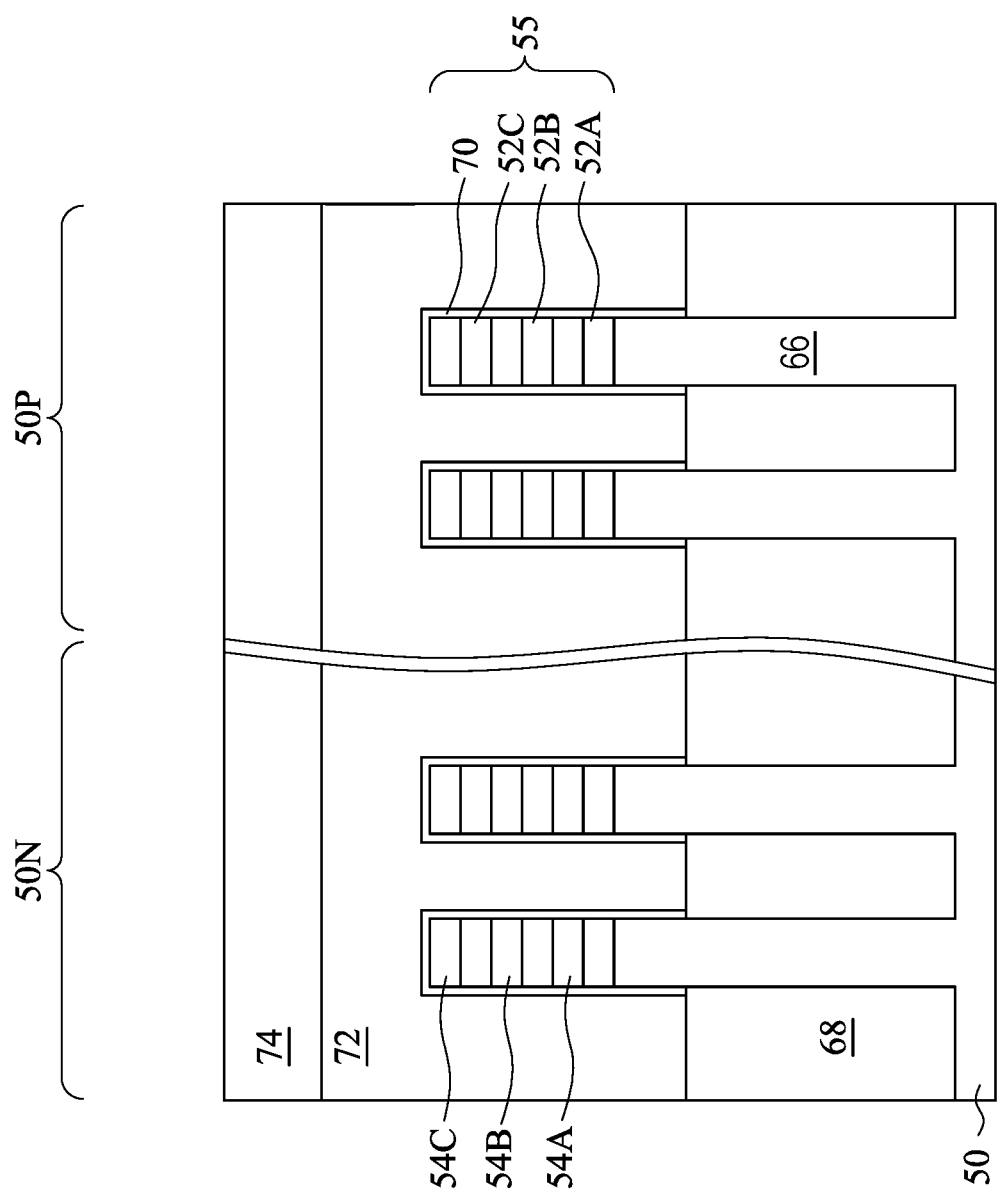

In FIG. 5, a dummy dielectric layer 70 is formed on the fins 66 and/or the nanostructures 55. The dummy dielectric layer 70 may be, for example, silicon oxide, silicon nitride, a combination thereof, or the like, and may be deposited or thermally grown according to acceptable techniques. A dummy gate layer 72 is formed over the dummy dielectric layer 70, and a mask layer 74 is formed over the dummy gate layer 72. The dummy gate layer 72 may be deposited over the dummy dielectric layer 70 and then planarized, such as by a CMP. The mask layer 74 may be deposited over the dummy gate layer 72. The dummy gate layer 72 may be a conductive or non-conductive material and may be selected from a group including amorphous silicon, polycrystalline-silicon (polysilicon), poly-crystalline silicon-germanium (poly-SiGe), metallic nitrides, metallic silicides, metallic oxides, and metals. The dummy gate layer 72 may be deposited by physical vapor deposition (PVD), CVD, sputter deposition, or other techniques for depositing the selected material. The dummy gate layer 72 may be made of other materials that have a high etching selectivity from the etching of isolation regions. The mask layer 74 may include, for example, silicon nitride, silicon oxynitride, or the like. In this example, a single dummy gate layer 72 and a single mask layer 74 are formed across the n-type region 50N and the p-type region 50P. It is noted that the dummy dielectric layer 70 is shown covering only the fins 66 and the nanostructures 55 for illustrative purposes only. In some embodiments, the dummy dielectric layer 70 may be deposited such that the dummy dielectric layer 70 covers the STI regions 68, such that the dummy dielectric layer 70 extends between the dummy gate layer 72 and the STI regions 68.

Figure 6A:
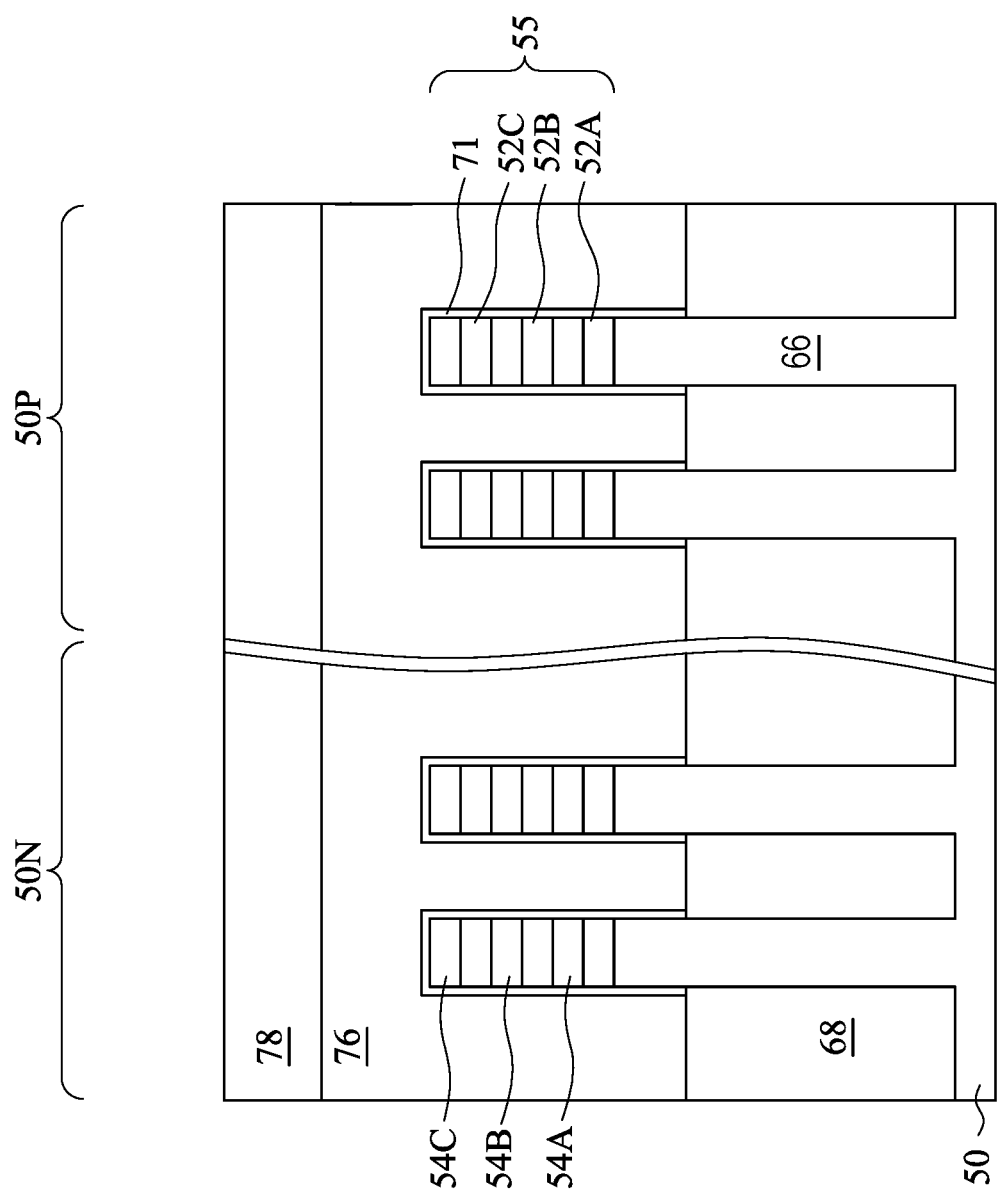
Figure 6B:
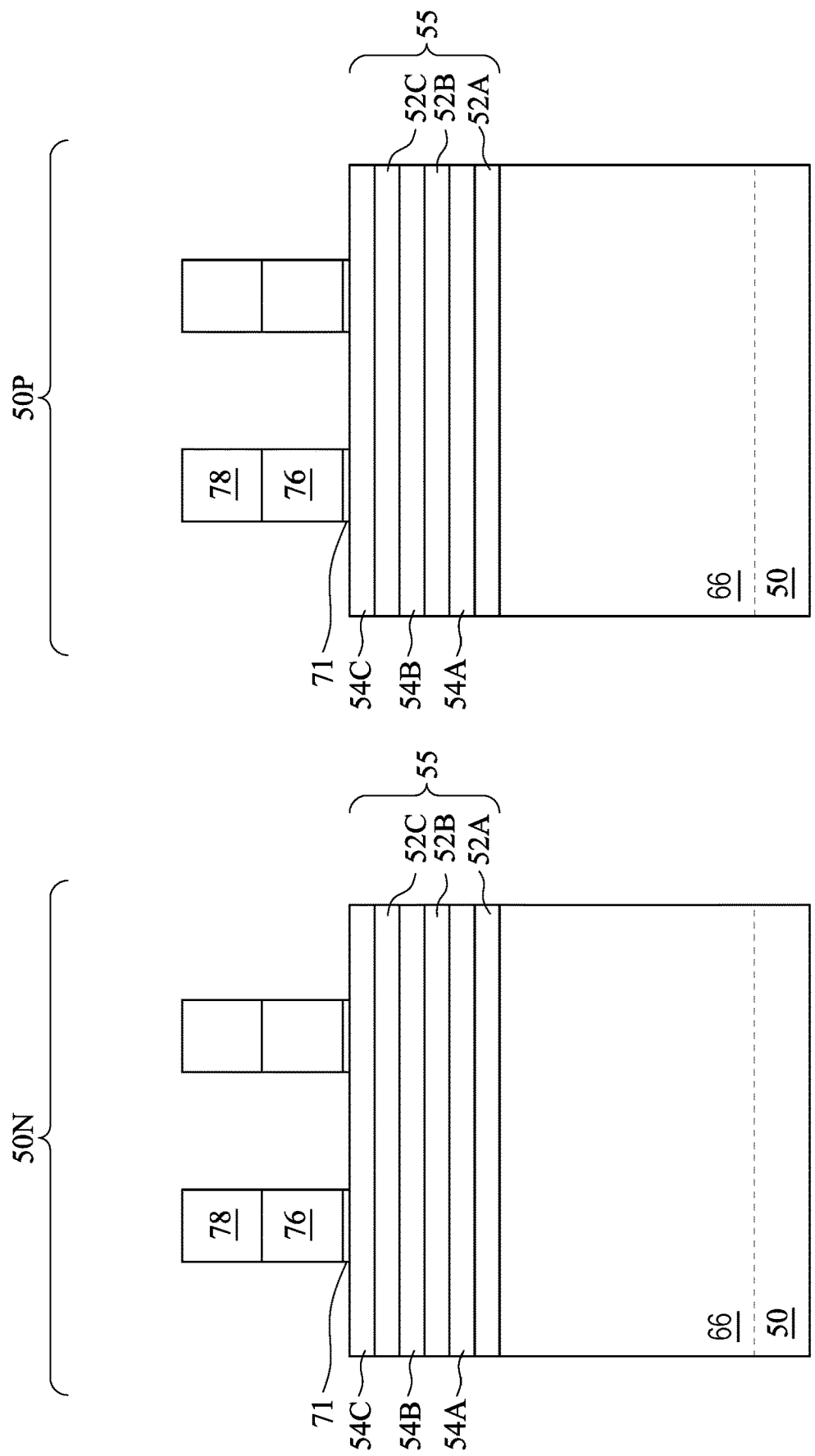

FIGS. 6A through 18C illustrate various additional steps in the manufacturing of embodiment devices. FIGS. 6A, 7A, 8A, 9A, 10A, 11A, 12A, 12C, 13A, 13C, 14A, 15A, and 18C illustrate features in either the n-type regions 50N or the p-type regions 50P. In FIGS. 6A and 6B, the mask layer 74 (see FIG. 5) may be patterned using acceptable photolithography and etching techniques to form masks 78. The pattern of the masks 78 then may be transferred to the dummy gate layer 72 and to the dummy dielectric layer 70 to form dummy gates 76 and dummy gate dielectrics 71, respectively. The dummy gates 76 cover respective channel regions of the fins 66. The pattern of the masks 78 may be used to physically separate each of the dummy gates 76 from adjacent dummy gates 76. The dummy gates 76 may also have a lengthwise direction substantially perpendicular to the lengthwise direction of respective fins 66.

Figure 7A:
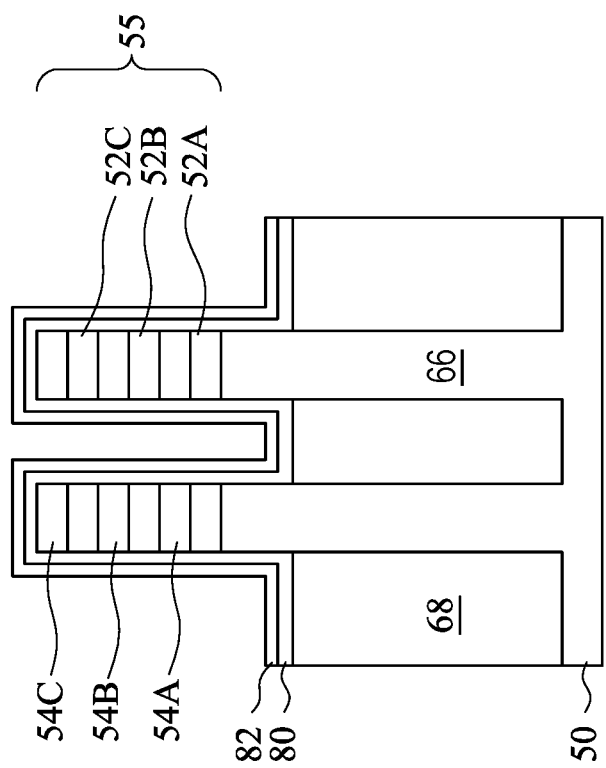
Figure 7B:
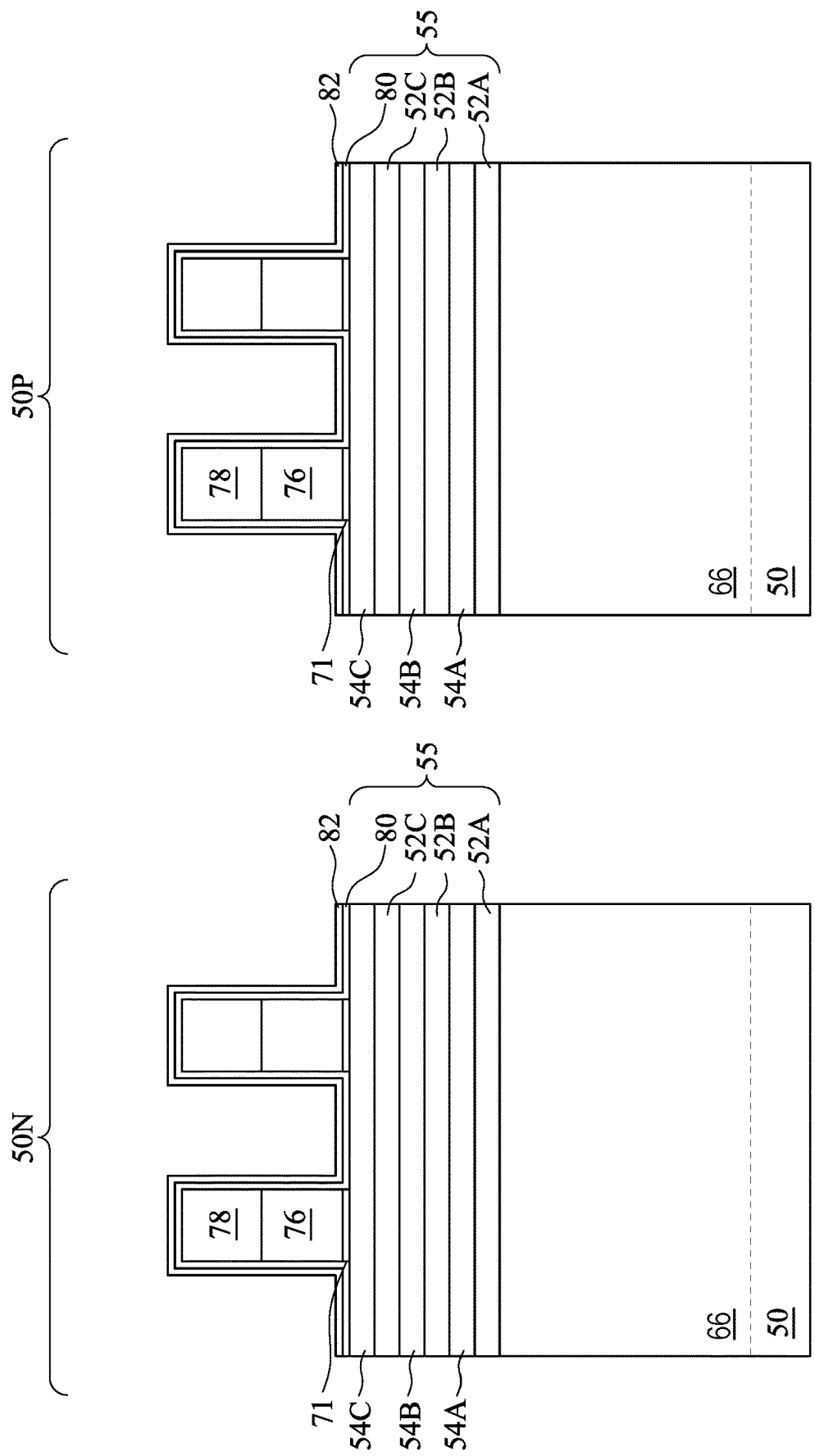

In FIGS. 7A and 7B, a first spacer layer 80 and a second spacer layer 82 are formed over the structures illustrated in FIGS. 6A and 6B, respectively. The first spacer layer 80 and the second spacer layer 82 will be subsequently patterned to act as spacers for forming self-aligned source/drain regions. In FIGS. 7A and 7B, the first spacer layer 80 is formed on top surfaces of the STI regions 68; top surfaces and sidewalls of the fins 66, the nanostructures 55, and the masks 78; and sidewalls of the dummy gates 76 and the dummy gate dielectric 71. The second spacer layer 82 is deposited over the first spacer layer 80. The first spacer layer 80 may be formed of silicon oxide, silicon nitride, silicon oxynitride, or the like, using techniques such as thermal oxidation or deposited by CVD, ALD, or the like. The second spacer layer 82 may be formed of a material having a different etch rate than the material of the first spacer layer 80, such as silicon oxide, silicon nitride, silicon oxynitride, or the like, and may be deposited by CVD, ALD, or the like.

After the first spacer layer 80 is formed and prior to forming the second spacer layer 82, implants for lightly doped source/drain (LDD) regions (not separately illustrated) may be performed. In embodiments with different device types, similar to the implants discussed above in FIG. 4, a mask, such as a photoresist, may be formed over the n-type region 50N, while exposing the p-type region 50P, and appropriate type (e.g., p-type) impurities may be implanted into the exposed fins 66 and nanostructures 55 in the p-type region 50P. The mask may then be removed. Subsequently, a mask, such as a photoresist, may be formed over the p-type region 50P while exposing the n-type region 50N, and appropriate type impurities (e.g., n-type) may be implanted into the exposed fins 66 and nanostructures 55 in the n-type region 50N. The mask may then be removed. The n-type impurities may be the any of the n-type impurities previously discussed, and the p-type impurities may be the any of the p-type impurities previously discussed. The lightly doped source/drain regions may have a concentration of impurities in a range from about $1\times10^{15}$ atoms/cm$^3$ to about $1\times10^{19}$ atoms/cm$^3$. An anneal may be used to repair implant damage and to activate the implanted impurities.

Figure 8A:
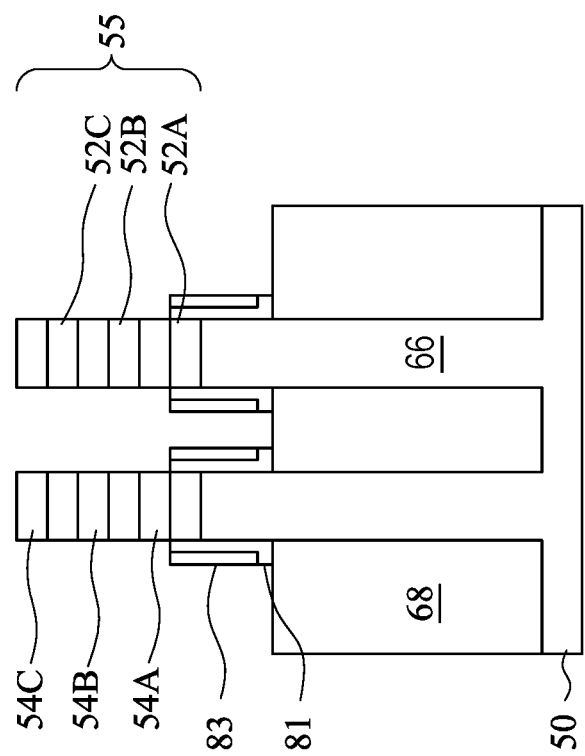
Figure 8B:
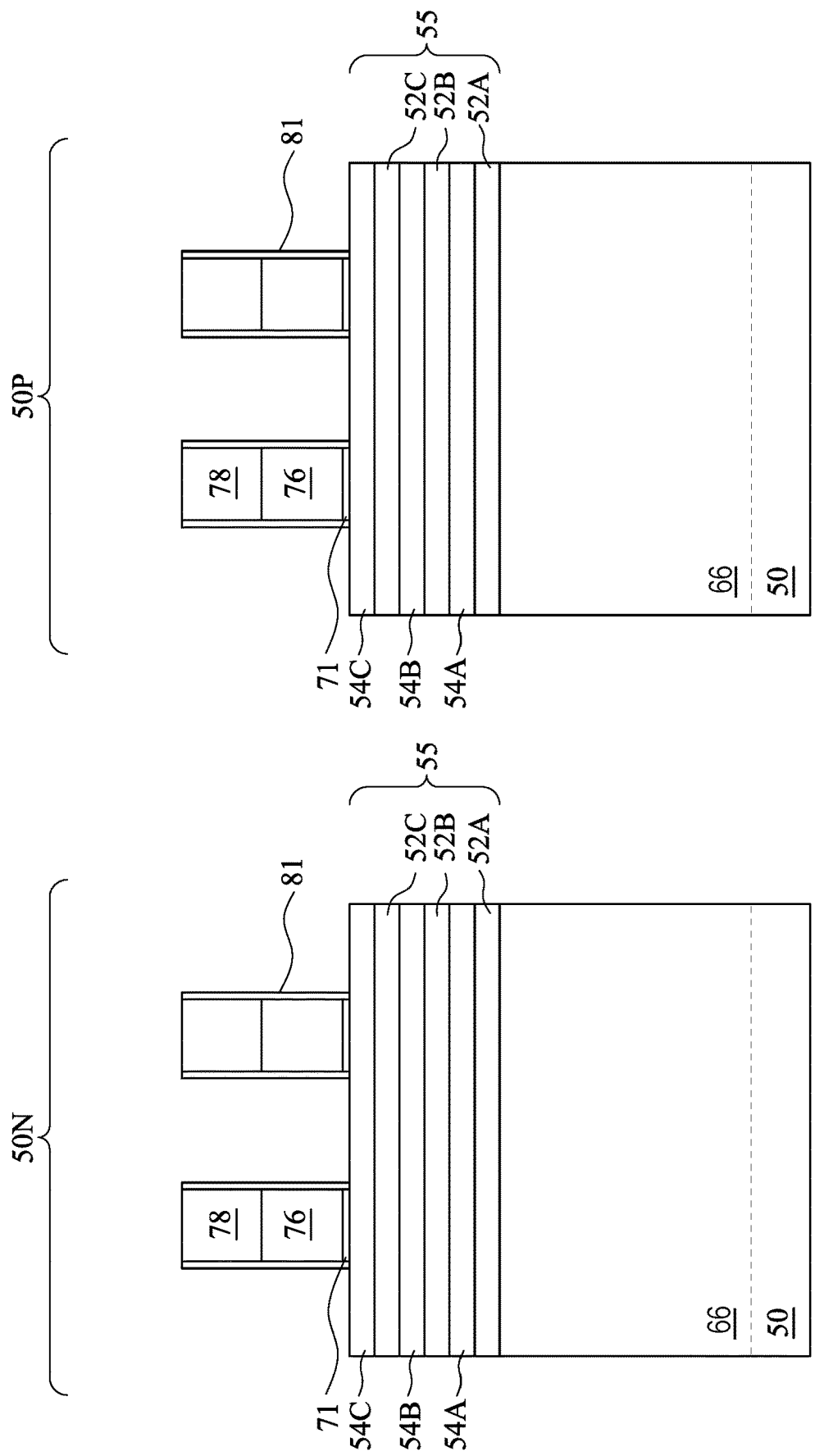

In FIGS. 8A and 8B, the first spacer layer 80 and the second spacer layer 82 are etched to form first spacers 81 and second spacers 83. As will be discussed in greater detail below, the first spacers 81 and the second spacers 83 act to self-aligned subsequently formed source drain regions, as well as to protect sidewalls of the fins 66 and/or nanostructure 55 during subsequent processing. The first spacer layer 80 and the second spacer layer 82 may be etched using a suitable etching process, such as an isotropic etching process (e.g., a wet etching process), an anisotropic etching process (e.g., a dry etching process), or the like. In some embodiments, the material of the second spacer layer 82 has a different etch rate than the material of the first spacer layer 80, such that the first spacer layer 80 may act as an etch stop layer when patterning the second spacer layer 82 and such that the second spacer layer 82 may act as a mask when patterning the first spacer layer 80. For example, the second spacer layer 82 may be etched using an anisotropic etch process wherein the first spacer layer 80 acts as an etch stop layer, wherein remaining portions of the second spacer layer 82 form second spacers 83 as illustrated in FIG. 8A. Thereafter, the second spacers 83 acts as a mask while etching exposed portions of the first spacer layer 80, thereby forming first spacers 81 as illustrated in FIG. 8A.

As illustrated in FIG. 8A, the first spacers 81 and the second spacers 83 are disposed on sidewalls of the fins 66 and/or nanostructures 55. As illustrated in FIG. 8B, in some embodiments, the second spacer layer 82 may be removed from over the first spacer layer 80 adjacent the masks 78, the dummy gates 76, and the dummy gate dielectrics 71, and the first spacers 81 are disposed on sidewalls of the masks 78, the dummy gates 76, and the dummy gate dielectrics 71. In other embodiments, a portion of the second spacer layer 82 may remain over the first spacer layer 80 adjacent the masks 78, the dummy gates 76, and the dummy gate dielectrics 71.

It is noted that the above disclosure generally describes a process of forming spacers and LDD regions. Other processes and sequences may be used. For example, fewer or additional spacers may be utilized, different sequence of steps may be utilized (e.g., the first spacers 81 may be patterned prior to depositing the second spacer layer 82), additional spacers may be formed and removed, and/or the like. Furthermore, the n-type and p-type devices may be formed using different structures and steps.

Figure 9A:
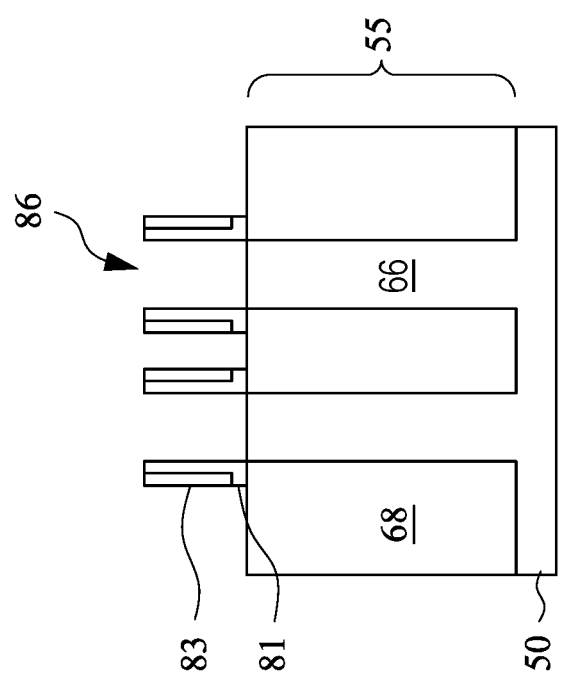
Figure 9B:
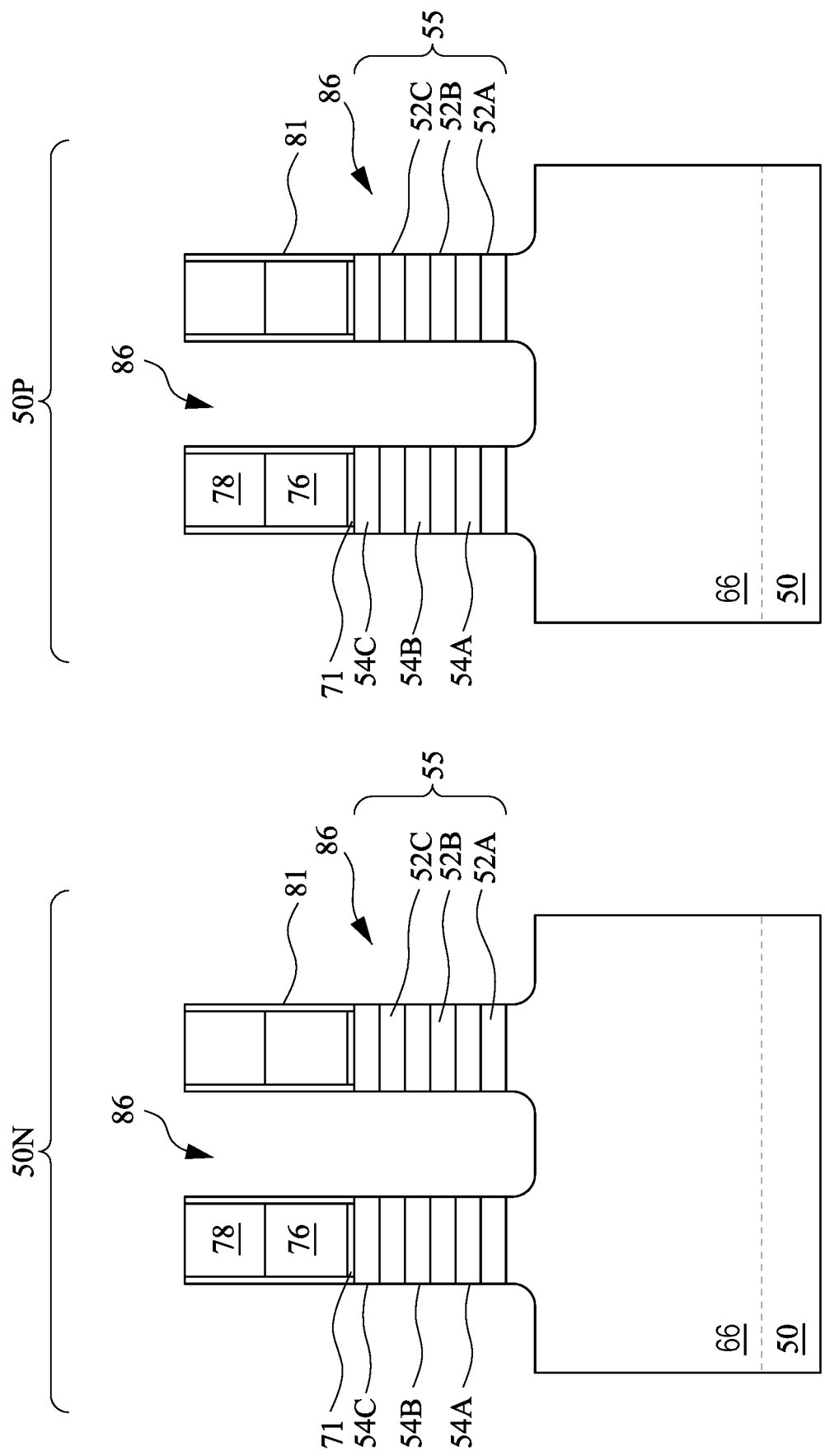

In FIGS. 9A and 9B, first recesses 86 are formed in the fins 66, the nanostructures 55, and the substrate 50, in accordance with some embodiments. Epitaxial source/drain regions will be subsequently formed in the first recesses 86. The first recesses 86 may extend through the first nanostructures 52 and the second nanostructures 54, and into the substrate 50. As illustrated in FIG. 9A, top surfaces of the STI regions 68 may be level with bottom surfaces of the first recesses 86. In various embodiments, the fins 66 may be etched such that bottom surfaces of the first recesses 86 are disposed below the top surfaces of the STI regions 68; or the like. The first recesses 86 may be formed by etching the fins 66, the nanostructures 55, and the substrate 50 using anisotropic etching processes, such as RIE, NBE, or the like. The first spacers 81, the second spacers 83, and the masks 78 mask portions of the fins 66, the nanostructures 55, and the substrate 50 during the etching processes used to form the first recesses 86. A single etch process or multiple etch processes may be used to etch each layer of the nanostructures 55 and/or the fins 66. Timed etch processes may be used to stop the etching of the first recesses 86 after the first recesses 86 reach a desired depth.

Figure 10A:
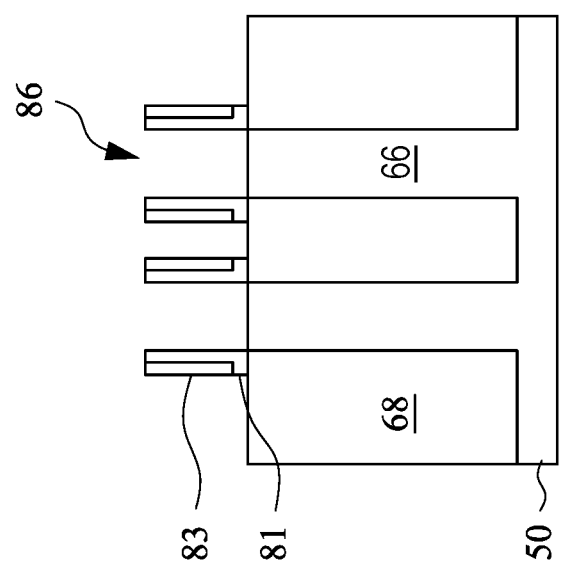
Figure 10B:
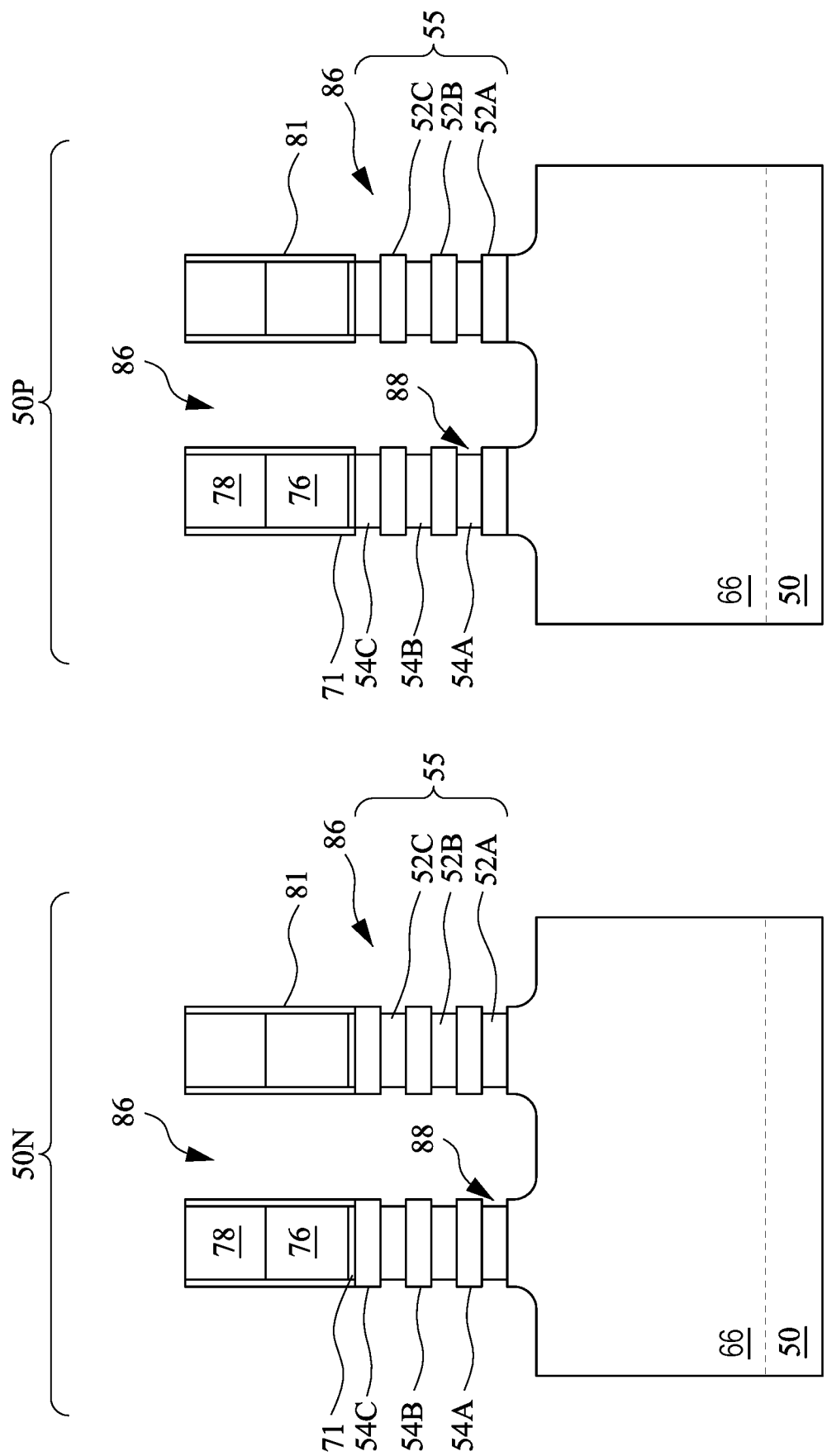

In FIGS. 10A and 10B, portions of sidewalls of the layers of the multi-layer stack 64 formed of the first semiconductor materials (e.g., the first nanostructures 52) exposed by the first recesses 86 are etched to form sidewall recesses 88 in the n-type region 50N, and portions of sidewalls of the layers of the multi-layer stack 64 formed of the second semiconductor materials (e.g., the second nanostructures 54) exposed by the first recesses 86 are etched to form sidewall recesses 88 in the p-type region 50P. Although sidewalls of the first nanostructures 52 and the second nanostructures 54 in sidewall recesses 88 are illustrated as being straight in FIG. 10B, the sidewalls may be concave or convex. The sidewalls may be etched using isotropic etching processes, such as wet etching or the like. The p-type region 50P may be protected using a mask (not shown) while etchants selective to the first semiconductor materials are used to etch the first nanostructures 52 such that the second nanostructures 54 and the substrate 50 remain relatively unetched as compared to the first nanostructures 52 in the n-type region 50N. Similarly, the n-type region 50N may be protected using a mask (not shown) while etchants selective to the second semiconductor materials are used to etch the second nanostructures 54 such that the first nanostructures 52 and the substrate 50 remain relatively unetched as compared to the second nanostructures 54 in the p-type region 50P. In an embodiment in which the first nanostructures 52 include, e.g., SiGe, and the second nanostructures 54 include, e.g., Si or SiC, a dry etch process with tetramethylammonium hydroxide (TMAH), ammonium hydroxide (NH$_4$OH), or the like may be used to etch sidewalls of the first nanostructures 52 in the n-type region 50N, and a wet or dry etch process with hydrogen fluoride, another fluorine-based etchant, or the like may be used to etch sidewalls of the second nanostructures 54 in the p-type region 50P.

Figure 11A:
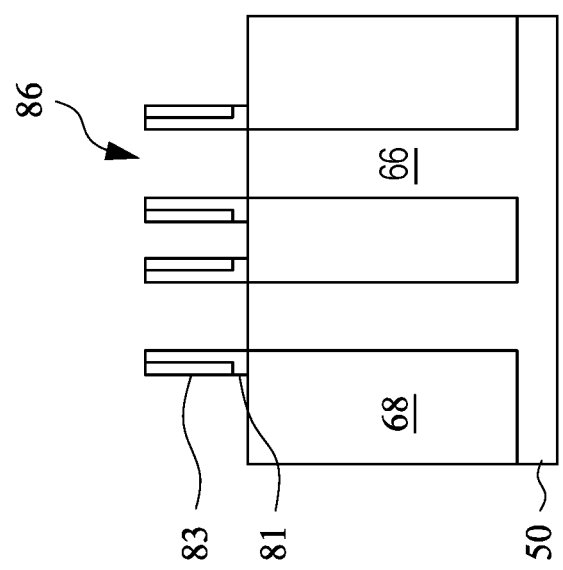
Figure 11B:
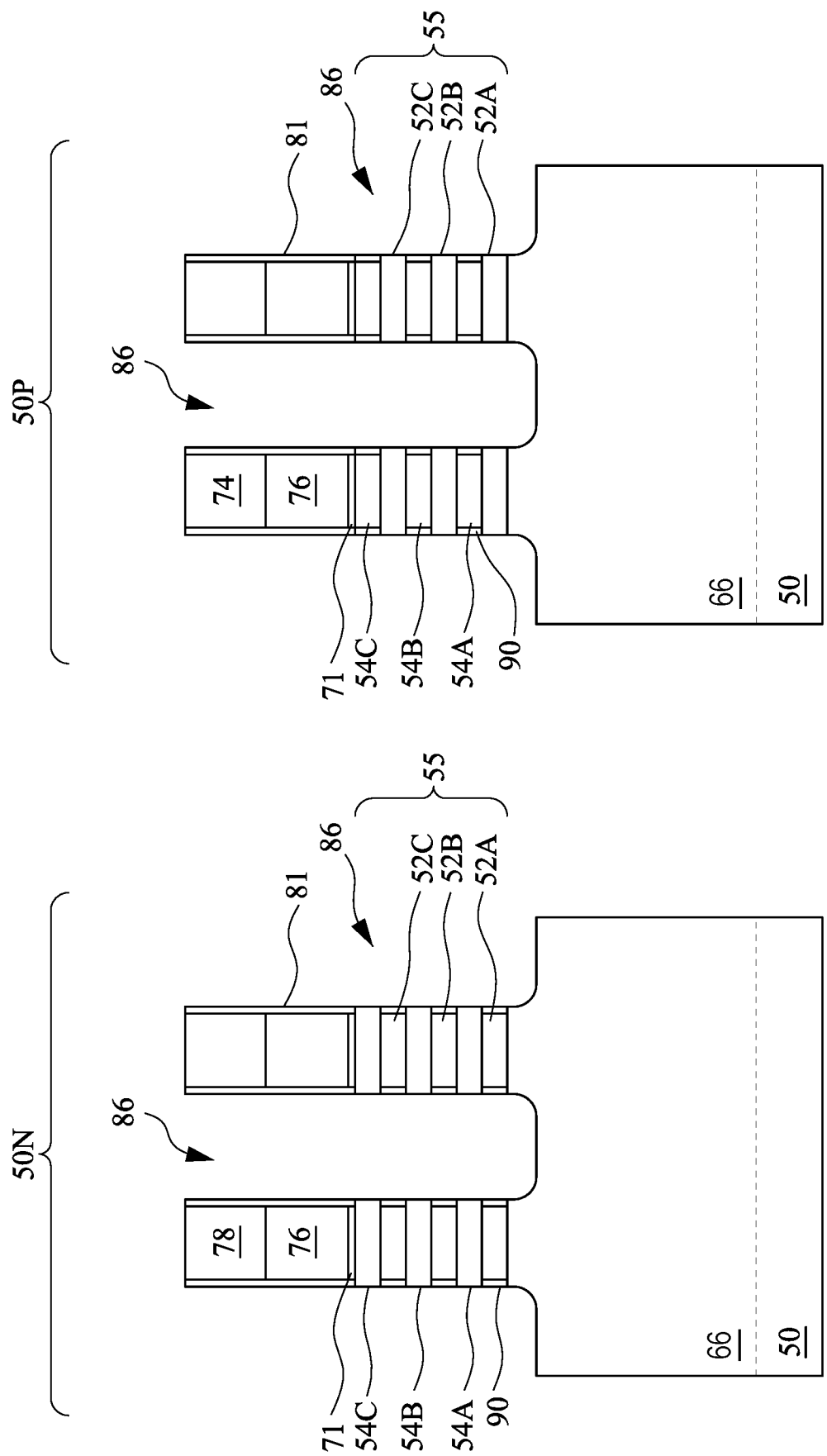
Figure 11C:
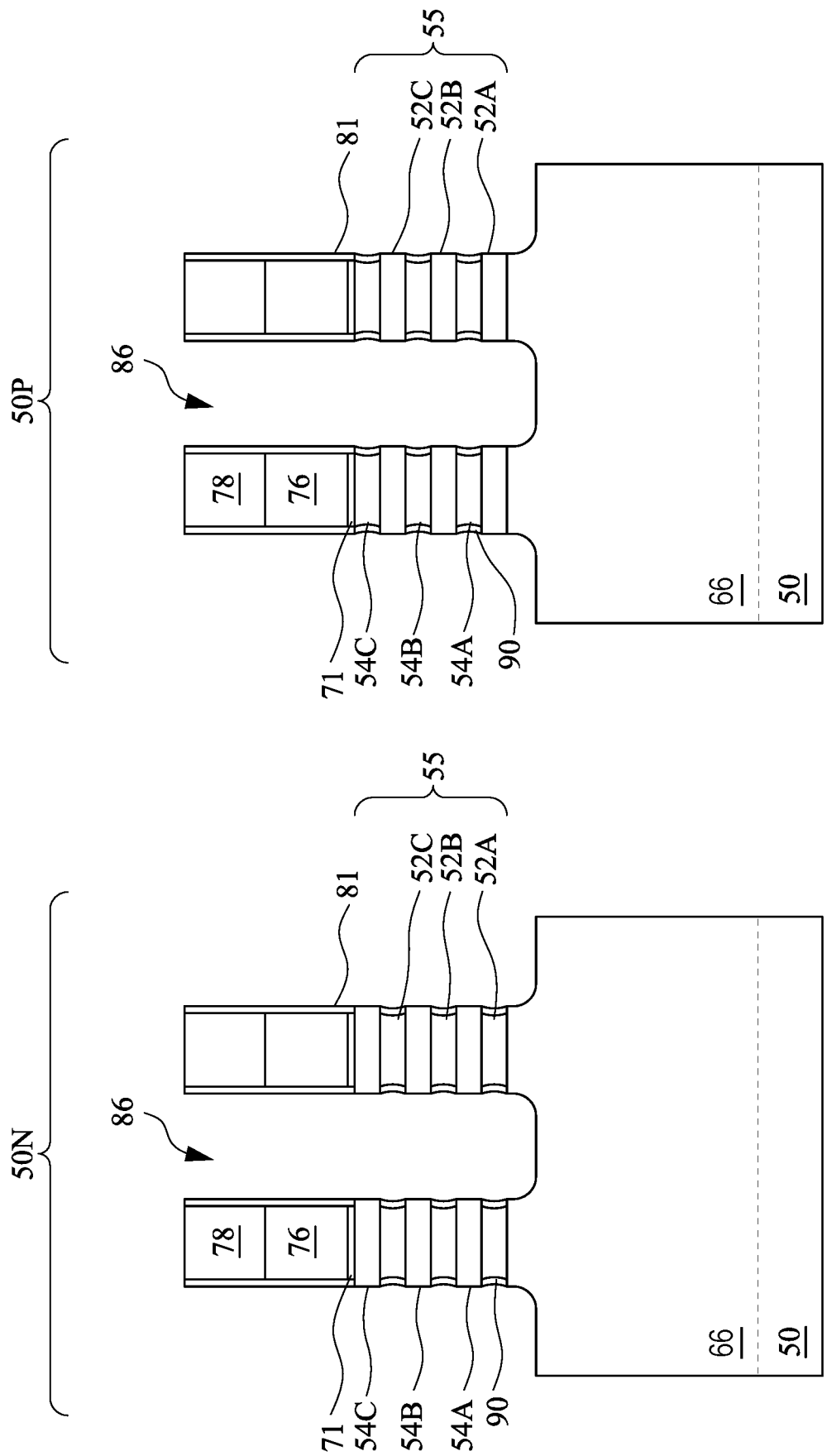

In FIGS. 11A-11C, first inner spacers 90 are formed in the sidewall recesses 88. The first inner spacers 90 may be formed by depositing an inner spacer layer (not separately illustrated) over the structures illustrated in FIGS. 10A and 10B. The first inner spacers 90 act as isolation features between subsequently formed source/drain regions and a gate structure. As will be discussed in greater detail below, source/drain regions will be formed in the first recesses 86, while the first nanostructures 52 in the n-type region 50N and the second nanostructures 54 in the p-type region 50P will be replaced with corresponding gate structures.

The inner spacer layer may be deposited by a conformal deposition process, such as CVD, ALD, or the like. The inner spacer layer may comprise a material such as silicon nitride or silicon oxynitride, although any suitable material, such as low-dielectric constant (low-k) materials having a k-value less than about 3.5, may be utilized. The inner spacer layer may then be anisotropically etched to form the first inner spacers 90. Although outer sidewalls of the first inner spacers 90 are illustrated as being flush with sidewalls of the second nanostructures 54 in the n-type region 50N and flush with the sidewalls of the first nanostructures 52 in the p-type region 50P, the outer sidewalls of the first inner spacers 90 may extend beyond or be recessed from sidewalls of the second nanostructures 54 and/or the first nanostructures 52, respectively.

Moreover, although the outer sidewalls of the first inner spacers 90 are illustrated as being straight in FIG. 11B, the outer sidewalls of the first inner spacers 90 may be concave or convex. As an example, FIG. 11C illustrates an embodiment in which sidewalls of the first nanostructures 52 are concave, outer sidewalls of the first inner spacers 90 are concave, and the first inner spacers are recessed from sidewalls of the second nanostructures 54 in the n-type region 50N. Also illustrated are embodiments in which sidewalls of the second nanostructures 54 are concave, outer sidewalls of the first inner spacers 90 are concave, and the first inner spacers are recessed from sidewalls of the first nanostructures 52 in the p-type region 50P. The inner spacer layer may be etched by an anisotropic etching process, such as RIE, NBE, or the like. The first inner spacers 90 may be used to prevent damage to subsequently formed source/drain regions (such as the epitaxial source/drain regions 92, discussed below with respect to FIGS. 12A-12C) by subsequent etching processes, such as etching processes used to form gate structures.

Figure 12A:
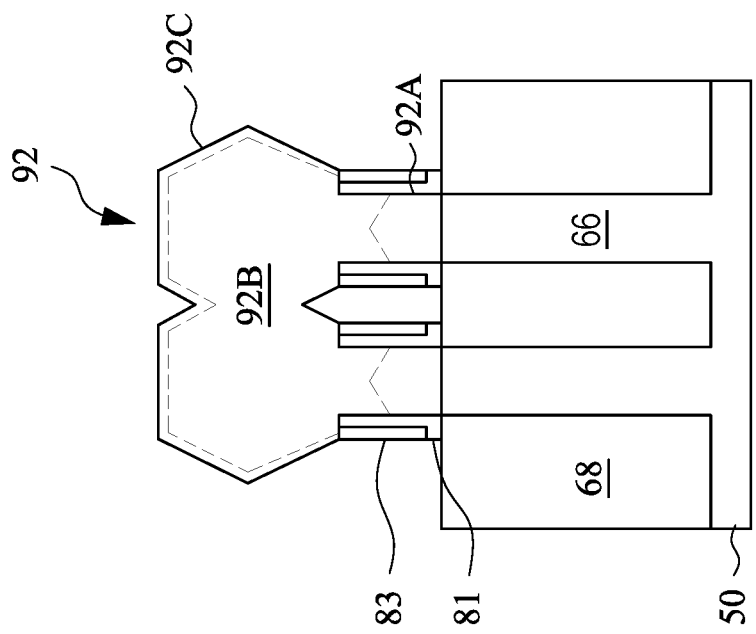

In FIGS. 12A-12C, epitaxial source/drain regions 92 are formed in the first recesses 86. In some embodiments, the epitaxial source/drain regions 92 may exert stress on the second nanostructures 54 in the n-type region 50N and on the first nanostructures 52 in the p-type region 50P, thereby improving performance. As illustrated in FIG. 12B, the epitaxial source/drain regions 92 are formed in the first recesses 86 such that each dummy gate 76 is disposed between respective neighboring pairs of the epitaxial source/drain regions 92. In some embodiments, the first spacers 81 are used to separate the epitaxial source/drain regions 92 from the dummy gate layers 72 and the first inner spacers 90 are used to separate the epitaxial source/drain regions 92 from the nanostructures 55 by an appropriate lateral distance so that the epitaxial source/drain regions 92 do not short out with subsequently formed gates of the resulting nano-FETs.

The epitaxial source/drain regions 92 in the n-type region 50N, e.g., the NMOS region, may be formed by masking the p-type region 50P, e.g., the PMOS region. Then, the epitaxial source/drain regions 92 are epitaxially grown in the first recesses 86 in the n-type region 50N. The epitaxial source/drain regions 92 may include any acceptable material appropriate for n-type nano-FETs. For example, if the second nanostructures 54 are silicon, the epitaxial source/drain regions 92 may include materials exerting a tensile strain on the second nanostructures 54, such as silicon, silicon carbide, phosphorous doped silicon carbide, silicon phosphide, or the like. The epitaxial source/drain regions 92 may have surfaces raised from respective upper surfaces of the nanostructures 55 and may have facets.

The epitaxial source/drain regions 92 in the p-type region 50P, e.g., the PMOS region, may be formed by masking the n-type region 50N, e.g., the NMOS region. Then, the epitaxial source/drain regions 92 are epitaxially grown in the first recesses 86 in the p-type region 50P. The epitaxial source/drain regions 92 may include any acceptable material appropriate for p-type nano-FETs. For example, if the first nanostructures 52 are silicon germanium, the epitaxial source/drain regions 92 may comprise materials exerting a compressive strain on the first nanostructures 52, such as silicon-germanium, boron doped silicon-germanium, germanium, germanium tin, or the like. The epitaxial source/drain regions 92 may also have surfaces raised from respective surfaces of the multi-layer stack 64 (see FIG. 2) and may have facets.

The epitaxial source/drain regions 92, the first nanostructures 52, the second nanostructures 54, and/or the substrate 50 may be implanted with dopants to form source/drain regions, similar to the process previously discussed for forming lightly-doped source/drain regions, followed by an anneal. The source/drain regions may have an impurity concentration of between about $1 \times 10^{19}$ atoms/cm$^3$ and about $1 \times 10^{21}$ atoms/cm$^3$. The n-type and/or p-type impurities for source/drain regions may be any of the impurities previously discussed. In some embodiments, the epitaxial source/drain regions 92 may be in situ doped during growth.

As a result of the epitaxy processes used to form the epitaxial source/drain regions 92 in the n-type region 50N and the p-type region 50P, upper surfaces of the epitaxial source/drain regions 92 have facets which expand laterally outward beyond sidewalls of the nanostructures 55. In some embodiments, these facets cause adjacent epitaxial source/drain regions 92 of a same nano-FET to merge as illustrated by FIG. 12A. In other embodiments, adjacent epitaxial source/drain regions 92 remain separated after the epitaxy process is completed as illustrated by FIG. 12C. In the embodiments illustrated in FIGS. 12A and 12C, the first spacers 81 may be formed to a top surface of the STI regions 68 thereby blocking the epitaxial growth. In some other embodiments, the first spacers 81 may cover portions of the sidewalls of the nanostructures 55 further blocking the epitaxial growth. In some other embodiments, the spacer etch used to form the first spacers 8i may be adjusted to remove the spacer material to allow the epitaxially grown region to extend to the surface of the STI region 68.

The epitaxial source/drain regions 92 may comprise one or more semiconductor material layers. For example, the epitaxial source/drain regions 92 may comprise a first semiconductor material layer 92A, a second semiconductor material layer 92B, and a third semiconductor material layer 92C. Any number of semiconductor material layers may be used for the epitaxial source/drain regions 92. Each of the first semiconductor material layer 92A, the second semiconductor material layer 92B, and the third semiconductor material layer 92C may be formed of different semiconductor materials and may be doped to different dopant concentrations. In some embodiments, the first semiconductor material layer 92A may have a dopant concentration less than the second semiconductor material layer 92B and greater than the third semiconductor material layer 92C. In embodiments in which the epitaxial source/drain regions 92 comprise three semiconductor material layers, the first semiconductor material layer 92A may be deposited, the second semiconductor material layer 92B may be deposited over the first semiconductor material layer 92A, and the third semiconductor material layer 92C may be deposited over the second semiconductor material layer 92B.

Figure 12D:
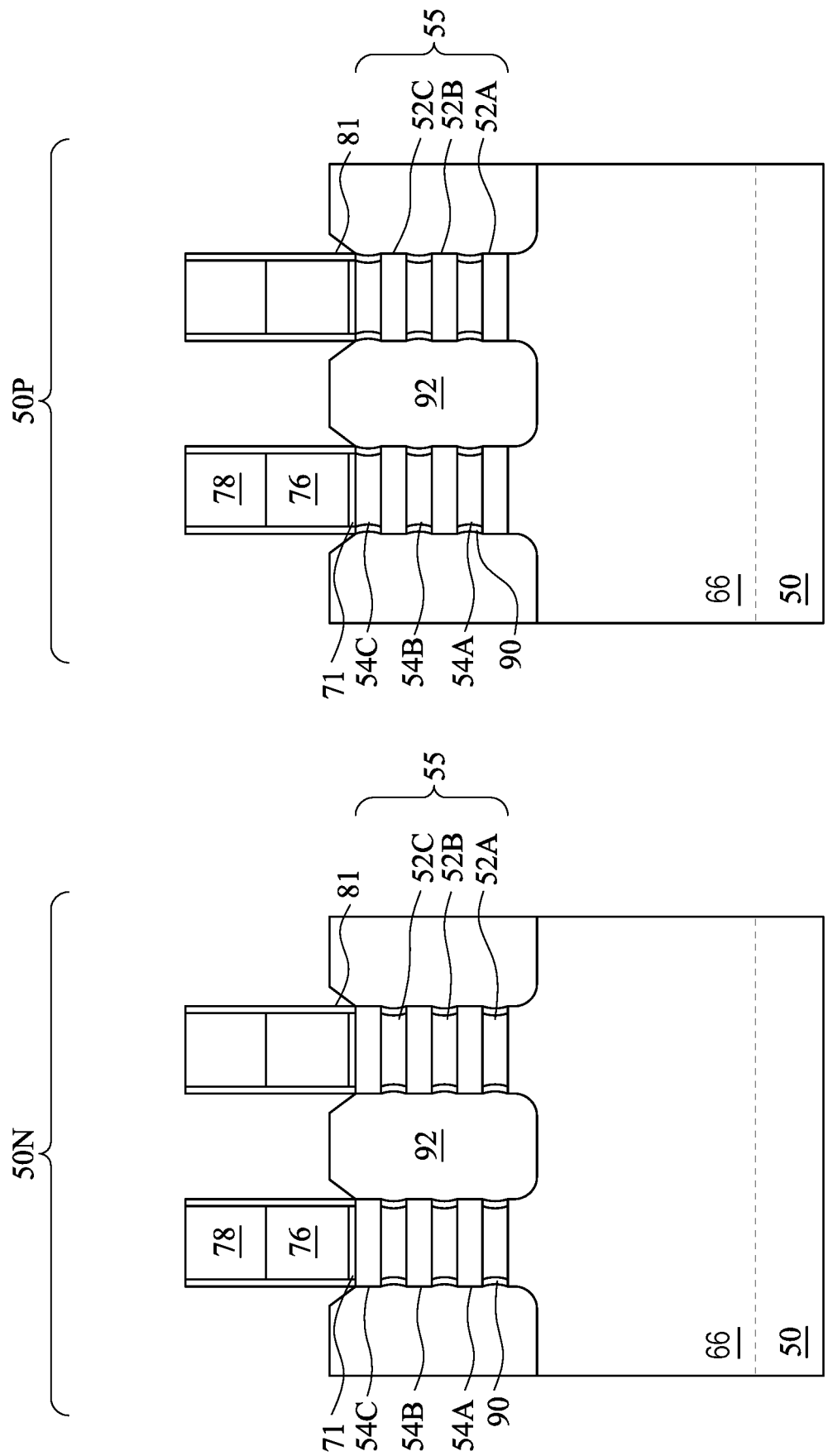

FIG. 12D illustrates an embodiment in which sidewalls of the first nanostructures 52 in the n-type region 50N and sidewalls of the second nanostructures 54 in the p-type region 50P are concave, outer sidewalls of the first inner spacers 90 are concave, and the first inner spacers 90 are recessed from sidewalls of the second nanostructures 54 and the first nanostructures 52, respectively. As illustrated in FIG. 12D, the epitaxial source/drain regions 92 may be formed in contact with the first inner spacers 90 and may extend past sidewalls of the second nanostructures 54 in the n-type region 50N and past sidewalls of the first nanostructures 52 in the p-type region 50P.

Figure 13A:
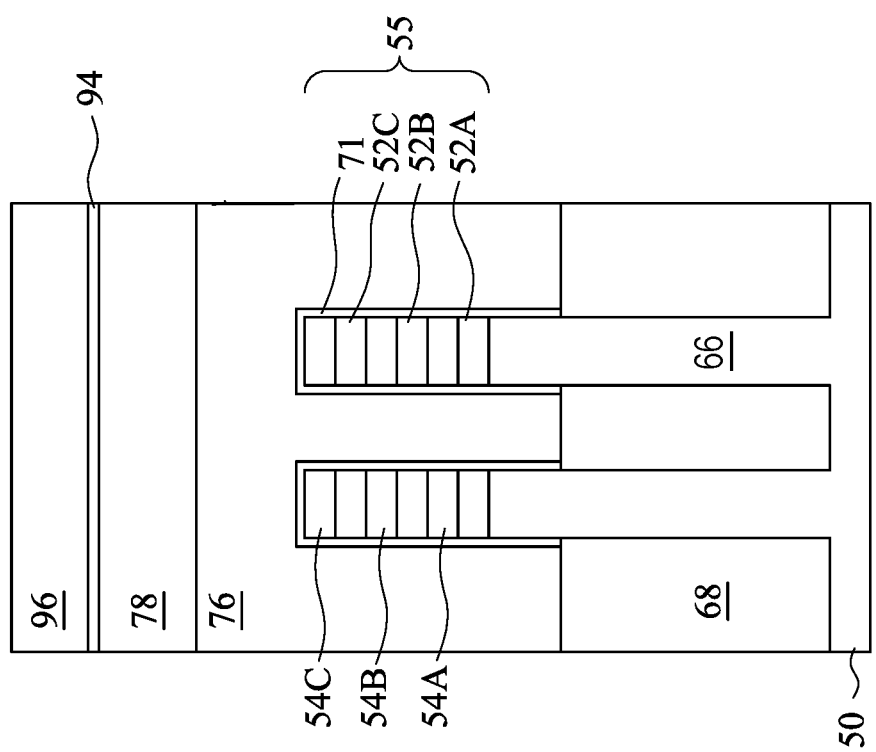
Figure 13B:
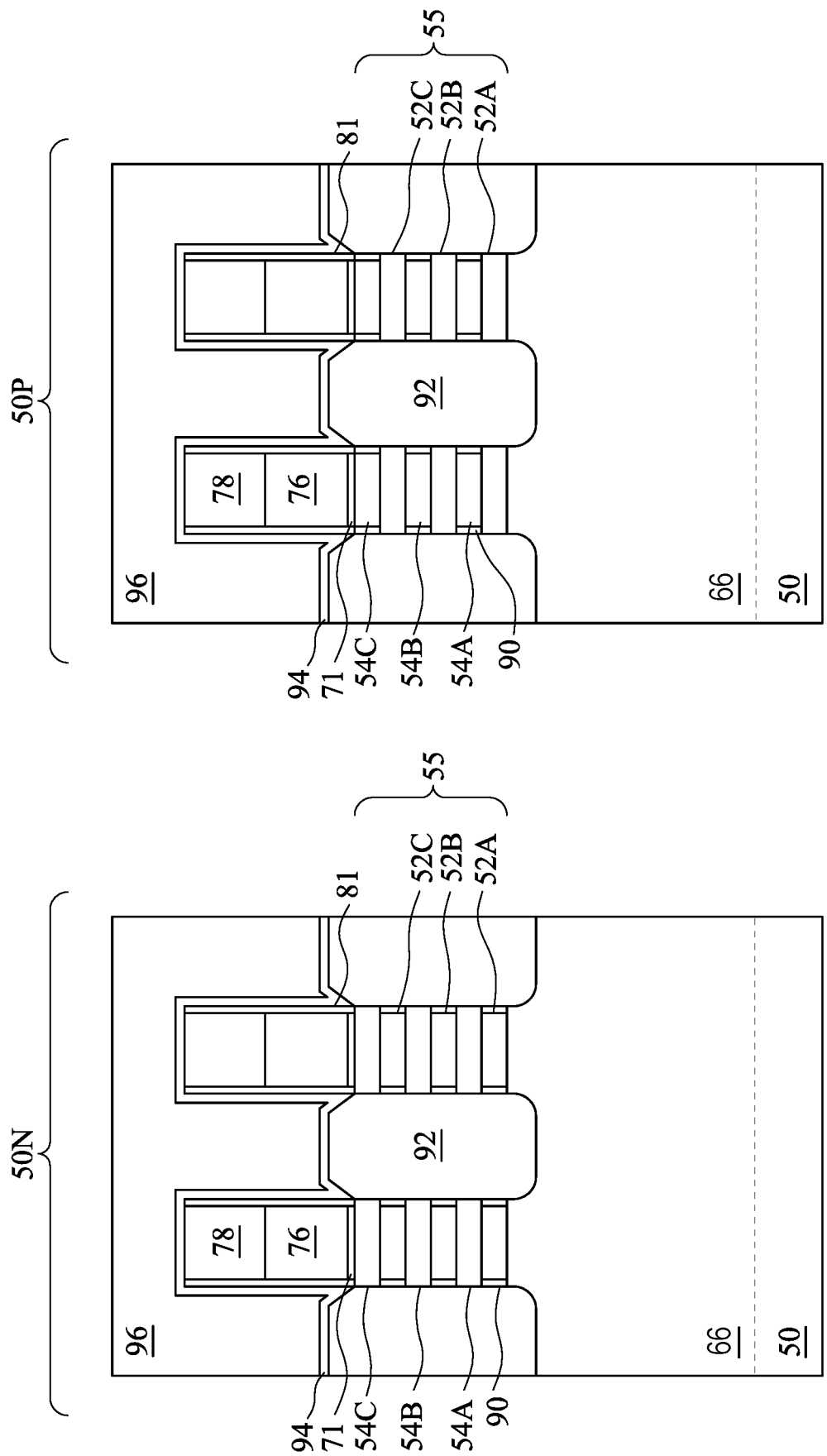
Figure 13C:
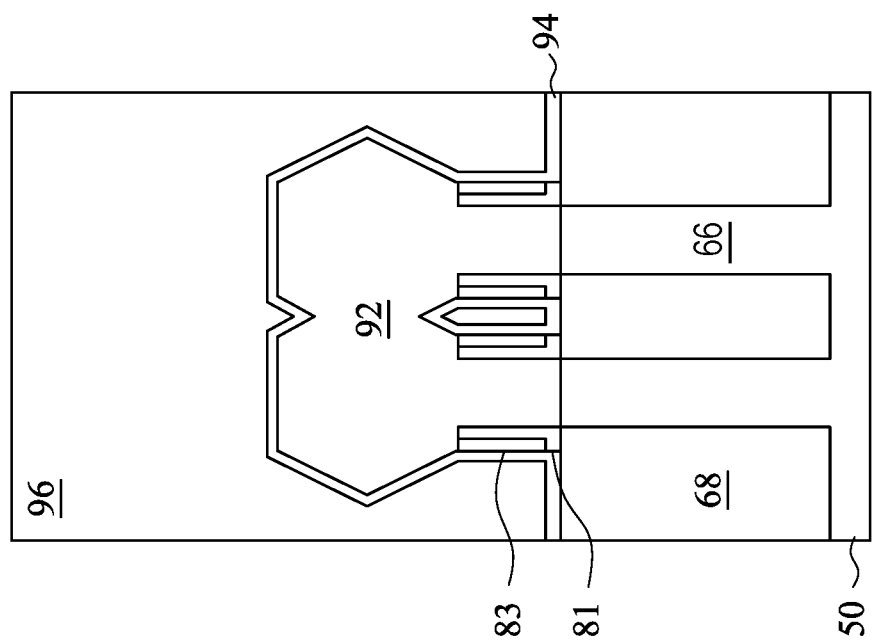

In FIGS. 13A-13C, a first interlayer dielectric (ILD) 96 is deposited over the structure illustrated in FIGS. 6A, 12B, and 12A (the processes of FIGS. 7A-12D do not alter the cross-section illustrated in FIGS. 6A), respectively. The first ILD 96 may be formed of a dielectric material, and may be deposited by any suitable method, such as CVD, plasma-enhanced CVD (PECVD), or FCVD. Dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used. In some embodiments, a contact etch stop layer (CESL) 94 is disposed between the first ILD 96 and the epitaxial source/drain regions 92, the mask layers 74, and the first spacers 81. The CESL 94 may comprise a dielectric material, such as, silicon nitride, silicon oxide, silicon oxynitride, or the like, having a different etch rate than the material of the overlying first ILD 96.

Figure 14A:
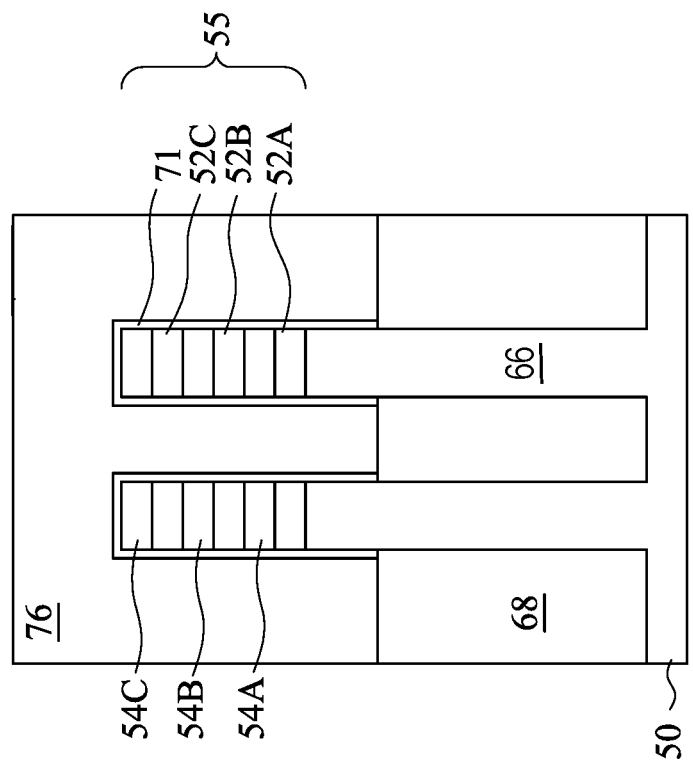
Figure 14B:
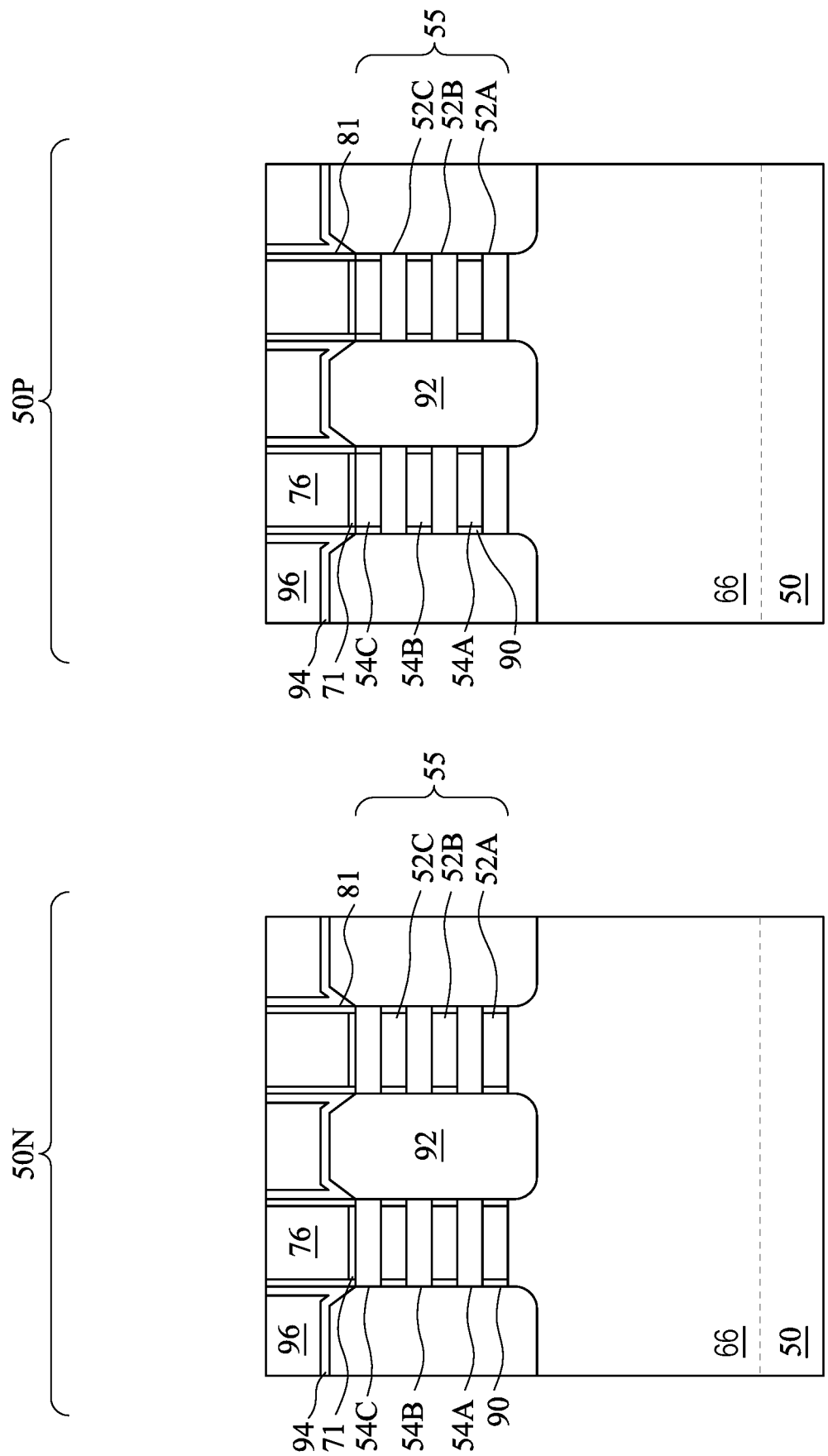

In FIGS. 14A-14C, a planarization process, such as a CMP, may be performed to level the top surface of the first ILD 96 with the top surfaces of the dummy gates 76 or the masks 78. The planarization process may also remove the masks 78 on the dummy gates 76, and portions of the first spacers 81 along sidewalls of the masks 78. After the planarization process, top surfaces of the dummy gates 76, the first spacers 81, and the first ILD 96 are level within process variations. Accordingly, the top surfaces of the dummy gates 76 are exposed through the first ILD 96. In some embodiments, the masks 78 may remain, in which case the planarization process levels the top surface of the first ILD 96 with top surface of the masks 78 and the first spacers 81.

Figure 15B:
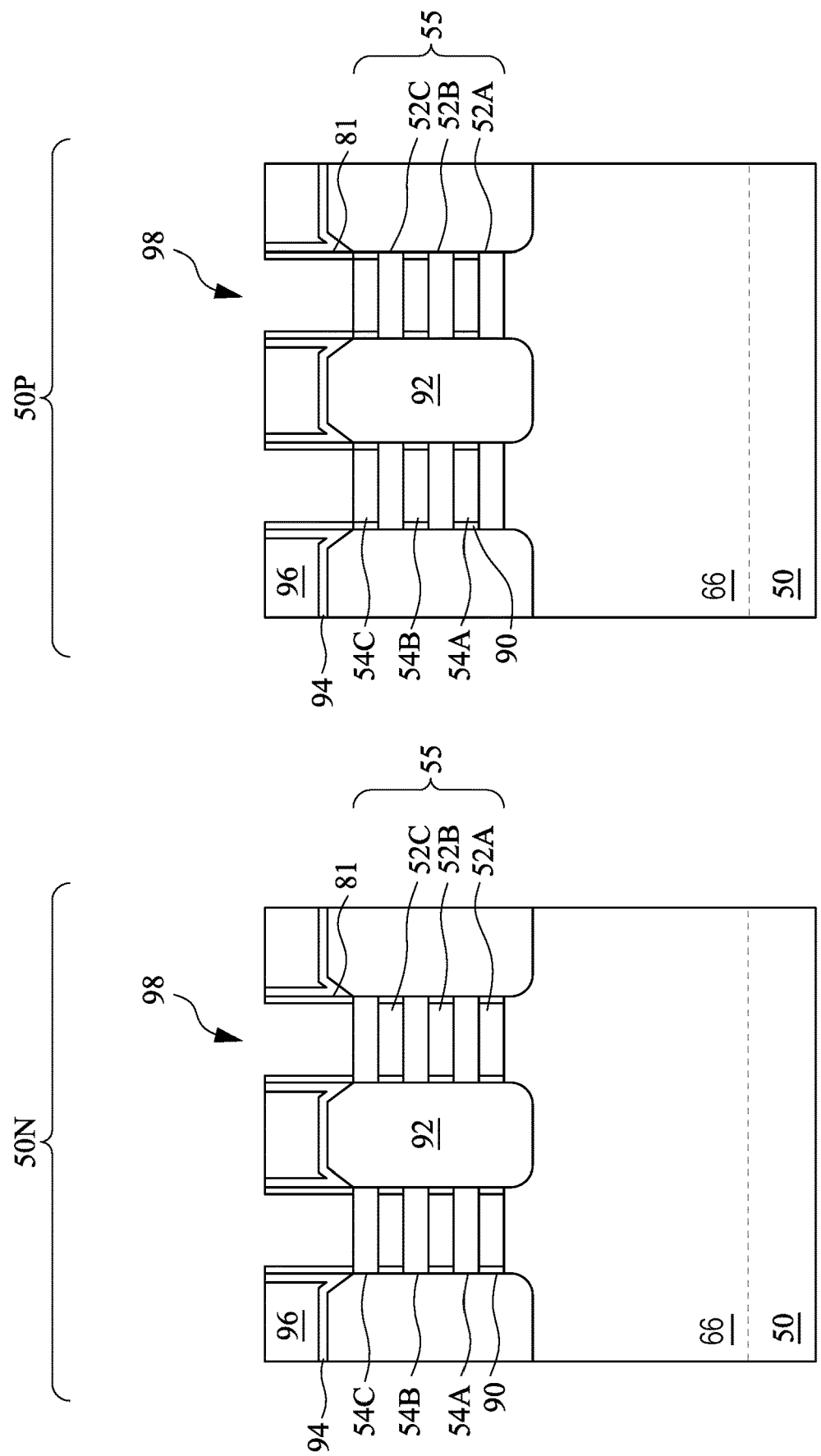
Figure 17A:
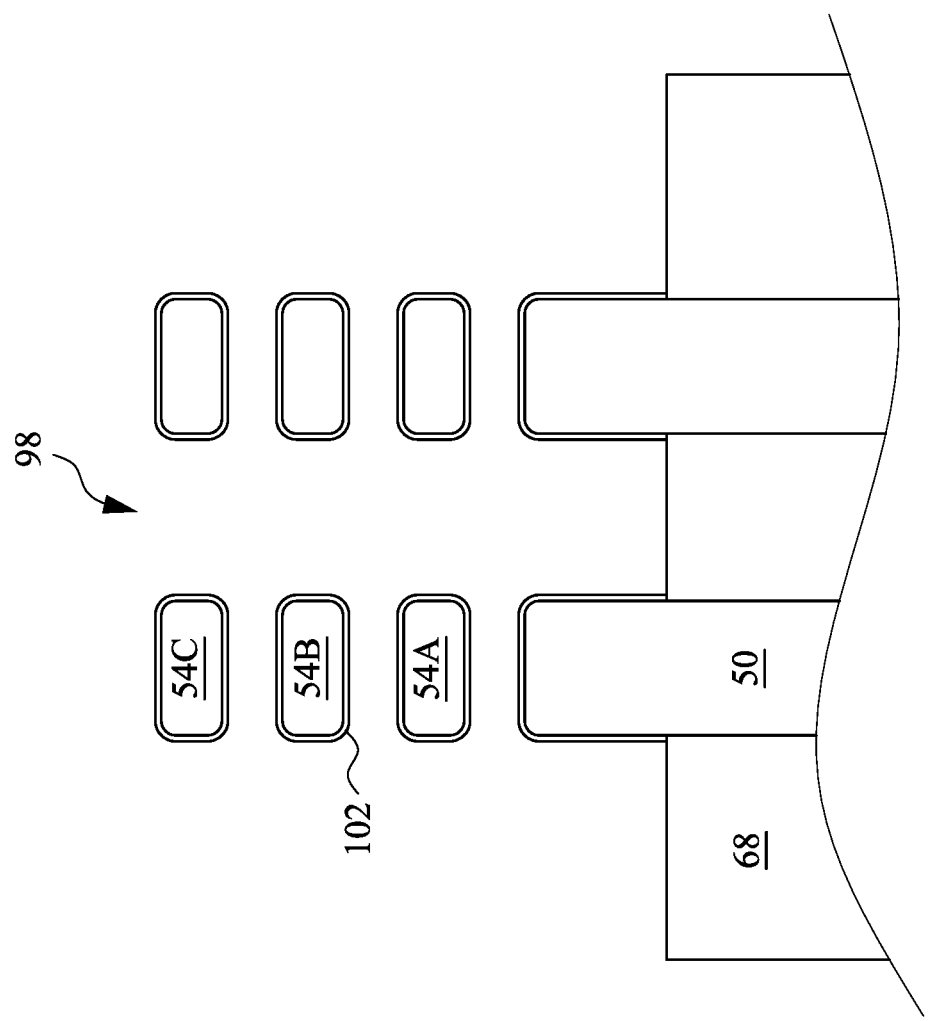
Figure 17B:
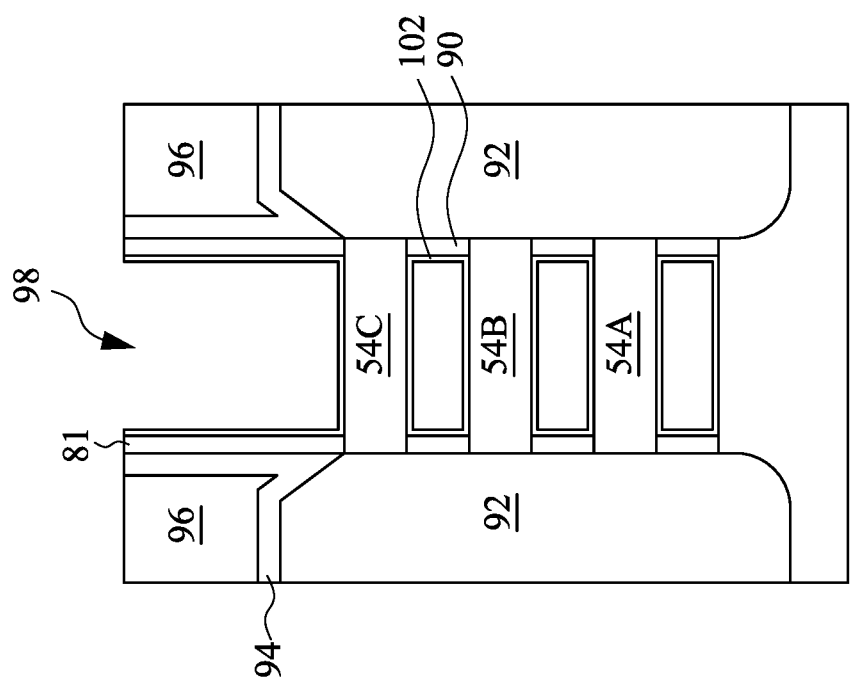
Figure 17D:
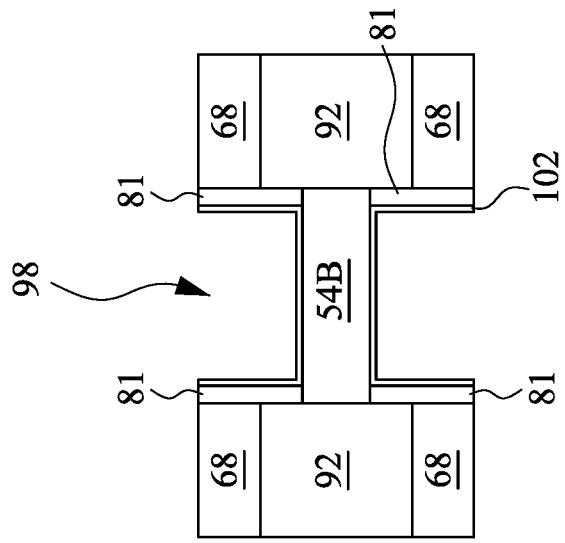
Figure 17C:
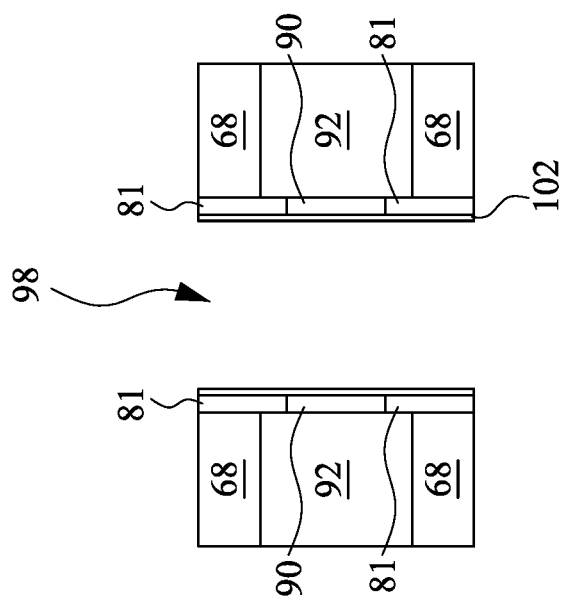
Figure 18B:
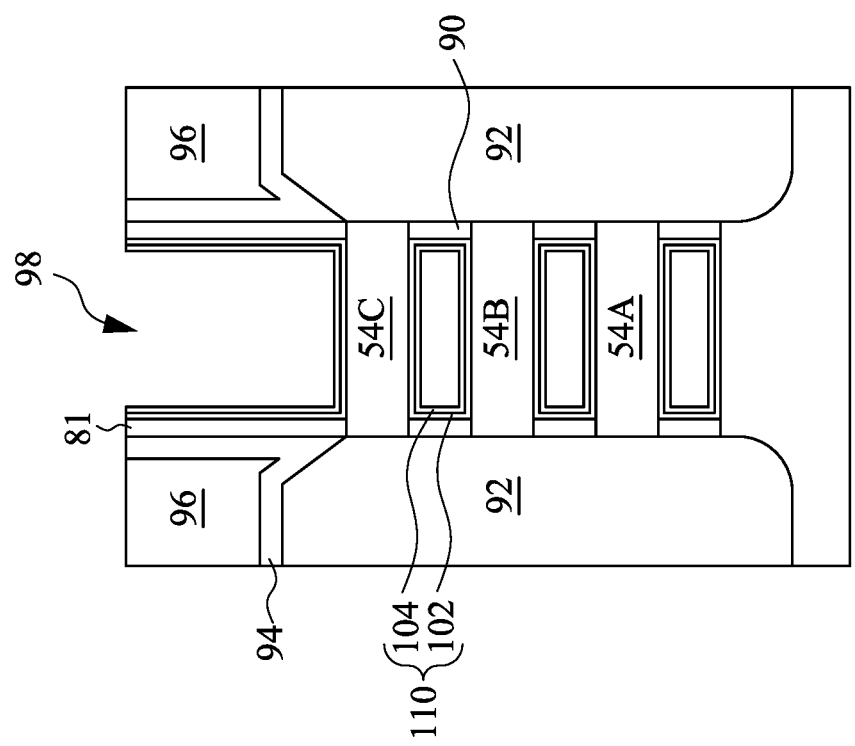
Figure 18C:
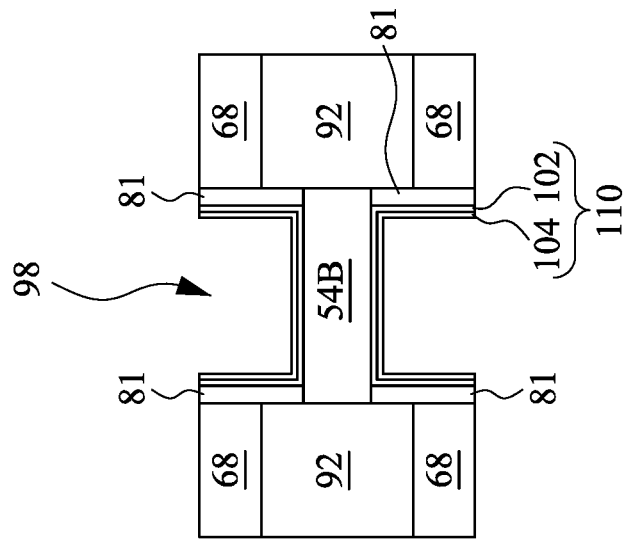
Figure 18D:
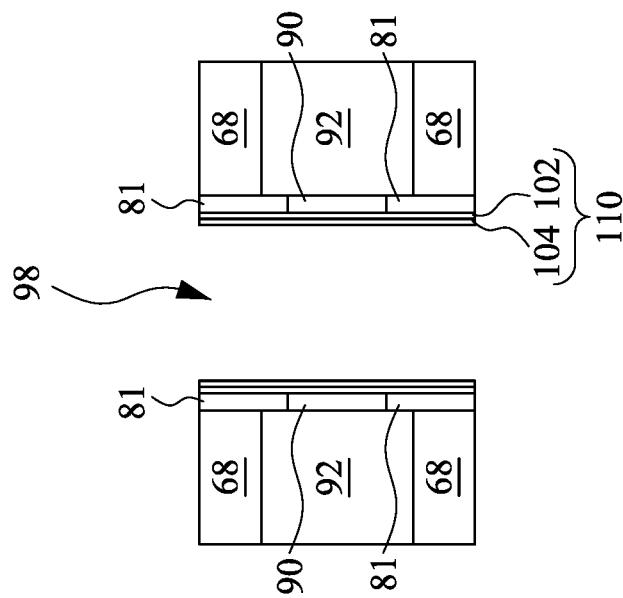

In FIGS. 15A and 15B, the dummy gates 76, and the mask layers 74 if present, are removed in one or more etching steps, so that second recesses 98 are formed. Portions of the dummy gate dielectrics 71 in the second recesses 98 are also be removed. In some embodiments, the dummy gates 76 and the dummy gate dielectrics 71 are removed by an anisotropic dry etch process. For example, the etching process may include a dry etch process using reaction gas(es) that selectively etch the dummy gates 76 at a faster rate than the first ILD 96 or the first spacers 81. Each second recess 98 exposes and/or overlies portions of nanostructures 55, which act as channel regions in subsequently completed nano-FETs. Portions of the nanostructures 55 which act as the channel regions are disposed between neighboring pairs of the epitaxial source/drain regions 92. During the removal, the dummy gate dielectrics 71 may be used as etch stop layers when the dummy gates 76 are etched. The dummy gate dielectrics 71 may then be removed after the removal of the dummy gates 76.

In FIGS. 16A and 16B, the first nanostructures 52 in the n-type region 50N and the second nanostructures 54 in the p-type region 50P are removed extending the second recesses 98. The first nanostructures 52 may be removed by forming a mask (not shown) over the p-type region 50P and performing an isotropic etching process such as wet etching or the like using etchants which are selective to the materials of the first nanostructures 52, while the second nanostructures 54, the substrate 50, the STI regions 68 remain relatively unetched as compared to the first nanostructures 52. In embodiments in which the first nanostructures 52 include, e.g., SiGe, and the second nanostructures 54A-54C include, e.g., Si or SiC, tetramethylammonium hydroxide (TMAH), ammonium hydroxide ($NH_4OH$), or the like may be used to remove the first nanostructures 52 in the n-type region 50N.

The second nanostructures 54 in the p-type region 50P may be removed by forming a mask (not shown) over the n-type region 50N and performing an isotropic etching process such as wet etching or the like using etchants which are selective to the materials of the second nanostructures 54, while the first nanostructures 52, the substrate 50, the STI regions 68 remain relatively unetched as compared to the second nanostructures 54. In embodiments in which the second nanostructures 54 include, e.g., SiGe, and the first nanostructures 52 include, e.g., Si or SiC, hydrogen fluoride, another fluorine-based etchant, or the like may be used to remove the second nanostructures 54 in the p-type region 50P.

In other embodiments, the channel regions in the n-type region 50N and the p-type region 50P may be formed simultaneously, for example by removing the first nanostructures 52 in both the n-type region 50N and the p-type region 50P or by removing the second nanostructures 54 in both the n-type region 50N and the p-type region 50P. In such embodiments, channel regions of n-type nano-FETs and p-type nano-FETs may have a same material composition, such as silicon, silicon germanium, or the like. FIGS. 32A, 32B, and 32C illustrate a structure resulting from such embodiments where the channel regions in both the p-type region 50P and the n-type region 50N are provided by the second nanostructures 54 and comprise silicon, for example.

Figure 25A:
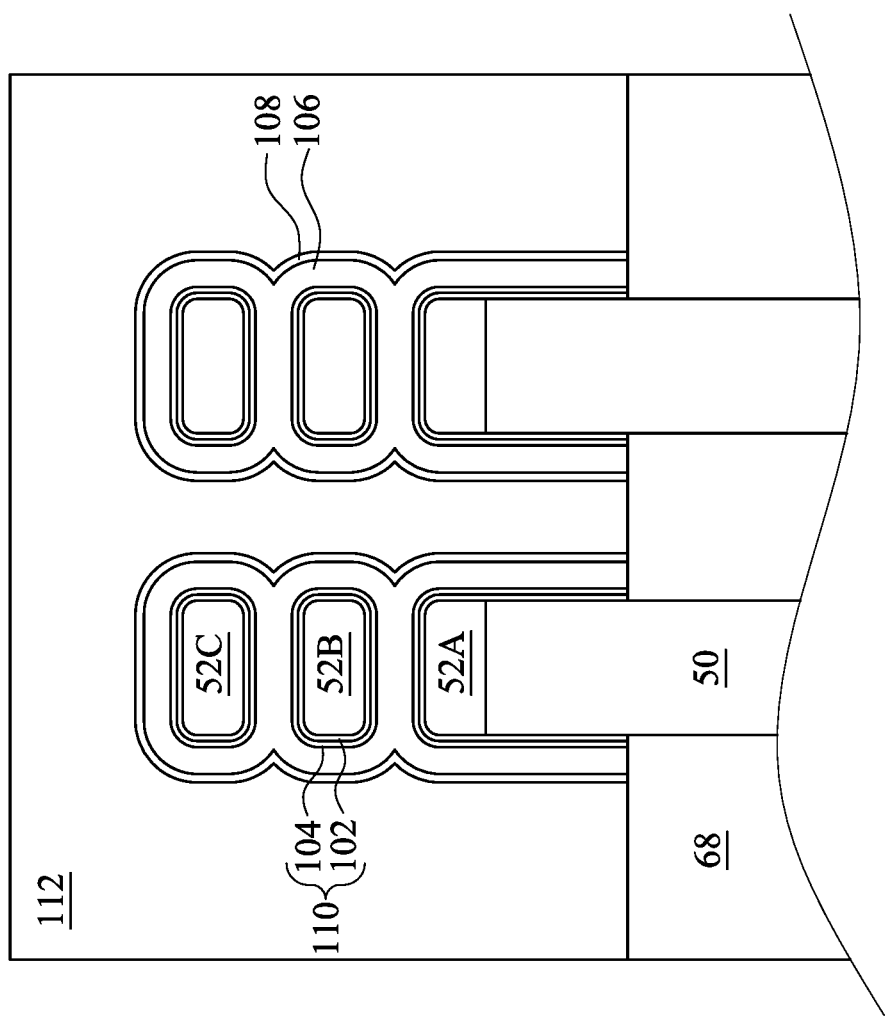
Figure 25B:
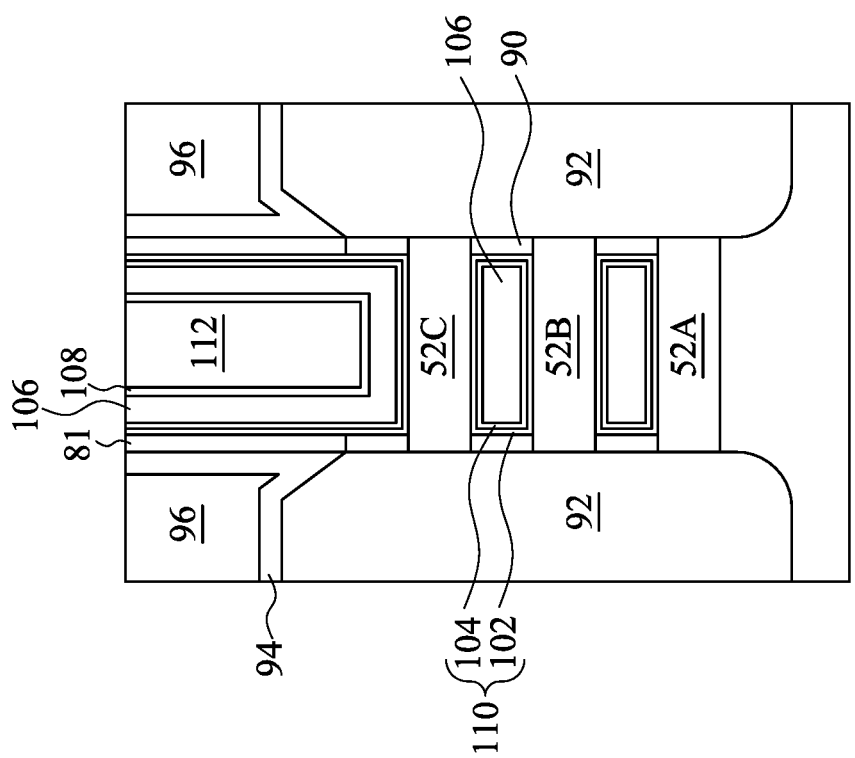
Figure 25D:
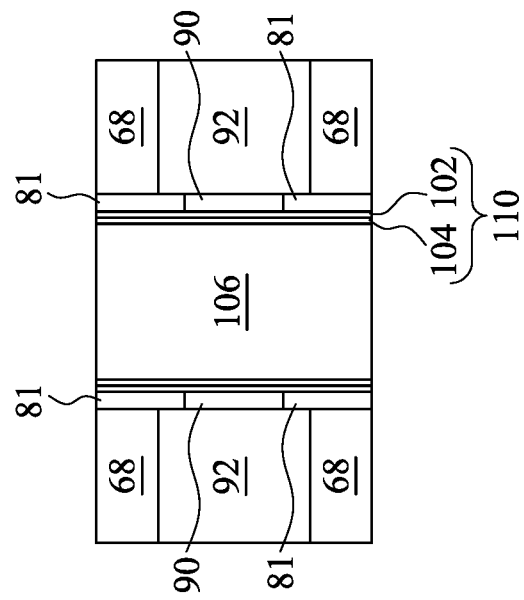
Figure 25C:
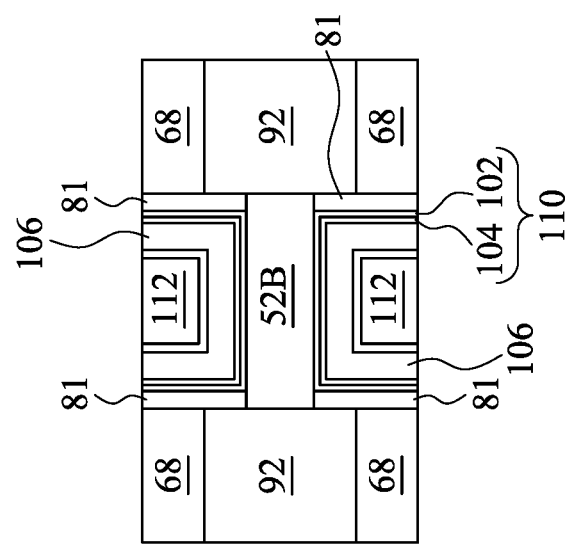
Figure 26A:
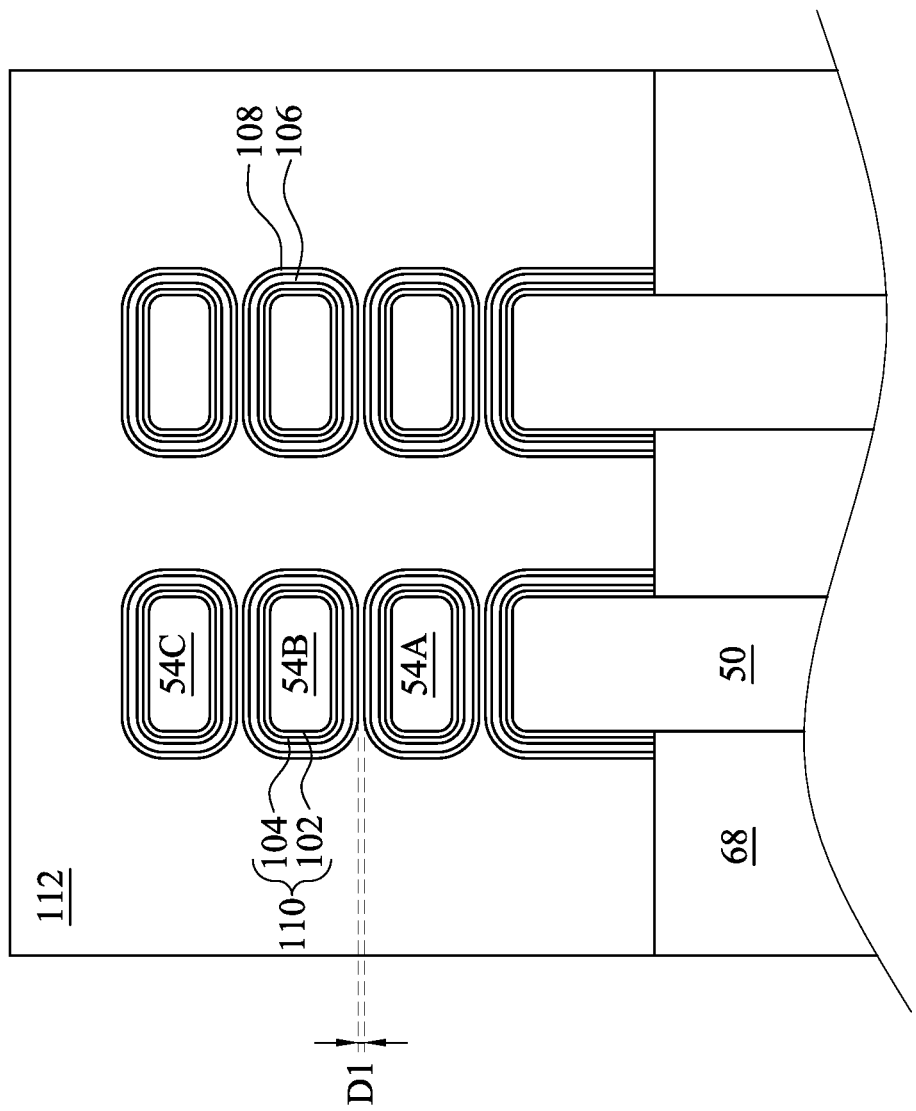
Figure 26B:
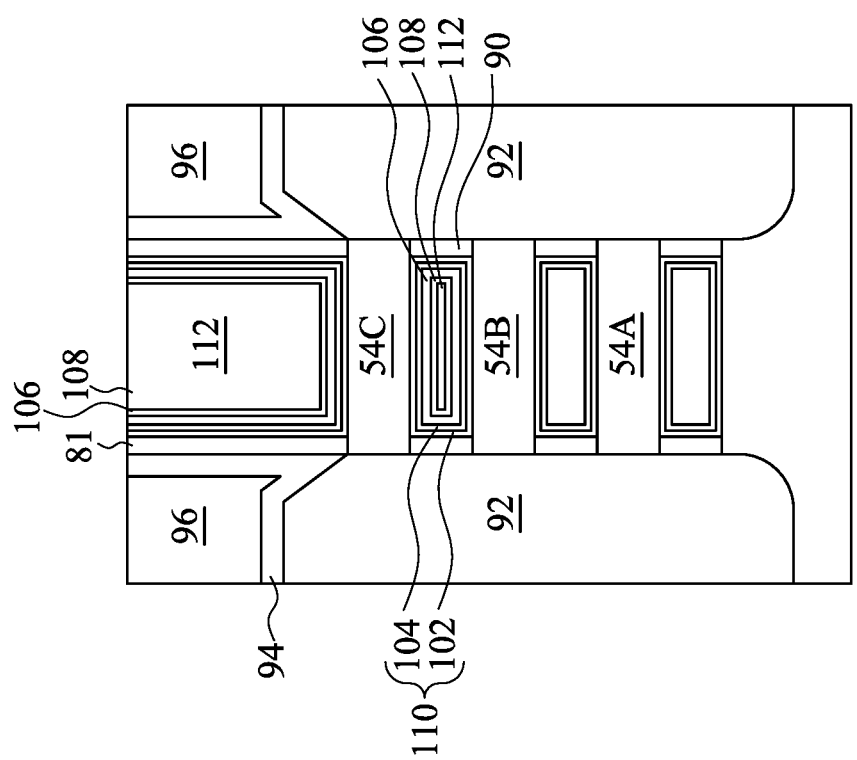
Figure 26C:
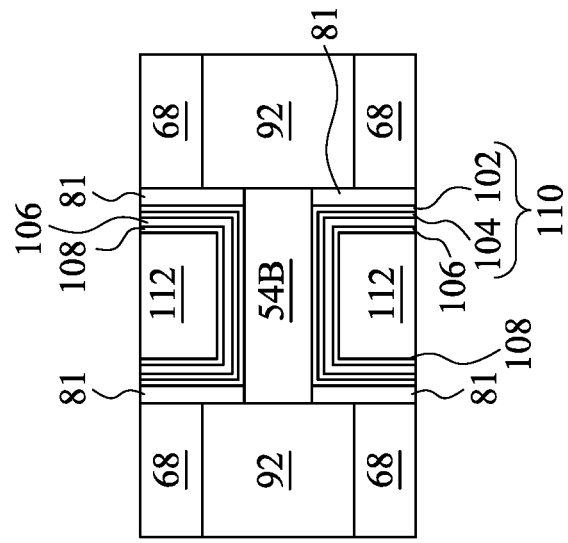
Figure 26D:
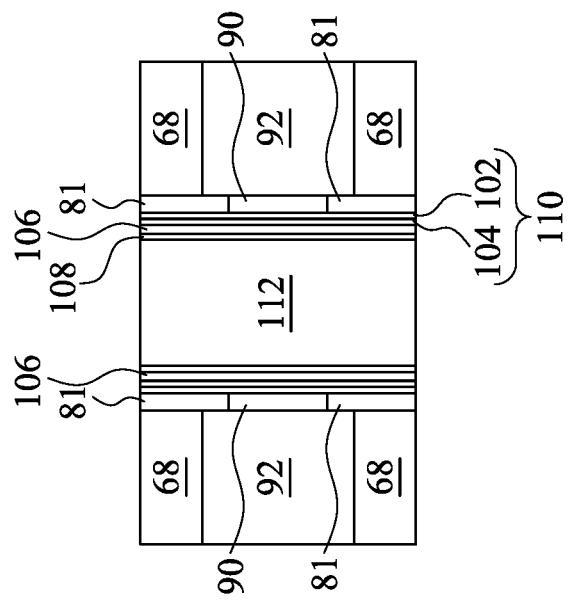
Figure 27A:
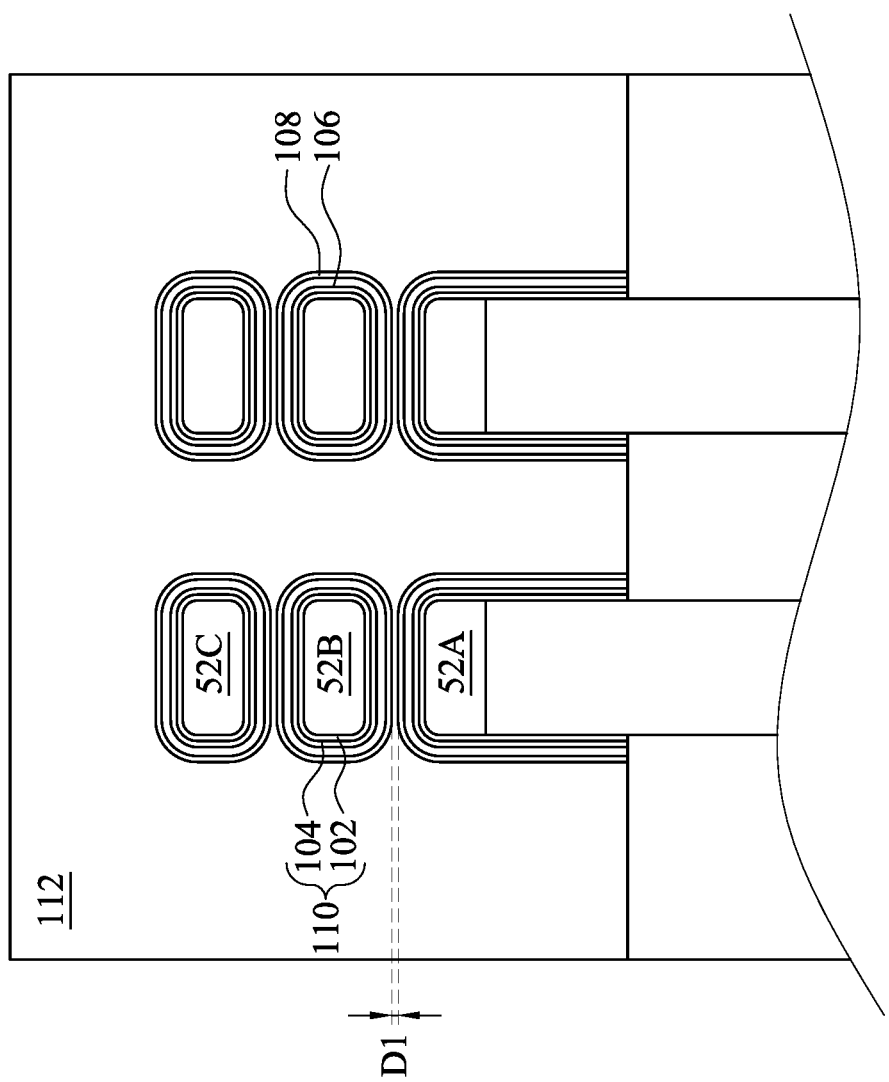
Figure 27B:
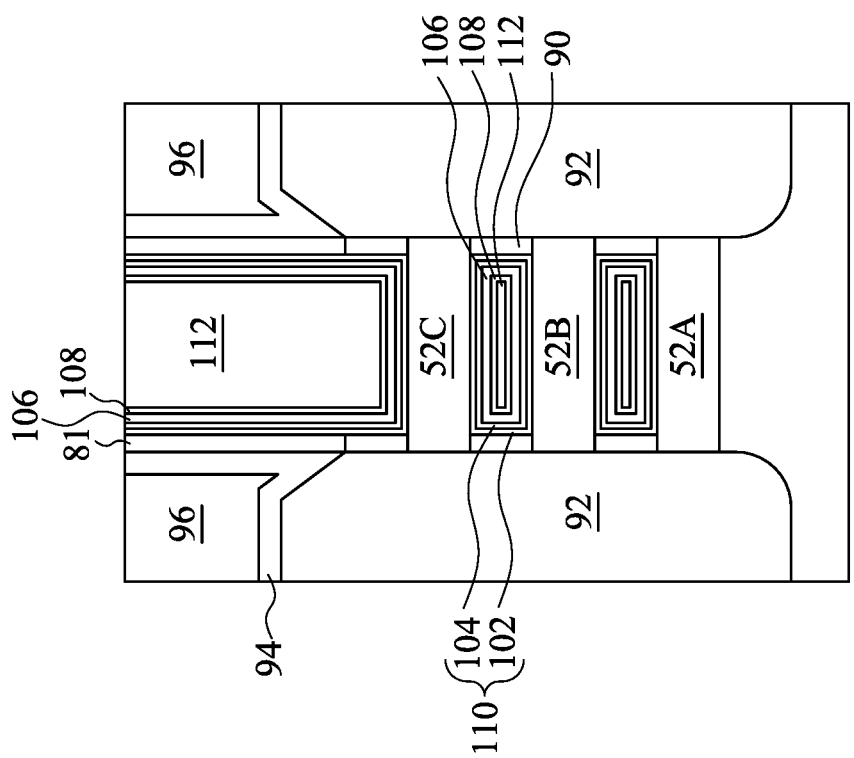
Figure 27C:
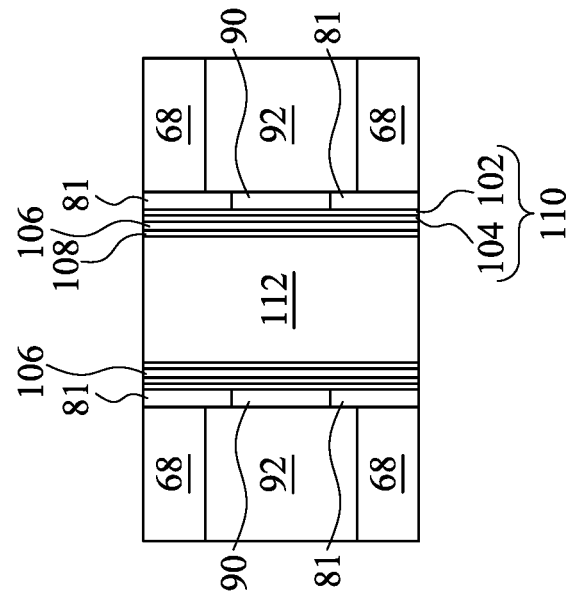
Figure 27D:
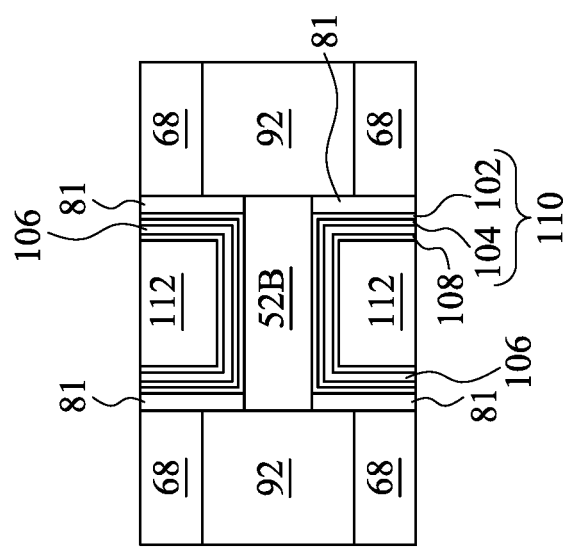

In FIGS. 17A, 17B, 17C, and 17D through FIGS. 27A, 27B, 27C, and 27D a gate formation process is illustrated as described below. FIGS. 17A, 17B, 17C, 17D, 18A, 18B, 18C, 18D, 19A, 19B, 19C, 19D, 20A, 20B, 20C, 20D, 23A, 23B, 23C, 23D, 24A, 24B, 24C, 24D, 25A, 25B, 25C, 25D, 26A, 26B, 26C, 26D, 27A, 27B, 27C, and 27D each illustrate intermediate views of the gate formation process. FIGS. 17A, 18A, 19A, 23A, 24A, and 26A illustrate expanded views of the dashed box in the n-type region 50N of FIG. 16A. FIGS. 25A and 27A illustrate expanded views of the dashed box in the p-type region 50P of FIG. 16A. FIGS. 17B, 18B, 19B, 23B, 24B, and 26B illustrate expanded views of the dashed box in the n-type region 50N of FIG. 16B. FIGS. 25B and 27B illustrate expanded views of the dashed box in the p-type region 50P of FIG. 16B. FIGS. 17C, 18C, 19C, 23C, 24C, and 26C illustrate views of a horizontal cross section between second nanostructures 54B and 54A along the line D-D' of FIG. 1. FIGS. 17D, 18D, 19D, 23D, 24D, and 26D illustrate views of a horizontal cross section through the second nanostructure 54B along the line E-E' of FIG. 1. FIGS. 25C and 27C illustrate views of a horizontal cross section through the nanostructure 52B along the line D-D' of FIG. 1. FIGS. 25D and 27D illustrate views of a horizontal cross section between nanostructures 52B and 52A along the line E-E' of FIG. 1. FIG. 21 illustrates an electroless plating bath and FIGS. 22A, 22B, 22C, and 22D illustrate an electroless plating process for filling an opening.

Referring to FIGS. 17A, 17B, 17C, and 17D, once the first nanostructures 52 are removed from the n-type region 50N and/or the second nanostructures 54 are removed from the p-type region 50P, a process to form replacement gates including gate dielectric layers no, work function layers 106, and gate electrode fill 112 is begun by depositing a series of layers in the second recesses 98. In an embodiment, the series of layers for the gate dielectric layers no may include an interfacial layer 102 and a dielectric layer 104. A series of layers for the work function layers 106 may include a stack of one or more layers of work function metals and any intermediate layers deposited between the work function metals. A gate electrode fill 112 may then fill in the rest of the second recesses 98. The gate electrode may be considered to include the work function layers 106 and the gate electrode fill 112. In the n-type region 50N, the gate dielectric layers 110 may be conformally formed on top surfaces and sidewalls of the substrate 50 and on top surfaces, sidewalls, and bottom surfaces of the second nanostructures 54, and in the p-type region 50P, the gate dielectric layers no may be conformally formed on top surfaces and sidewalls of the substrate 50 and on top surfaces, sidewalls, and bottom surfaces of the first nanostructures 52. The gate dielectric layers no may also be deposited on top surfaces of the first ILD 96, the CESL 94, the first spacers 81, and the STI regions 68.

In some embodiments, the interfacial layer 102 may be a material such as silicon dioxide formed through a process such as in situ steam generation (ISSG), though other processes may be used. In other embodiments, the interfacial layer 102 may include a high-k dielectric material, and in these embodiments, the interfacial layer 102 may have a k value greater than about 7.0, and may include a metal oxide or a silicate of hafnium, aluminum, zirconium, lanthanum, manganese, barium, titanium, lead, and combinations thereof, such as $HfO_2$, HfSiO, HfSiON, HfTaO, HfTiO, HfZrO, LaO, ZrO, $Ta_2O_5$, conformally deposited in the second recess 98 to a thickness of between about 5 Å and about 20 Å, although any suitable deposition process or thickness may be used. The interfacial layer 102 may be deposited using any suitable process such as by molecular-beam deposition (MBD), ALD, PECVD, the like, or combinations thereof. However, any suitable material, process of formation, or thickness may be utilized for the interfacial layer 102.

Referring to FIGS. 18A, 18B, 18C, and 18D, once the interfacial layer 102 is formed, the dielectric layer 104 may be formed over the interfacial layer 102. In an embodiment the material of the dielectric layer 104 is a high-k material, and may include a metal oxide or a silicate of hafnium, aluminum, zirconium, lanthanum, manganese, barium, titanium, lead, and combinations thereof, such as $HfO_2$, HfSiO, HfSiON, HfTaO, HfTiO, HfZrO, LaO, ZrO, $Ta_2O_5$, conformally deposited in the second recess 98 on the interfacial layer 102 to a thickness of between about 5 Å and about 100 Å, although any suitable deposition process or thickness may be used. The interfacial layer 102 may be deposited using any suitable process such as by MBD, ALD, PECVD, the like, or combinations thereof. However, any suitable material, process of formation, or thickness may be utilized for the dielectric layer 104. The structure of the gate dielectric layers no may be the same or different in the n-type region 50N and the p-type region 50P.

Referring to FIGS. 19A, 19B, 19C, and 19D, the work function layers 106 may be formed in the second recess 98 over the dielectric layer 104. The work function layers 106 may include any number of liner layers and any number of work function tuning layers. For example, in some embodiments, the work function layers 106 may include a barrier layer deposited on the gate dielectric layers no. In such embodiments, the barrier layer may be formed from a metallic material such as TaN, Ti, TiAlN, TaC, TaCN, TaSiN, Mn, Zr, TiN, Ru, Mo, WN, other metal oxides, metal nitrides, metal silicates, transition metal-oxides, transition metal-nitrides, transition metal-silicates, oxynitrides of metals, metal aluminates, zirconium silicate, zirconium aluminate, combinations of these, or the like. The barrier layer may be deposited using a deposition process such as MBD, ALD, PECVD, the like, or combinations thereof, to thickness between about 5 Å and about 100 Å, although any suitable deposition process or thickness may be used.

The work function layers 106 may also include work function tuning layers, such as a p-metal work function tuning layer which may be deposited over the barrier layer (if used) and over gate dielectric layers no. In some embodiments, the material of the p-metal work function tuning layer may include a tungsten based metal like tungsten, tungsten nitride ($WN_x$), tungsten carbide nitride ($WC_xN_y$), tungsten oxide ($WO_x$), combinations of these, or the like. In another embodiment, the p-metal work function tuning layer may be a molybdenum based metal such as molybdenum, molybdenum nitride ($MoN_x$), combinations of these, or the like. In still another embodiment, the p-metal work function tuning layer may be a material such as titanium nitride (TiN). In yet another embodiment, the p-metal work function tuning layer may be a material such as gold, platinum, palladium, combinations of these, or the like. However, any suitable material may be utilized. Additionally, the p-metal work function tuning layer may be deposited using a deposition process such as MBD, ALD, PECVD, or the like, to a thickness between about 5 Å and about 100 Å, although any suitable deposition process or thickness may be used.

The work function layers 106 may also include, for example, an n-metal work function tuning layer which may be deposited over the barrier layer (if used) and over gate dielectric layers no. In some embodiments, the n-metal work function tuning layer may be a material such as Ti, Ag, Al, TaAl, TaAlC, TiAlN, TaC, TaCN, TaSiN, Mn, Zr, other suitable n-type work function materials, or combinations thereof. Additionally, the n-metal work function tuning layer may be deposited using a deposition process such as MBD, ALD, PECVD, or the like, to a thickness between about 10 Å and about 40 Å, although any suitable deposition process or thickness may be used.

Figure 19B:
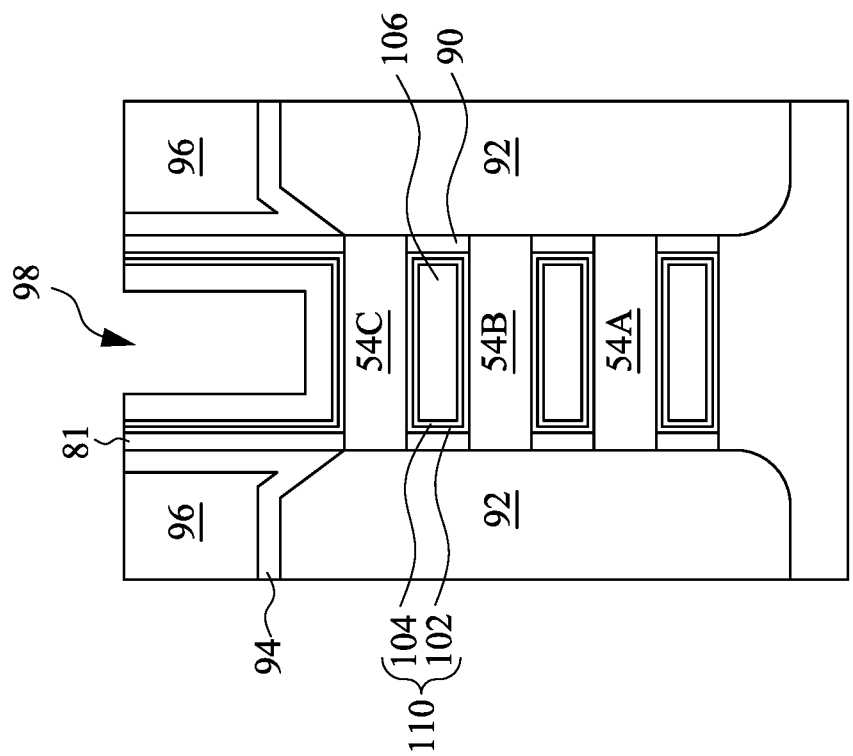
Figure 19D:
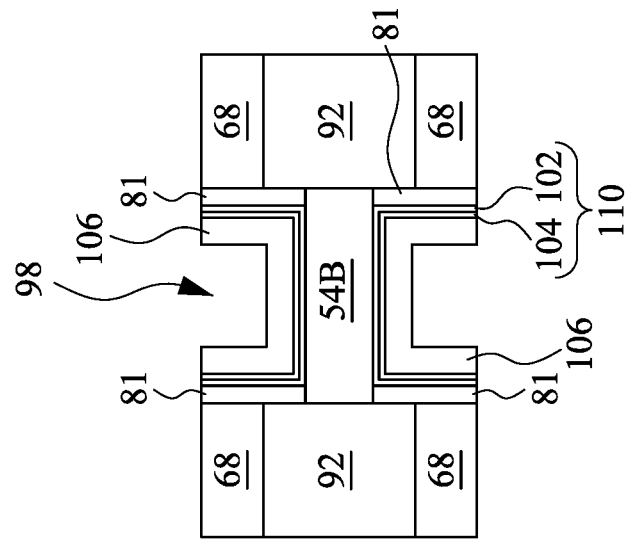
Figure 19C:
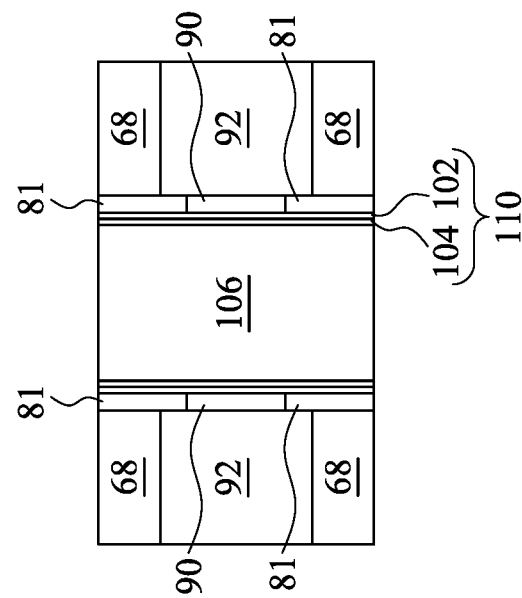
Figure 20A:
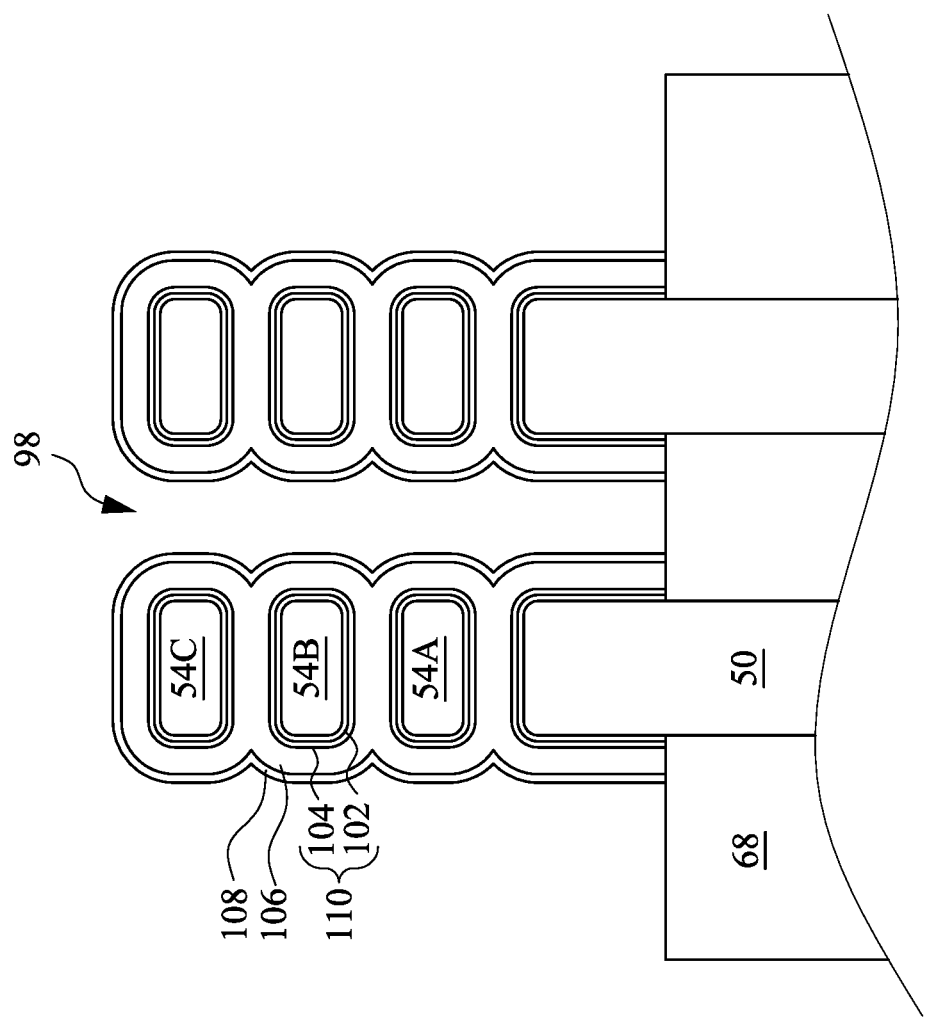
Figure 20B:
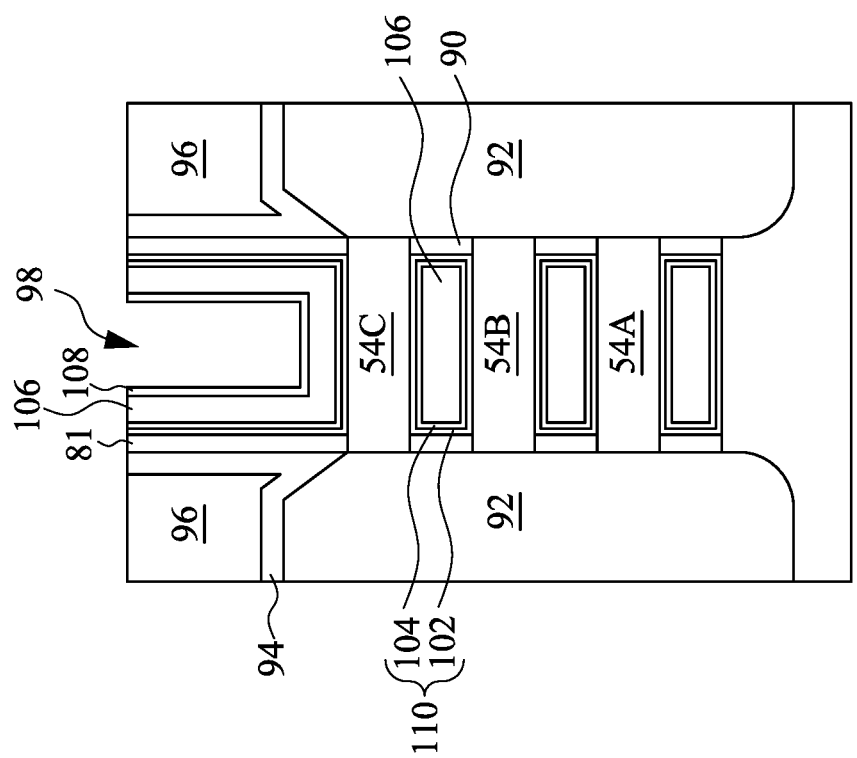
Figure 20D:
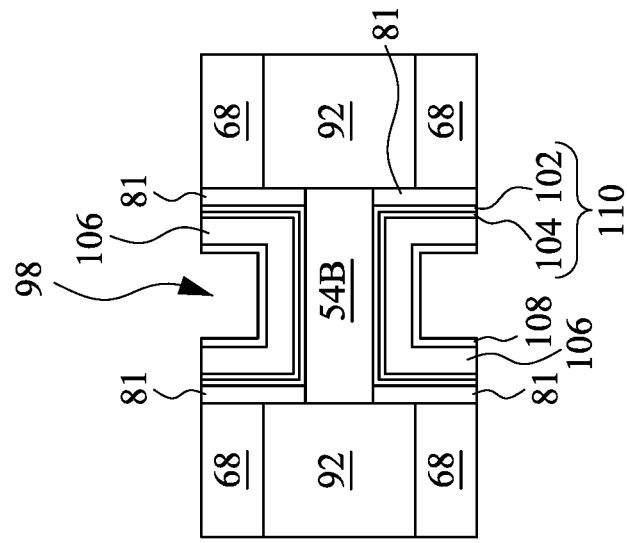
Figure 20C:
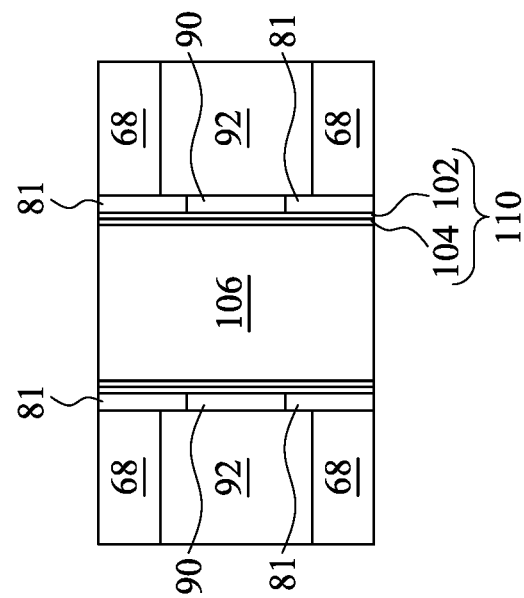

Embodiments may utilize multiple work function tuning layers including one or more p-metal work function tuning layers and/or one or more n-metal work function tuning layers as described above deposited in any order. In some embodiments, the work function layers 106 may merge together between the second nanostructures 54, such as illustrated in FIGS. 19A, 19B, and 19C. In other embodiments, the work function layer 106 may remain distinctly wrapped around each of the second nanostructures 54, such as illustrated in FIGS. 26A, 26B, and 26C, discussed below.

In FIGS. 20A, 20B, 20C, and 20D, a glue layer 108 is deposited over the work function layers 106. The glue layer 108 may formed in order to help adhere the overlying gate electrode fill 112 with the underlying work function layers 106 as well as provide a nucleation layer for the formation of the gate electrode fill 112. In an embodiment the glue layer 108 may be a material such as titanium nitride or else may be a material similar to the n-metal work function tuning layer (described above) and may be formed using a similar process such as MBE, ALD, or PECVD to a thickness between about 10 Å and about 50 Å, although any suitable deposition process or thickness may be used. However, any suitable materials and processes may be utilized.

FIGS. 21 and 22A, 22B, 22C, and 22D illustrate an electroless plating (or electro-chemical plating) bath and an electroless plating process for filling an opening, such as the remainder of the second recesses 98 after deposition of the glue layer 108. The process will be discussed in detail here which is then applied to the second recesses 98, as illustrated with respect to FIGS. 23A, 23B, 23C, and 23D.

FIG. 21 illustrates an electro-chemical bath 140. The electro-chemical bath 140 includes an aqueous plating solution 138 that contains metal ions 134 of a source material and a chemical reducing agent 136 which acts as a catalyst for reducing the metal ions 134. The deposition of the metal can be represented by the following equation:

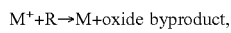

where $M^+$ represents the metal ions 134 of the source metal to be deposited and R is the reducing agent 136 (source of electrons). Additives are added to the electro-chemical bath 140 which include accelerators 132 and suppressors 130. Accelerators 132 are small molecules which have faster diffusion to the bottom of the opening to be filled and promote bottom up deposition. Suppressors 130 are large molecules which accumulate at the sidewalls of the opening to be filled, which slow down the plating deposit rate.

FIGS. 22A through 22D illustrate an example plating process to fill an opening 153 in a surrounding material 150 using a bottom up fill process. Rather than deposit material on the exposed surfaces in conformal layers, a bottom up fill process deposits material in layers that have a much thicker deposition at the bottom of an opening or recess than at the sidewalls of the opening or recess. For high-aspect ratio openings (i.e., openings having a much greater height than width), a bottom up deposition rather than a traditional deposition helps to reduce or eliminate voids from forming within the deposition. This deposition effect may be accomplished by depositing material and then performing an etch back using a fluorine containing etchant to remove material at the top the opening at a greater rate than the material at the bottom of the opening. In the process described, below, however, accelerators and suppressors are used in the electrochemical bath to achieve a bottom up deposition without the need to perform etch-back processes. In FIGS. 22A through 22D, the surrounding material 150 may include an insulating material and the opening 153 may be lined with any number of liner layers, such as a barrier layer and an adhesion layer or glue layer, which are considered part of the surrounding material 150, in this example. The opening 153 may, for example, correspond to the second recess 98 (see, e.g., FIGS. 20A, 20B, 20C, and 20D).

Figure 22D:
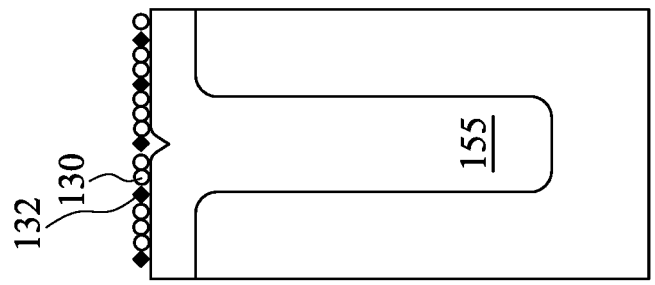
FIGS. 22A, 22B, 22C, and 22D illustrate various cross-sectional views of intermediate stages of a plating process, in accordance with some embodiments.
Figure 22C:
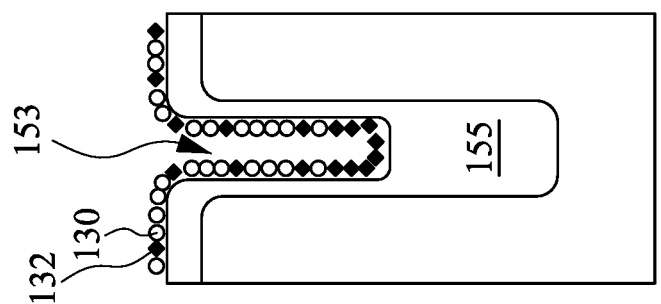
Figure 22B:
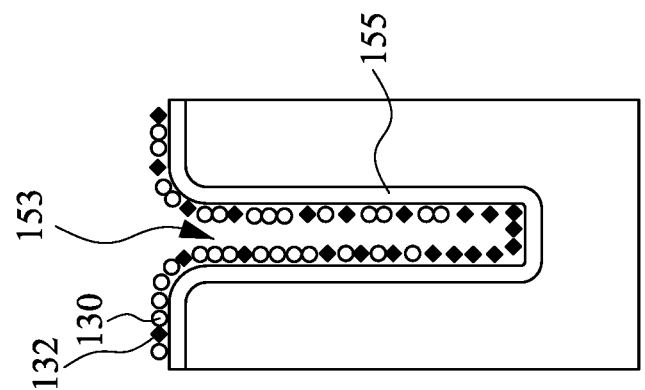
Figure 22A:
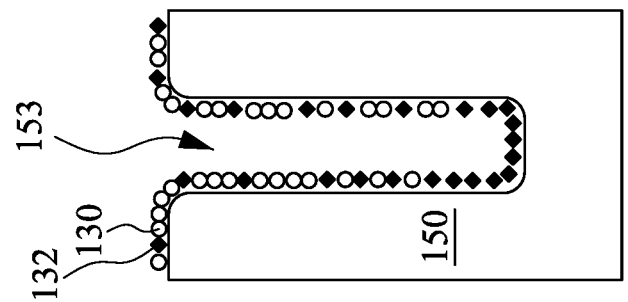
Figure 23A:
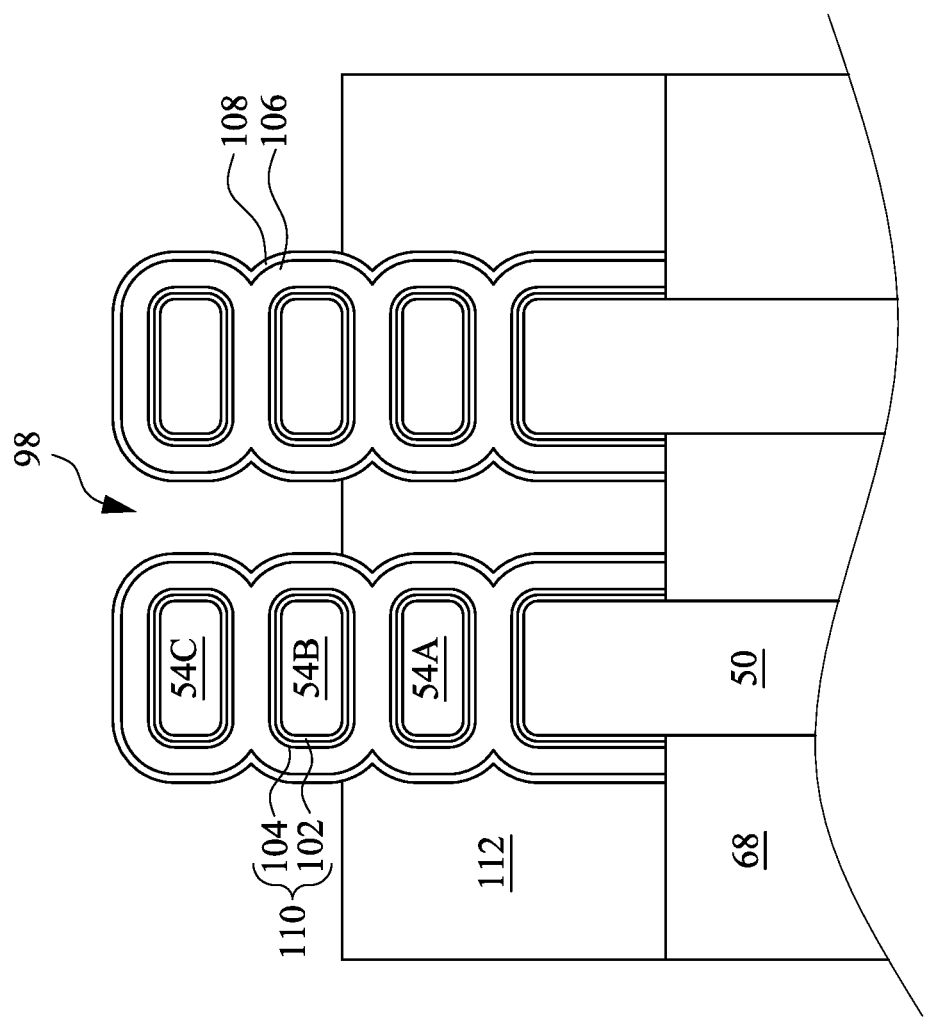
Figure 23B:
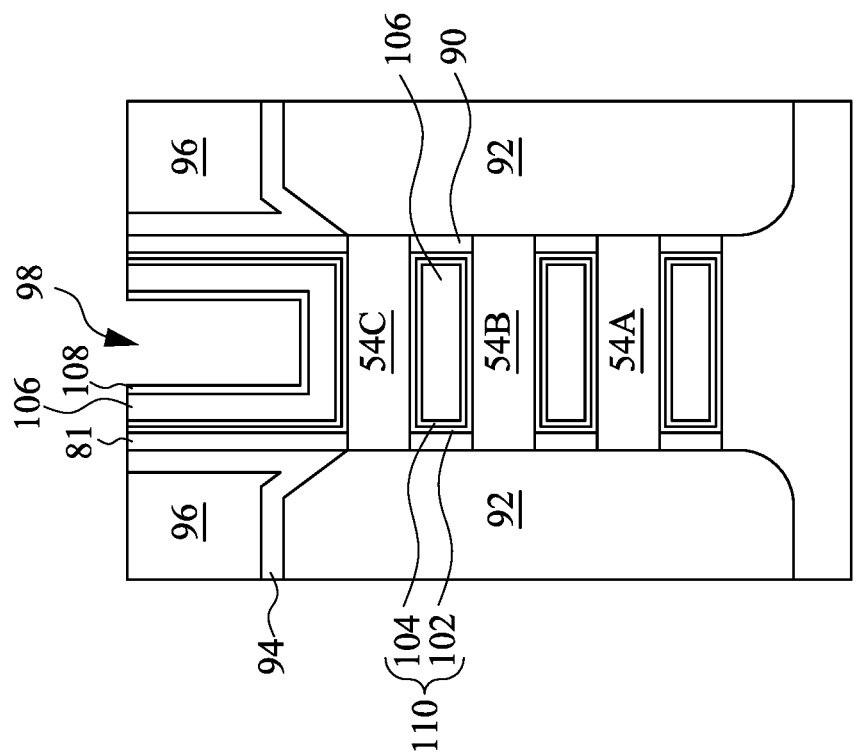
Figure 23D:
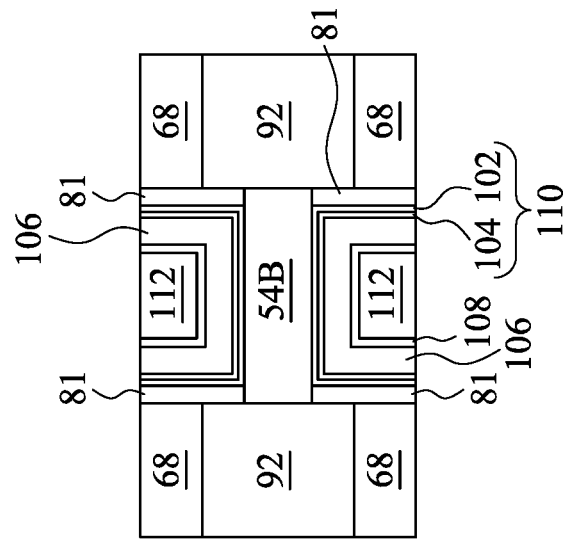
Figure 23C:
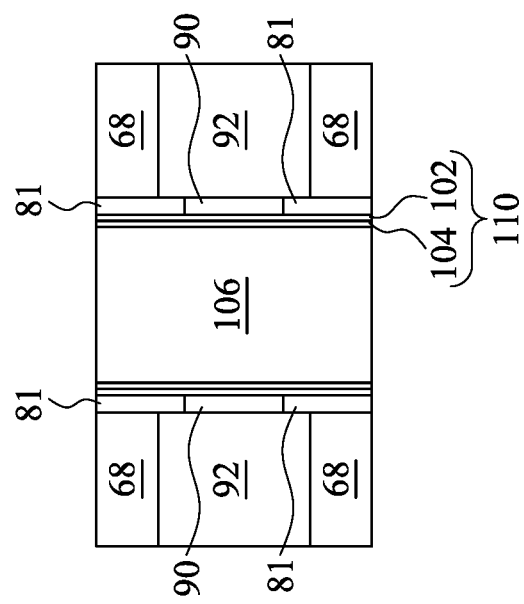
Figure 24A:
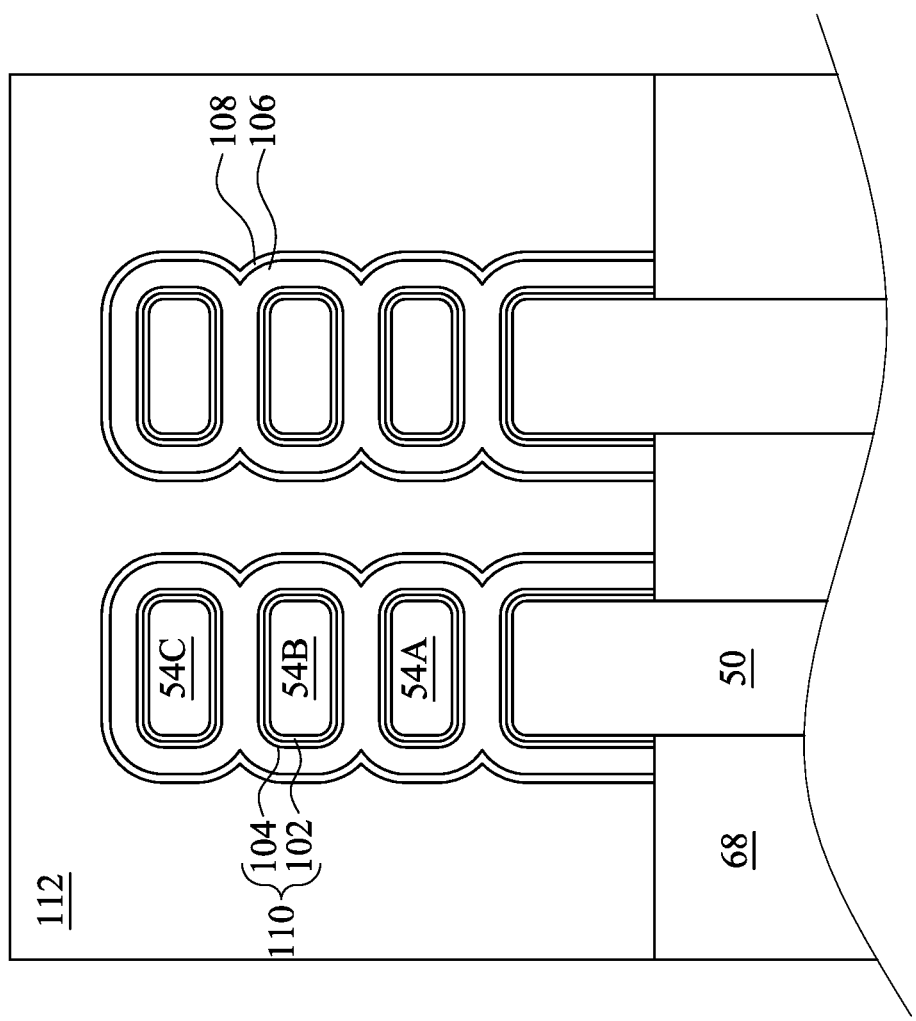
Figure 24B:
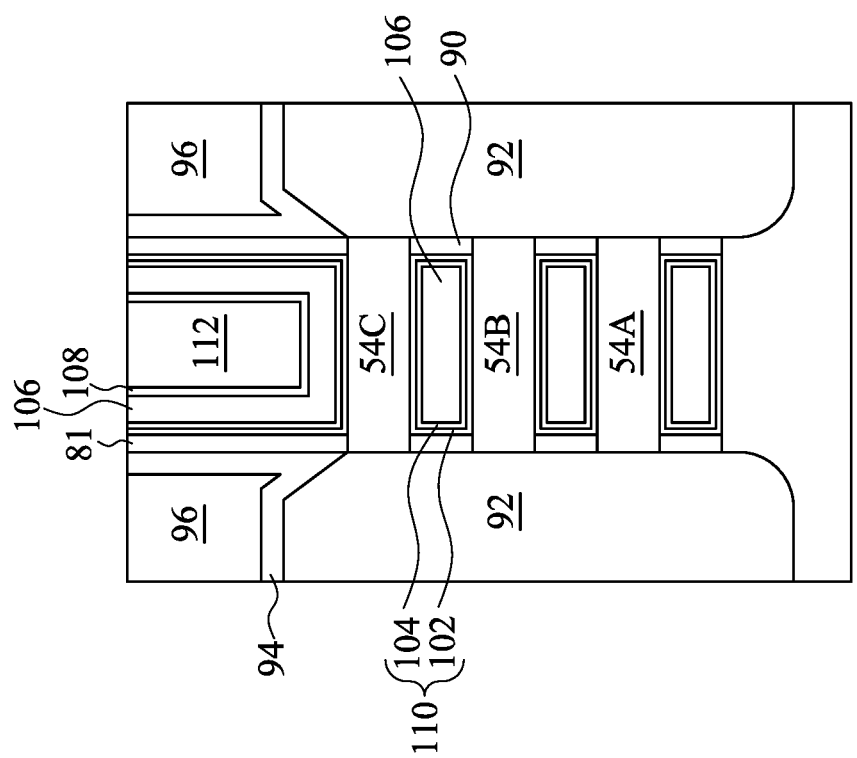
Figure 24D:
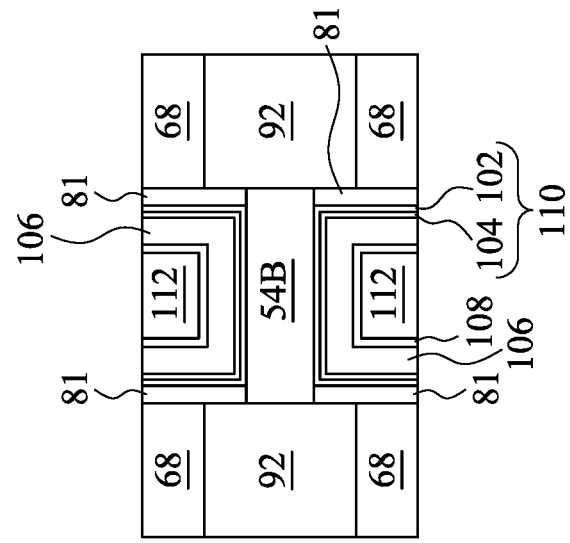
Figure 24C:
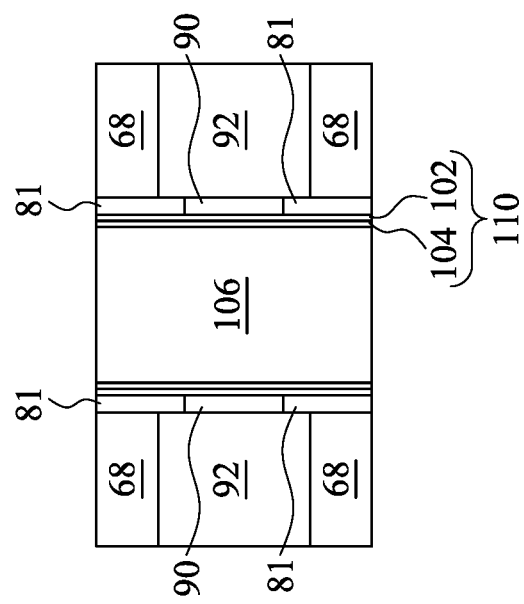

In FIG. 22A, the opening is submerged into an electrochemical bath, such as the electro-chemical bath 140. The accelerators 132 diffuse more easily to the bottom of the opening 153 and the suppressors 130 accumulate more on the sidewalls of the opening 153, though some of the accelerators 132 may also be present on the sidewalls. For example a ratio of accelerators 132 to suppressors 130 at the bottom of the opening 153 may be between 10:1 to 100:1. A ratio of the suppressors 130 to the accelerators 132 on the sidewalls of the opening (at a midpoint between the top of the opening 153 and the bottom of the opening 153) may be between 10:1 to 50:1.

In some embodiments, the plating solution 138 may utilize bis(3-sulfopropyl)disulfide (SPS) as accelerators 132 and polyethylene glycol (PEG) as the suppressors 130, although other accelerators and suppressors may be used. In one example, the concentration of the SPS may be between about 0.0001 weight percent and about 0.001 weight percent, and the concentration of the PEG may be between about 0.0001 weight percent and about 0.001 weight percent. In some embodiments, the ratio of accelerators 132 and suppressors 130 may be between 10:1 and 1:10, such as between 5:1 and 1:5 or between 2:1 and 1:2. The plating may be performed with the plating solution being at a temperature between about 10° C. and about 50° C. The duration of the electrochemical plating may be between about 10 minutes and about 4 hours. By using the appropriate accelerators 132 and suppressors 130 with appropriate concentrations, the accelerators 132 may be accumulated at the bottom of the opening 153 (see FIGS. 22A through 22C), while the sidewalls of the opening 135 are dominated by the suppressors 130. Accordingly, more plating occurs at the bottom of the openings 135, while the plating on the sidewalls of the opening 135 is suppressed.

The metal used for the metal fill 155 may be a metal ion (e.g., metal ion 134) or metal salt of a conductive material such as Al, Cu, W, Ti, Ta, Mn, Zr, Co, Ni, combinations of these, or the like, and may be combined with other materials to result in the deposition of Al, Cu, AlCu, W, Ti, TiAlN, TaC, TaCN, TaSiN, Mn, Zr, TiN, Ta, TaN, Co, Ni, combinations of these, or the like. The reducing agent 136 used to react with the metal to produce the metal fill 155 may include, for example, $NH_3$, $H_2$, $SiH_4$, the like, or combinations thereof.

In FIG. 22B, the metal ions (e.g., metal ions 134) react with the reducing agent (e.g., reducing agent 136), thereby forming a metal fill 155 in the opening 153. Due to the suppressors 130 on the sidewalls of the opening 153 and the accelerators 132 at the bottom of the opening 153 and in the corners where the bottom of the opening 153 meets the sidewalls of the opening 153, the deposition rate of the metal fill 155 is greater at the bottom of the opening 153 than at the sides of the opening 153. In some embodiments, the deposition rate at the bottom of the opening 153 may be 5 to 50 times greater than the deposition rate at the sidewalls of the opening 153. The metal fill 155 includes the metal which is formed when the metal ions or salt react with the reducing agent 136. The metal fill 155 may also include some of the oxidized byproducts from the reaction, unreacted metal ions 134, unreacted reducing agent 136, the accelerators 132, and/or the suppressors 130 which may become embedded in and interspersed among the metal deposition. The oxidized byproduct may include, for example a metal oxide of the metal ion 134, an oxidation of one or more elements of the reducing agent 136, an oxidation of one or more elements of the accelerators 132, and/or an oxidation of one or more elements of the suppressors 130. Because an etch-back process is not used to form the metal fill 155, however, the metal fill 155 may be free from fluorine.

In FIG. 22C, the deposition of the metal fill 155 continues in a bottom up fashion, so that the bottom of the opening 153 is filled quicker than the sidewalls of the opening 153.

In FIG. 22D, the deposition of the metal fill 155 is complete and a bottom up void free metal fill 155 is formed in the opening in the surrounding material 150. Subsequent processes may include planarizing the metal fill 155 to remove the excess material deposited over the surrounding material 150.

FIGS. 23A, 23B, 23C, and 23D illustrate views of the formation of the gate electrode fill 112 at an intermediate point of the electroless plating process used to fill the remainder of the second recesses 98. As indicated in FIGS. 23A, 23B, 23C, and 23D (in particular 23A), the gate electrode fill 112 is provided using a bottom up electroless plating process as explained above with respect to FIGS. 21, 22A, 22B, 22C, and 22D, using suppressor and accelerator additives. This process provides for a seam free gate electrode fill 112.

The various layers of the work function layers 106 may cause the second recesses 98 to be difficult to fill using other processes, like an ALD/CVD process, without causing voids or seams to form around the irregular shapes of the work function layers 106. Also, the overall height to width aspect ratio of the second recesses 98 in the FIG. 23B may be between about 5:1 and 20:1, such as 10:1 and 20:1, after deposition of the work function layers 106. The high aspect ratio may make depositing the gate electrode fill 112 difficult using another process, such as an ALD/CVD process, at a sufficiently uniform rate so that the bottom of the second recesses 98 is filled with the gate electrode fill 112 before pinching off, leaving a void. The high aspect ratio would tend to cause the deposition rate at the bottom of the second recesses 98 to be less than the deposition rate toward the top of the second recesses 98. Using the bottom up gate electrode fill 112, however, advantageously provides a deposition rate which is much greater at the bottom of the second recesses 98 so that the second recesses 98 can be filled with the gate electrode fill 112 without voids or with a reduced number of voids.

Another advantage gained by using the electroless plating process described above with respect to FIGS. 21, 22A, 22B, 22C, and 22D includes the ability to have more flexibility in forming the work function layers 106. Because the gate electrode fill 112 is formed bottom up, the remainder of the second recesses 98 around the work function layers 106 may be quite small and yet a voidless fill is obtained for the gate electrode fill 112. For example, the remaining widths of the second recesses 98 around the work function layers 106 which surround the second nanostructures 54 may be between about 5 Å and about 30 Å, depending on the design of the work function layers 106. Because the electroless plating process used is able to fill such a small opening at a high aspect ratio, the design of the work function layers 106 is greatly flexible to provide work function tuning to achieve a wide variety of threshold voltages for the gate function.

FIGS. 24A, 24B, 24C, and 24D illustrate views of the formation of the gate electrode fill 112 after the electroless plating process is used to fill the remainder of the second recesses 98.

FIGS. 25A, 25B, 25C, and 25D illustrate views of the gate dielectric layers no, work function layers 106, glue layer 108, and gate electrode fill 112 in the p-type region 50P. These are deposited in the second recesses 98 and over and around the first nanostructures 52 in the p-type region 50P (see FIGS. 16A and 16B) using processes similar to those discussed above with respect to FIGS. 17A, 17B, 17C, 17D through 24A, 24B, 24C, and 24D, used in the n-type region 50N.

In some embodiments, the formation of the gate dielectric layers no in the n-type region 50N and the p-type region 50P may occur simultaneously such that the gate dielectric layers no in each region are formed from the same materials; the formation of the work function layers 106 may occur simultaneously such that the work function layers 106 are formed from the same materials; the formation of the glue layer 108 may occur simultaneously such that the glue layer 108 is formed from the same materials; and the formation of the gate electrode fill 112 may occur simultaneously such that the gate electrodes fill 112 in each region are formed from the same materials. In other embodiments, the gate dielectric layers no in each region may be formed by distinct processes, such that the gate dielectric layers no may be different materials and/or have a different number of layers; the work function layers 106 in each region may be formed by distinct processes, such that the work function layers 106 may be different materials and/or have a different number of layers; the glue layers 108 in each region may be formed by distinct processes, such that the glue layers 108 may be different materials and/or have a different number of layers; and/or the gate electrode fill 112 in each region may be formed by distinct processes, such that the gate electrode fill 112 may be different materials and/or have a different number of layers. Various masking steps may be used to mask and expose appropriate regions when using distinct processes. Any combination of the layers which make up the work function layers 106 and gate electrode fill 112 may be deposited in the n-type region 50N between adjacent ones of the second nanostructures 54 and between the second nanostructure 54A and the substrate 50, and may be deposited in the p-type region 50P between adjacent ones of the first nanostructures 52.

FIGS. 26A, 26B, 26C, and 26D illustrate views of the gate dielectric layers 110, work function layers 106, glue layer 108, and gate electrode fill 112 in the n-type region 50N. In the embodiment illustrated in FIGS. 26A, 26B, 26C, and 26D, however, the work function layers 106 do not merge between the second nanostructures 54 (e.g., between the second nanostructure 54A and the second nanostructure 54B). As such, the second recesses 98 include a small gap between the glue layer 108 of one of the second nanostructures 54 and another of the second nanostructures 54. The distance D1 between the two adjacent glue layers 108 may be between 2 Å and about 20 Å. Because the gate electrode fill 112 is formed using the electroless plating process described above with respect to FIGS. 21, 22A, 22B, 22C, and 22D, the gap between these adjacent glue layers 108 can be filled without creating a void between them. For example, because the accelerators 132 are smaller and denser than the suppressors 130, the accelerators 132 will more easily enter the gap between the adjacent glue layers 108 surrounding the second nanostructures 54 than the suppressors 130, thereby encouraging the gate electrode fill 112 to completely fill the gap.

FIGS. 27A, 27B, 27C, and 27D illustrate views of the gate dielectric layers 110, work function layers 106, glue layer 108, and gate electrode fill 112 in the p-type region 50P. In the embodiment illustrated in FIGS. 27A, 27B, 27C, and 27D, however, the work function layers 106 do not merge between the first nanostructures 52 (e.g., between the first nanostructure 52A and the first nanostructure 52B), similar to that illustrated FIGS. 26A, 26B, 26C, and 26D, with respect to the second nanostructures 54. As such, the second recesses 98 include a small gap between the glue layer 108 of one of the first nanostructures 52 and another of the first nanostructures 52. The distance D1 between the two adjacent glue layers 108 may be between 2 Å and about 20 Å. Because the gate electrode fill 112 is formed using the electroless plating process described above with respect to FIGS. 21, 22A, 22B, 22C, and 22D, the gap between these adjacent glue layers 108 can be filled without creating a void between them. For example, because the accelerators 132 are smaller and denser than the suppressors 130, the accelerators 132 will more easily enter the gap between the adjacent glue layers 108 surrounding the first nanostructures 52 than the suppressors 130, thereby encouraging the gate electrode fill 112 to completely fill the gap.

FIGS. 28A and 28B illustrate the n-type region 50N and p-type region 50P in a view similar to those illustrated in FIGS. 16A and 16B, after the gate dielectric layers no, work function layers 106, and gate electrode fill 112 have been deposited. It should be noted that the detail relating to the interfacial layer 102, dielectric layer 104, work function layers 106, and glue layer 108 have been omitted in the remaining Figures for simplicity. Instead, the gate dielectric layers no are illustrated and the gate electrode fill 112 is illustrated as representing the previously described additional layers. As illustrated in FIGS. 28A and 28B, the deposition of the gate dielectric layers no, work function layers 106, and the gate electrode fill 112 may over fill the second recesses 98 (see FIGS. 16A and 16B).

Figure 29B:
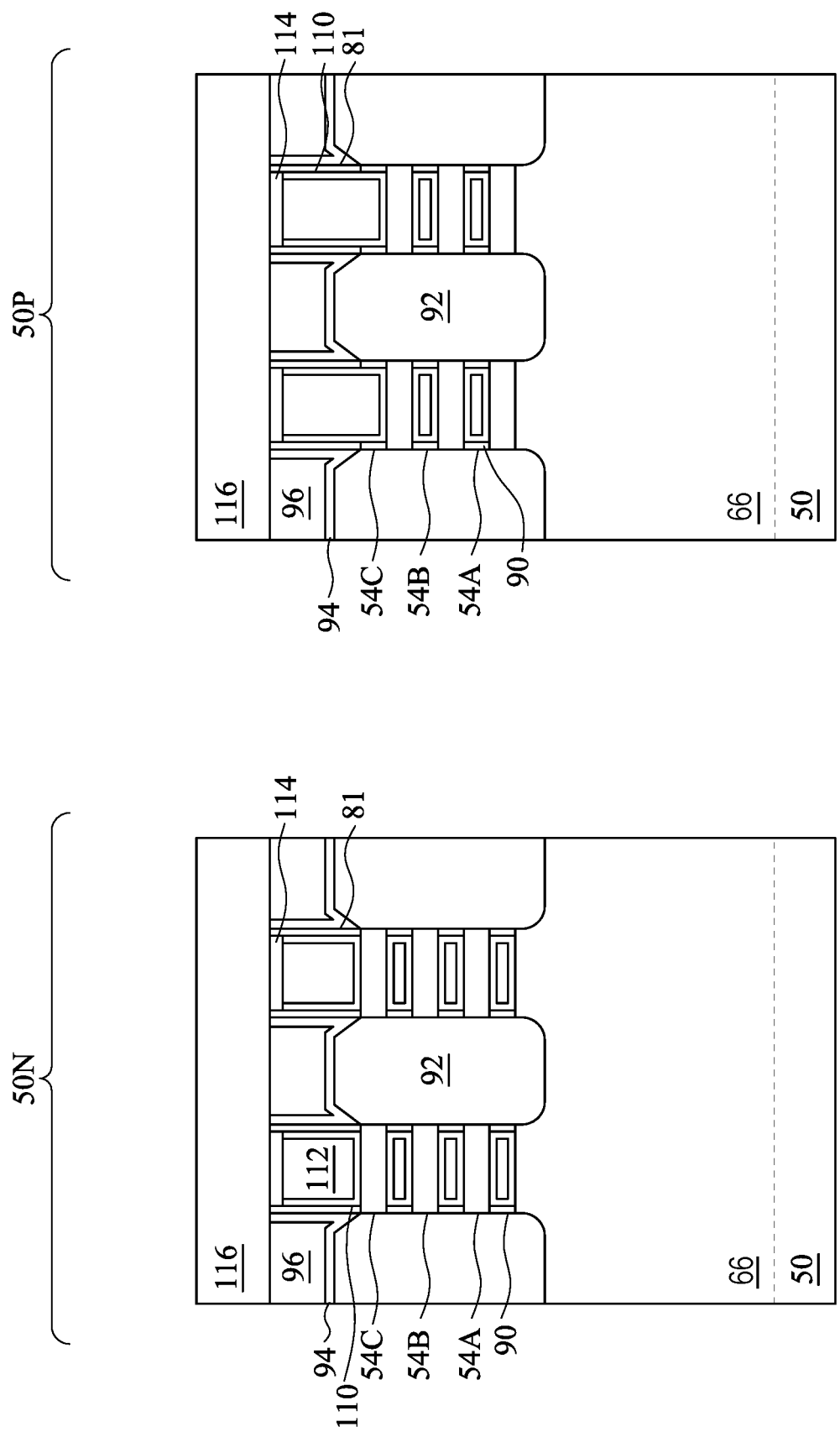
Figure 29C:
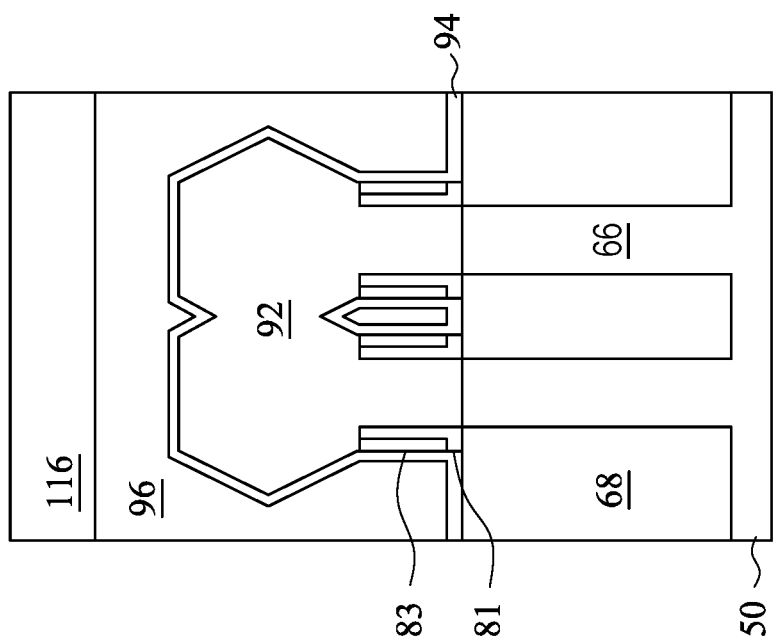

In FIGS. 29A, 29B, and 29C, after the filling of the second recesses 98, a planarization process, such as a CMP, may be performed to remove the excess portions of the gate dielectric layers no and the material of the gate electrode fill 112, which excess portions are over the top surface of the first ILD 96. The remaining portions of material of the gate electrode fill 112 and the gate dielectric layers 110 thus form replacement gate structures of the resulting nano-FETs. The gate electrode fill 112 and the gate dielectric layers no may be collectively referred to as "gate structures."

The gate structure (including the gate dielectric layers 110, the work function layers 106, and the corresponding overlying gate electrode fill 112) are recessed, so that a recess is formed directly over the gate structure and between opposing portions of first spacers 81. A gate mask 114 comprising one or more layers of dielectric material, such as silicon nitride, silicon oxynitride, or the like, is filled in the recess, followed by a planarization process to remove excess portions of the dielectric material extending over the first ILD 96. Subsequently formed gate contacts (such as the gate contacts 124, discussed below with respect to FIGS. 32A and 32B) penetrate through the gate mask 114 to contact the top surface of the recessed gate electrode fill 112.

As further illustrated by FIGS. 29A-29C, a second ILD 116 is deposited over the first ILD 96 and over the gate mask 114. In some embodiments, the second ILD 116 is a flowable film formed by FCVD. In some embodiments, the second ILD 116 is formed of a dielectric material such as PSG, BSG, BPSG, USG, or the like, and may b e deposited by any suitable method, such as CVD, PECVD, or the like.

Figure 30C:
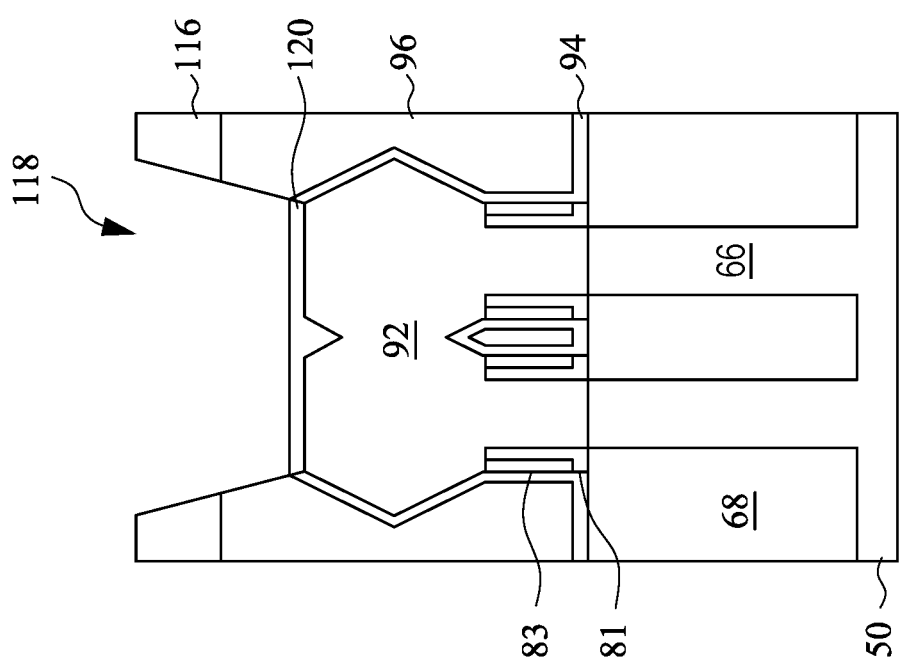

In FIGS. 30A-30C, the second ILD 116, the first ILD 96, the CESL 94, and the gate masks 114 are etched to form third recesses 118 exposing surfaces of the epitaxial source/drain regions 92 and/or the gate structure. The third recesses 118 may be formed by etching using an anisotropic etching process, such as RIE, NBE, or the like. In some embodiments, the third recesses 118 may be etched through the second ILD 116 and the first ILD 96 using a first etching process; may be etched through the gate masks 114 using a second etching process; and may then be etched through the CESL 94 using a third etching process. A mask, such as a photoresist, may be formed and patterned over the second ILD 116 to mask portions of the second ILD 116 from the first etching process and the second etching process. In some embodiments, the etching process may over-etch, and therefore, the third recesses 118 extend into the epitaxial source/drain regions 92 and/or the gate structure, and a bottom of the third recesses 118 may be level with (e.g., at a same level, or having a same distance from the substrate), or lower than (e.g., closer to the substrate) the epitaxial source/drain regions 92 and/or the gate structure. Although FIG. 30B illustrate the third recesses 118 as exposing the epitaxial source/drain regions 92 and the gate structure in a same cross section, in various embodiments, the epitaxial source/drain regions 92 and the gate structure may be exposed in different cross-sections, thereby reducing the risk of shorting subsequently formed contacts. After the third recesses 118 are formed, silicide regions 120 are formed over the epitaxial source/drain regions 92. In some embodiments, the silicide regions 120 are formed by first depositing a metal (not shown) capable of reacting with the semiconductor materials of the underlying epitaxial source/drain regions 92 (e.g., silicon, silicon germanium, germanium) to form silicide or germanide regions, such as nickel, cobalt, titanium, tantalum, platinum, tungsten, other noble metals, other refractory metals, rare earth metals or their alloys, over the exposed portions of the epitaxial source/drain regions 92, then performing a thermal anneal process to form the silicide regions 120. The un-reacted portions of the deposited metal are then removed, e.g., by an etching process. Although silicide regions 120 are referred to as silicide regions, silicide regions 120 may also be germanide regions, or silicon germanide regions (e.g., regions comprising silicide and germanide). In an embodiment, the silicide region 120 comprises TiSi, and has a thickness in a range between about 2 nm and about 10 nm.

Figure 31C:
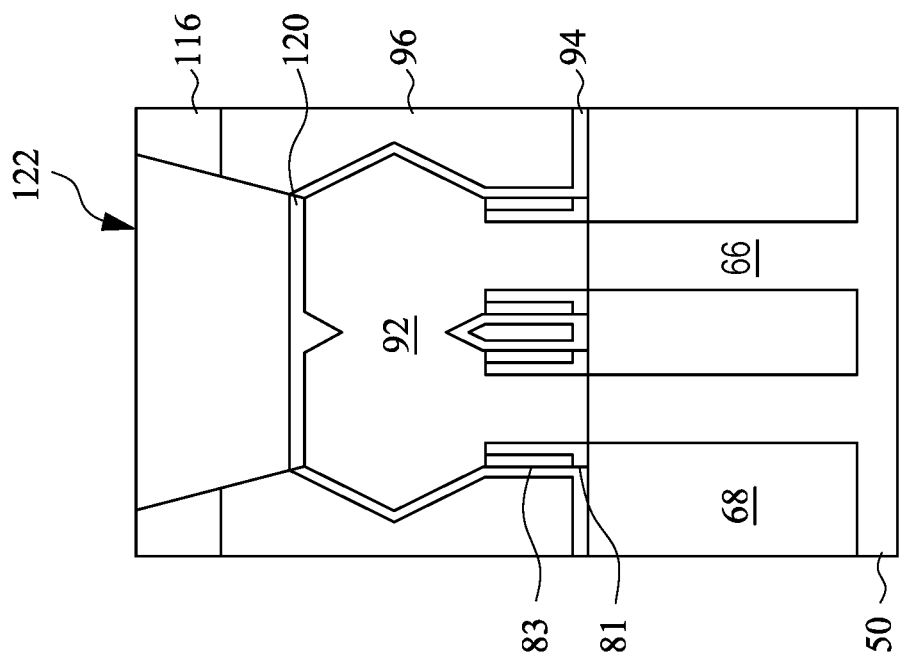

Next, in FIGS. 31A-31C, contacts 122 and 124 (may also be referred to as contact plugs) are formed in the third recesses 118. The contacts 122 and 124 may each comprise one or more layers, such as barrier layers, diffusion layers, and fill materials. For example, in some embodiments, the contacts 122 and 124 each include a barrier layer and a conductive material, and is electrically coupled to the underlying conductive feature (e.g., gate electrode fill 112 of the gate structure and/or silicide region 120 in the illustrated embodiment). The gate contacts 124 are electrically coupled to the gate electrode fill 112 and may be referred to as gate contacts, and the contacts 122 are electrically coupled to the silicide regions 120 and may be referred to as source/drain contacts. The barrier layer of the contacts 122/124 may include titanium, titanium nitride, tantalum, tantalum nitride, or the like. The conductive material of the contacts 122/124 may be copper, a copper alloy, silver, gold, tungsten, cobalt, aluminum, nickel, or the like. A planarization process, such as a CMP, may be performed to remove excess material from a surface of the second ILD 116.

FIGS. 32A-32C illustrate cross-sectional views of a device according to some alternative embodiments. FIG. 32A illustrates reference cross-section A-A' illustrated in FIG. 1. FIG. 32B illustrates reference cross-section B-B' illustrated in FIG. 1. FIG. 32C illustrates reference cross-section C-C' illustrated in FIG. 1. In FIGS. 32A-C, like reference numerals indicate like elements formed by like processes as the structure of FIGS. 31A-C. However, in FIGS. 32A-C, channel regions in the n-type region 50N and the p-type region 50P comprise a same material. For example, the second nanostructures 54, which comprise silicon, provide channel regions for p-type nano-FETs in the p-type region 50P and for n-type nano-FETs in the n-type region 50N. The structure of FIGS. 32A-C may be formed, for example, by removing the first nanostructures 52 from both the p-type region 50P and the n-type region 50N simultaneously; depositing the gate dielectric layers no and the gate electrodes 112P (e.g., work function layers 106 and gate electrode fill 112 suitable for a p-type NSFET) around the second nanostructures 54 in the p-type region 50P; and depositing the gate dielectric layers no and the gate electrodes 112N (e.g., work function layers 106 and gate electrode fill 112 suitable for a n-type NSFET) around the second nanostructures 54 in the n-type region 50N. In such embodiments, materials of the epitaxial source/drain regions 92 may be different in the n-type region 50N compared to the p-type region 50P as explained above.

Figure 33:
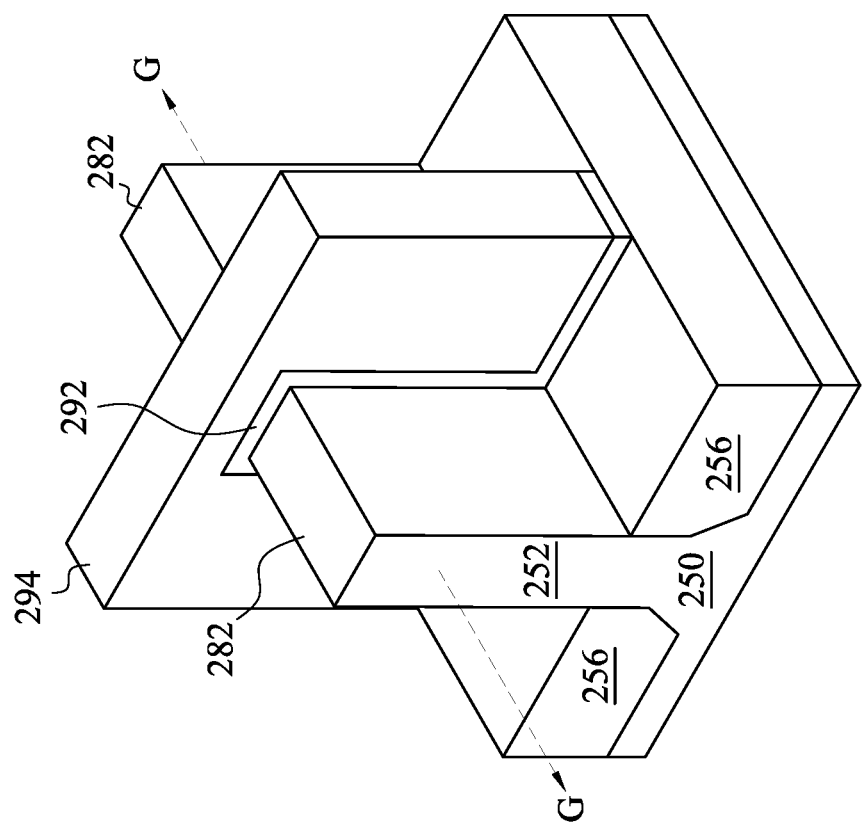
FIG. 33 illustrates an example of a fin field-effect transistor (finFET) in a three-dimensional view, in accordance with some embodiments.

FIGS. 33 and 34A-34E illustrate various views of a gate replacement process for a FinFET device, in accordance with some embodiments. FIG. 33 illustrates an example of a FinFET in a three-dimensional view, in accordance with some embodiments. The FinFET comprises a fin 252 on a substrate 250 (e.g., a semiconductor substrate). Isolation regions 256 are disposed in the substrate 250, and the fin 252 protrudes above and from between neighboring isolation regions 256. Although the isolation regions 256 are described/illustrated as being separate from the substrate 250, as used herein the term "substrate" may be used to refer to just the semiconductor substrate or a semiconductor substrate inclusive of isolation regions. Additionally, although the fin 252 is illustrated as a single, continuous material as the substrate 250, the fin 252 and/or the substrate 25o may comprise a single material or a plurality of materials. In this context, the fin 252 refers to the portion extending between the neighboring isolation regions 256.

A gate dielectric layer 292 is along sidewalls and over a top surface of the fin 252, and a gate electrode 294 is over the gate dielectric layer 292. Source/drain regions 282 are disposed in opposite sides of the fin 252 with respect to the gate dielectric layer 292 and gate electrode 294. Cross-section G-G is along a longitudinal axis of the fin 252 and in a direction of, for example, a current flow between the source/drain regions 282 of the FinFET.

FIGS. 34A through 34E illustrate a gate replacement process for a FinFET device. The views in FIGS. 34A through 34E are taken through the G-G cross section of FIG. 33. These views may be applied to either an n-type region similar to the n-type region 50N, described above, or a p-type region similar to the p-type region 50P, described above. The gate replacement may be made in both regions simultaneously or by distinct processes by utilizing various masks, such as noted above.

Figure 34A:
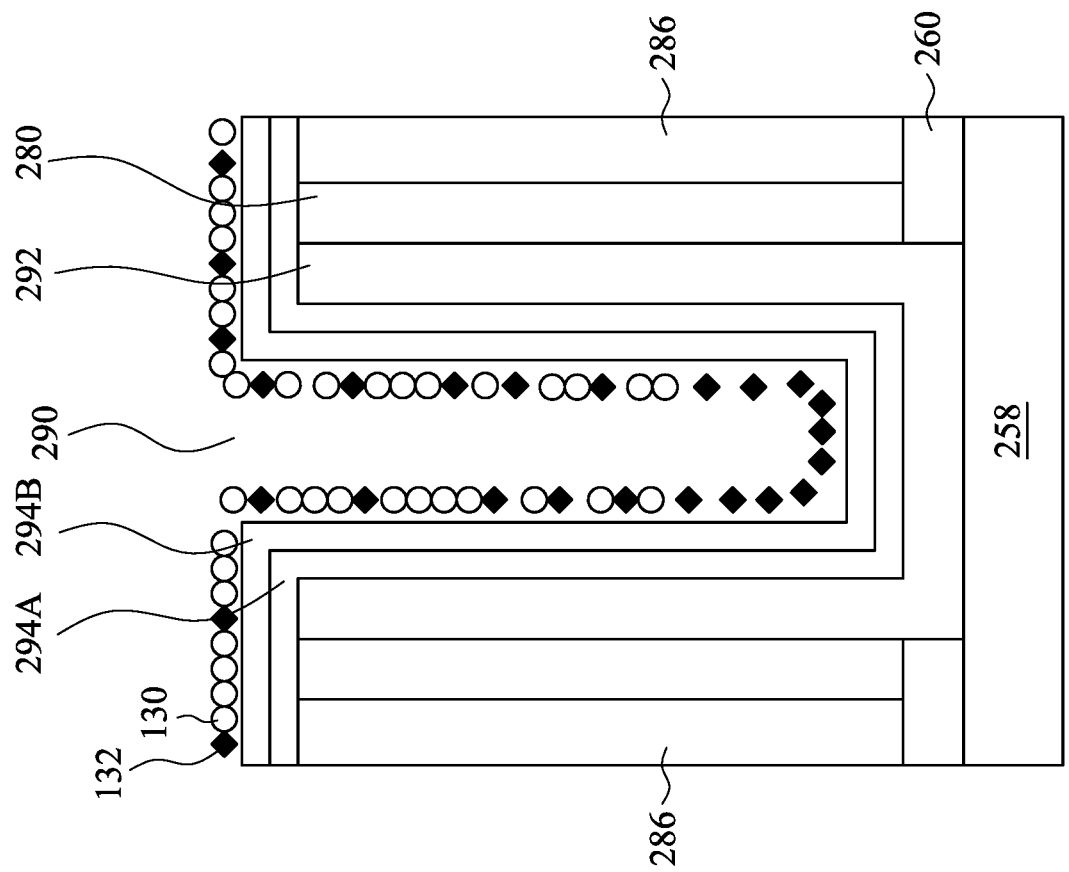
FIGS. 34A through 34E are cross-sectional views of intermediate stages in the manufacturing of finFETs, in accordance with some embodiments.

In FIG. 34A, dummy gates are removed in an etching step(s), so that recesses 290 are formed between gate seal spacers 280 and gate spacers 286. In some embodiments, the dummy gates are removed by an anisotropic dry etch process. For example, the etching process may include a dry etch process using reaction gas(es) that selectively etch the dummy gates with little or no etching of a surrounding the first ILD (not shown) or the gate spacers 286. Each of the recesses 290 exposes and/or overlies a channel region 258 of a respective fin 252. Each channel region 258 is disposed between neighboring pairs of the epitaxial source/drain regions 282. During the removal, a dummy dielectric layer may be used as an etch stop layer when the dummy gates are etched. The dummy dielectric layer may then be optionally removed after the removal of the dummy gates.

Next, gate dielectric layers 292 and various layers 294A and 294B of gate electrodes 294 (see FIG. 34D) are formed for replacement gates. Gate dielectric layers 292 include one or more layers deposited in the recesses 290, such as on the top surfaces and the sidewalls of the fins 252 and on sidewalls of the gate seal spacers 280/gate spacers 286. The gate dielectric layers 292 may also be formed on the top surface of a first ILD which surrounds the gate spacers 286. In some embodiments, the gate dielectric layers 292 comprise one or more dielectric layers, such as one or more layers of silicon oxide, silicon nitride, metal oxide, metal silicate, or the like. For example, in some embodiments, the gate dielectric layers 292 include an interfacial layer of silicon oxide formed by thermal or chemical oxidation and an overlying high-k dielectric material, such as a metal oxide or a silicate of hafnium, aluminum, zirconium, lanthanum, manganese, barium, titanium, lead, and combinations thereof. The gate dielectric layers 292 may include a dielectric layer having a k value greater than about 7.0. The formation methods of the gate dielectric layers 292 may include Molecular-Beam Deposition (MBD), ALD, PECVD, and the like. In embodiments where portions of the dummy gate dielectric remains in the recesses 290, the gate dielectric layers 292 include a material of the dummy gate dielectric (e.g., $SiO_2$).

The liner layers 294A and work function tuning layers 294B of the gate electrodes 294 are deposited over the gate dielectric layers 292, respectively, and together with the fill material 294C, fill the remaining portions of the recesses 290. The gate electrodes 294 may include a metal-containing material such as titanium nitride, titanium oxide, tantalum nitride, tantalum carbide, cobalt, ruthenium, aluminum, tungsten, combinations thereof, or multi-layers thereof. For example, the gate electrode 294 may comprise any number of liner layers 294A, any number of work function tuning layers 294B, and a fill material 294C as illustrated by FIG. 34D.

After the liner layers 294A and work function tuning layers 294B are deposited, a fill material 294C is formed using an electroless plating process (i.e., an electro-chemical plating process), using materials and processes such as described above with respect to FIGS. 21, 22A, 22B, 22C, and 22D. In FIG. 34A, the recesses 290 is immersed in a plating solution where accelerators 132 and suppressors 130 disperse in a manner such that the concentration of accelerators 132 is greater at a bottom of the recesses 290 than on sidewalls of the recesses 290. In likewise fashion, the suppressors 130 disperse in a manner such that the concentration of suppressors 130 is greater on sidewalls of the recesses 290 than at the bottom of the recesses 290.

Figure 34B:
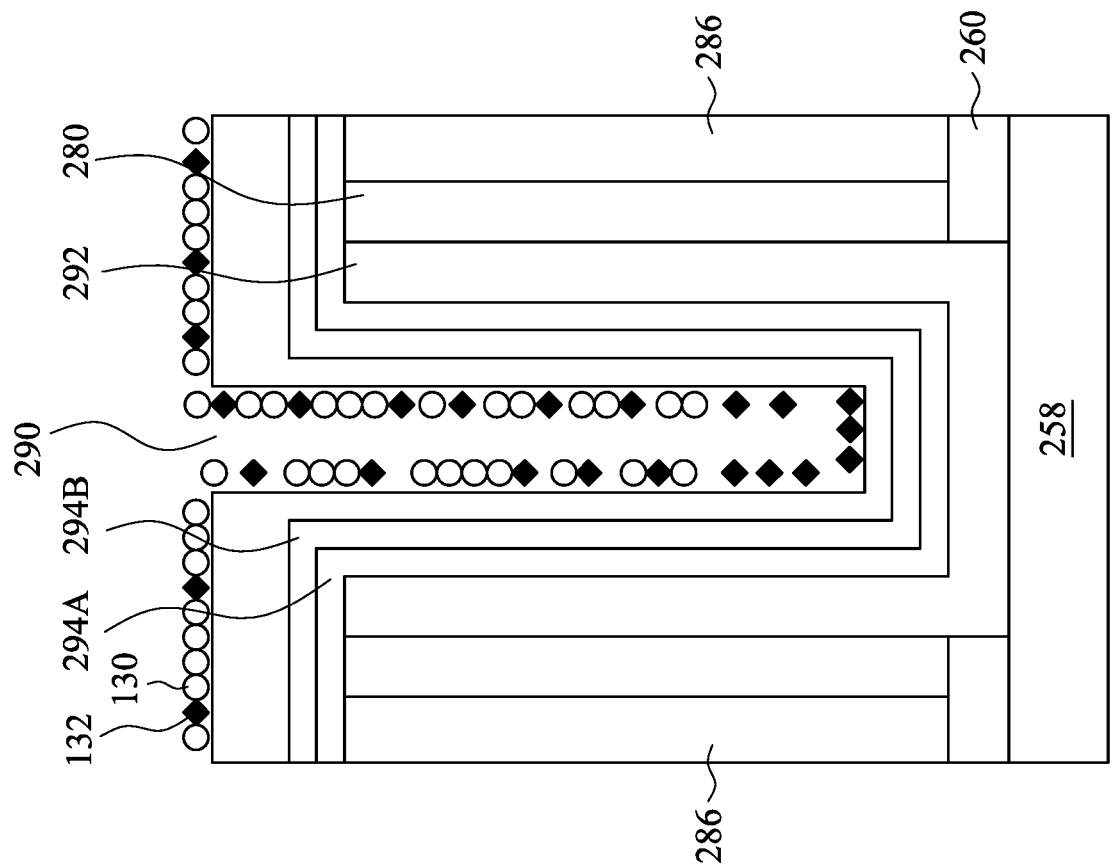

In FIG. 34B, the fill material 294C begins to fill the recesses 290. Because the concentration of accelerators 132 is greater at the bottom of the recesses 290, the fill material 294C is deposited in a manner such that the bottom of the recesses 290 fills more rapidly with the fill material 294C than the sides of the recesses 290, so that a seamless and void less fill may be formed.

Figure 34C:
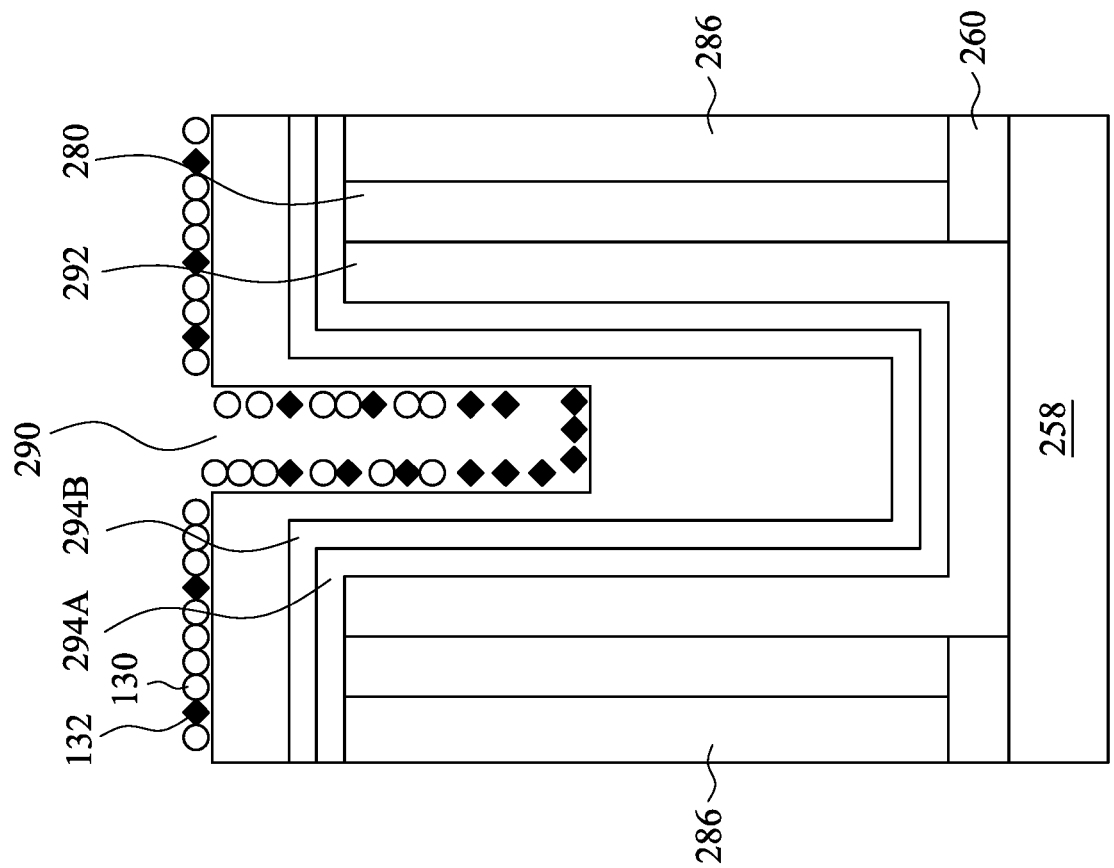
Figure 34D:
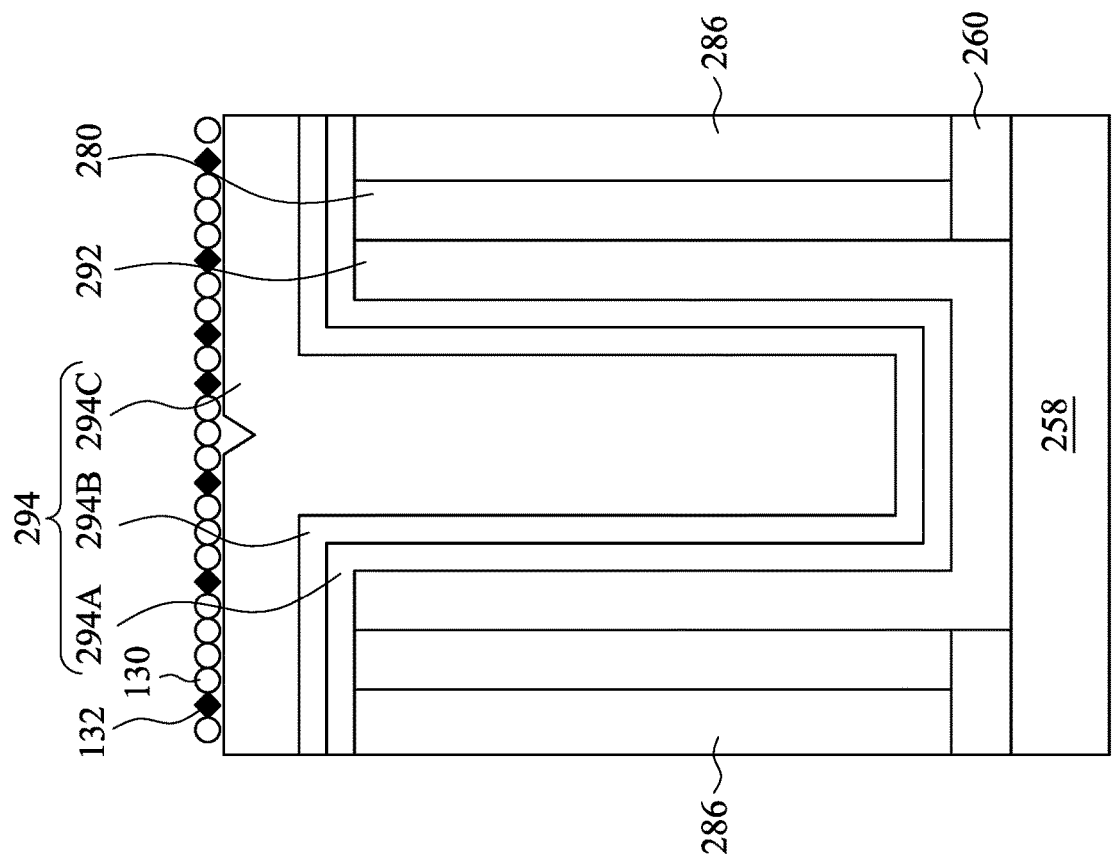
Figure 34E:
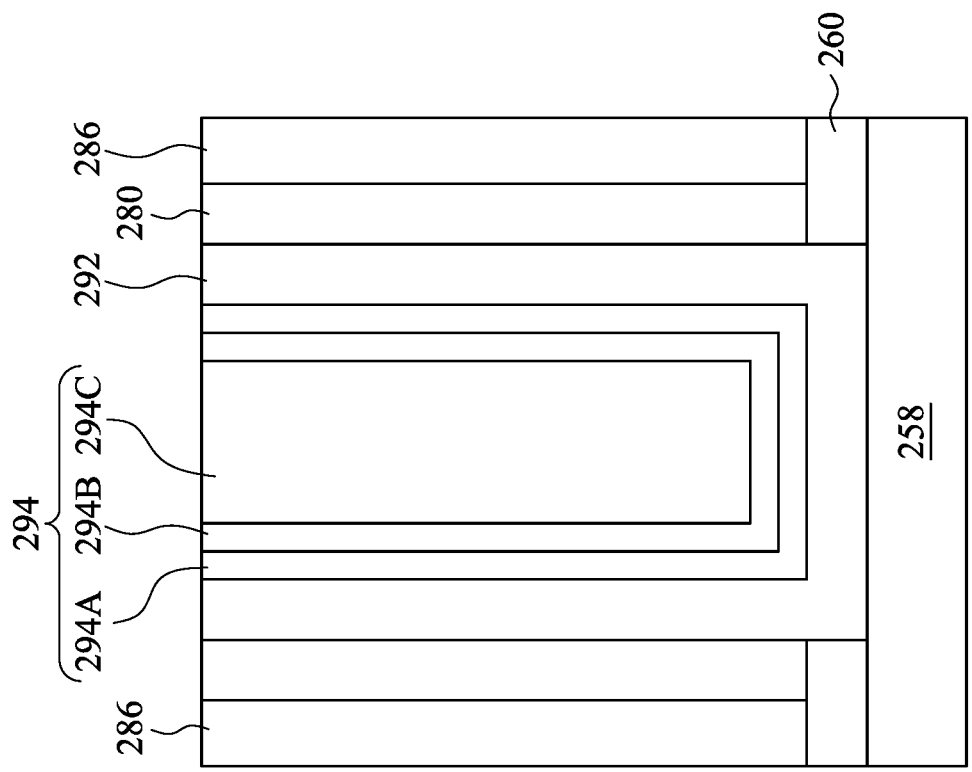

In FIG. 34C, the electro-chemical plating process continues to fill the recesses 290 in a bottom up fashion. In FIG. 34D, the electro-chemical plating process continues to fill the recesses 290 until the fill material 294C over fills the recesses 290.

In FIG. 34D, after the filling of the recesses 290, a planarization process, such as a CMP, may be performed to remove the excess portions of the gate dielectric layers 292 and the material of the gate electrodes 294, which excess portions are over the top surface of the ILD which surrounds the gate spacers 286. The remaining portions of material of the gate electrodes 294 and the gate dielectric layers 292 thus form replacement gates of the resulting FinFETs. The gate electrodes 294 and the gate dielectric layers 292 may be collectively referred to as a "gate stack." The gate and the gate stacks may extend along sidewalls of a channel region 258 of the fins 252.

Embodiments advantageously use a gate replacement process for a nanoFET or FinFET which utilizes electroless plating techniques to achieve a bottom up fill. Using the electroless plating technique provides the ability to fill the replacement gates while reducing voids and eliminating seams in the fill for the gate electrodes of the nanoFET. Accelerators and suppressors can be added to the plating solution to inhibit sidewall deposition of the gate electrode material while promoting bottom deposition of the gate electrode material, providing the ability to deposit the electrode material in small openings and around the nanostructures which form the channels for the nanoFETs.

One embodiment is a method including etching a dummy gate of a transistor to remove the dummy gate and form a first opening. The method also includes etching to remove first nanostructures and to extend the first opening, thereby exposing second nanostructures of the transistor. The method also includes depositing a first dielectric layer in the first opening, the first dielectric layer surrounding the second nanostructures. The method also includes depositing a first work function layer in the first opening, the first work function layer surrounding the second nanostructures and the first dielectric layer. The method also includes depositing a glue layer in the first opening, the glue layer surrounding the second nanostructures. The method also includes submerging the first opening in an electro-chemical plating solution to plate a metal into the first opening, the metal filling the first opening. In an embodiment, the electro-chemical plating solution includes metal ions or metal salts, a reducer, suppressors, and accelerators. In an embodiment, the accelerators are more densely distributed at a bottom of the first opening than at sidewalls of the first opening during plating the metal, and the suppressors are more densely distributed at the sidewalls of the first opening than at the bottom of the first opening during plating the metal. In an embodiment, the method may include: planarizing the metal, the glue layer, the first work function metal, and the first dielectric layer to level upper surfaces of the metal, the glue layer, the first work function metal, and the first dielectric layer with each other. In an embodiment, the method may include: prior to depositing the first dielectric layer in the first opening, depositing an interfacial layer in the first opening, the interfacial layer surrounding the second nanostructures. In an embodiment, plating the metal includes: depositing the metal using a bottom up process. In an embodiment, plating the metal includes: filling a space vertically between the second nanostructures. In an embodiment, the first work function layer around a first one of the second nanostructures merges with the first work function layer around a second one of the second nanostructures.

Another embodiment is a method including growing epitaxial source/drain regions in a fin recess on either side of a gate. The method also includes performing a replacement gate process, the replacement gate process including removing a dummy gate structure between two gate spacers of the gate to form an opening between the two gate spacers. The method also includes depositing a first gate dielectric layer in the opening, the first gate dielectric layer covering a channel region of the gate. The method also includes depositing a work function layer in the opening, the work function layer covering the first gate dielectric layer. The method also includes plating a conductive fill in the opening by an electroless plating process, the electroless plating process plating the conductive fill at a bottom of the opening at a plating rate which is 10 to 25 times greater than at sides of the opening. In an embodiment, the plating may include submerging the opening in a plating solution, the plating solution including a metal ion and a reducing agent. In an embodiment, the plating solution may include accelerators and suppressors, a ratio of accelerators to suppressors being between 10:1 and 100:1 at the bottom of the opening. In an embodiment, an overall ratio of accelerators to suppressors by weight in the plating solution is between 1:5 and 5:1. In an embodiment, the method may include planarizing the gate to level upper surfaces of the first gate dielectric layer, work function layer, and conductive fill to each other. In an embodiment, the work function layer fills a space between two nanostructures of the channel region.

Another embodiment is a method including forming a first nano field effect transistor (nano-FET) gate structure, the forming including: forming multiple nanostructure channel regions, depositing a gate dielectric layer surrounding the multiple nanostructure channel regions, depositing a gate work function layer surrounding the gate dielectric layer, and depositing a gate fill surrounding the gate work function layer, the gate, the depositing the gate fill including: providing a plating solution in an opening corresponding to the gate fill, providing accelerators and suppressors in the plating solution, and reducing a metal from the plating solution to deposit the metal at a bottom of the opening. The method also includes forming a first epitaxial source/drain region and a second epitaxial source/drain region disposed on either side of the first nano-FET gate structure, where the multiple nanostructure channel regions extend from the first source/drain region to the second source/drain region. In an embodiment, the gate fill includes an oxidation of the suppressor or an oxidation of the accelerator, and the gate fill is free of fluorine. In an embodiment, the gate fill includes an oxide of the first metal or a byproduct of a reducing agent. In an embodiment, the metal includes tungsten, cobalt, or nickel. In an embodiment, a height to width ratio of the gate fill is between 10:1 and 20:1 in a cross-section through the first epitaxial source/drain region and the second epitaxial source/drain region. In an embodiment, the gate work function layer includes a p-metal work function tuning layer.

Another embodiment is a method including etching a dummy gate over a channel nanostructure to remove the dummy gate and form a first opening revealing the channel nanostructure. The method also includes etching a dummy nanostructure abutting the channel nanostructure to remove the dummy nanostructure and expose a surface of the channel nanostructure. The method also includes depositing a first dielectric layer in the first opening, the first dielectric layer surrounding the channel nanostructure. The method also includes providing an aqueous plating solution to the first opening to plate a metal into the first opening, the metal filling up the first opening, the aqueous plating solution including suppressors, where the suppressors are more densely distributed at sidewalls of the first opening than at a bottom of the first opening during plating the metal. In an embodiment, the aqueous plating solution further includes metal ions or metal salts, a reducer, and accelerators. In an embodiment, the accelerators are more densely distributed at the bottom of the first opening than at the sidewalls of the first opening during plating the metal. In an embodiment, the method further includes prior to providing the aqueous plating solution, depositing a work function layer in the first opening. In an embodiment, the channel nanostructure is a first channel nanostructure, where the first opening further reveals a second channel nanostructure, and where the work function layer is deposited to surround the first channel nanostructure and the second channel nanostructure, where a portion of the work function layer surrounding the first channel nanostructure merges with a portion of the work function layer surrounding the second channel nanostructure. In an embodiment, the method further includes leveling upper surfaces of the metal, the work function layer, and the first dielectric layer to each other. In an embodiment, the method further includes prior to depositing the first dielectric layer in the first opening, depositing an interfacial layer in the first opening, the interfacial layer surrounding the channel nanostructure. In an embodiment, the first opening includes a first space vertically extending between the channel nanostructure and a second channel nanostructure, where plating the metal into the first opening fills first space.

Another embodiment is a method including depositing epitaxial source/drain regions in a fin recess on either side of a gate. The method also includes removing a dummy gate structure between two gate spacers of the gate to form an opening between the two gate spacers. The method also includes depositing a first gate dielectric layer in the opening, the first gate dielectric layer covering a channel region of the gate. The method also includes chemically plating a conductive fill in the opening, at a plating rate which is 10 to 25 times greater at a bottom of the opening than at sides of the opening. In an embodiment, the plating includes providing a plating solution to the opening, the plating solution including a metal ion and a reducing agent. In an embodiment, the plating solution further includes accelerators and suppressors. In an embodiment, during the plating, a ratio of accelerators to suppressors at the bottom of the opening is between 10:1 and 100:1. In an embodiment, an overall ratio of accelerators to suppressors by weight in the plating solution is between 1:5 and 5:1. In an embodiment, the method further includes leveling upper surfaces of the first gate dielectric layer and conductive fill to each other.

Another embodiment is a method including removing a dummy gate to form a recess exposing a nanostructure channel region, where a height to width ratio of the recess is between 10:1 and 20:1. The method also includes depositing a gate dielectric layer on the nanostructure channel region. The method also includes depositing a gate electrode on the gate dielectric layer, where depositing the gate electrode includes providing a plating solution into the recess, the plating solution including chemical accelerators and chemical suppressors, and reducing a metal from the plating solution to deposit the metal in the recess. In an embodiment, the gate electrode includes a compound material of the chemical suppressors and oxygen or a compound material of the chemical accelerators and oxygen. In an embodiment, the gate electrode is free of fluorine. In an embodiment, the gate electrode includes an oxide of the metal. In an embodiment, the metal includes tungsten, cobalt, or nickel, further including: prior to depositing the gate electrode, deposing a gate work function layer, the gate work function layer including a p-metal work function tuning layer; and depositing a glue layer over the gate work function layer. In an embodiment, while providing the plating solution into the recess, a ratio of the chemical accelerators to the chemical suppressors is between 10:1 and 100:1 at a bottom of the recess.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   etching a dummy gate over a channel nanostructure to remove the dummy gate and form a first opening revealing the channel nanostructure;
   etching a dummy nanostructure abutting the channel nanostructure to remove the dummy nanostructure and expose a surface of the channel nanostructure;
   depositing a first dielectric layer in the first opening, the first dielectric layer surrounding the channel nanostructure; and
   providing an aqueous plating solution to the first opening to plate a metal into the first opening, the metal filling up the first opening, the aqueous plating solution comprising suppressors, wherein the suppressors are more densely distributed at sidewalls of the first opening than at a bottom of the first opening during plating the metal.

2. The method of claim 1, wherein the aqueous plating solution further comprises metal ions or metal salts, a reducer, and accelerators.

3. The method of claim 2, wherein the accelerators are more densely distributed at the bottom of the first opening than at the sidewalls of the first opening during plating the metal.

4. The method of claim 1, further comprising:
   prior to providing the aqueous plating solution, depositing a work function layer in the first opening.

5. The method of claim 4, wherein the channel nanostructure is a first channel nanostructure, wherein the first opening further reveals a second channel nanostructure, and wherein the work function layer is deposited to surround the first channel nanostructure and the second channel nanostructure, wherein a portion of the work function layer surrounding the first channel nanostructure merges with a portion of the work function layer surrounding the second channel nanostructure.

6. The method of claim 4, further comprising:
   leveling upper surfaces of the metal, the work function layer, and the first dielectric layer to each other.

7. The method of claim 1, further comprising:
   prior to depositing the first dielectric layer in the first opening, depositing an interfacial layer in the first opening, the interfacial layer surrounding the channel nanostructure.

8. The method of claim 1, wherein the first opening includes a first space vertically extending between the channel nanostructure and a second channel nanostructure, wherein plating the metal into the first opening fills first space.

9. A method comprising:
   depositing epitaxial source/drain regions in a fin recess on either side of a gate;
   removing a dummy gate structure between two gate spacers of the gate to form an opening between the two gate spacers;
   depositing a first gate dielectric layer in the opening, the first gate dielectric layer covering a channel region of the gate; and
   chemically plating a conductive fill in the opening, at a plating rate which is 10 to 25 times greater at a bottom of the opening than at sides of the opening.

10. The method of claim 9, wherein the plating comprises:
    providing a plating solution to the opening, the plating solution comprising a metal ion and a reducing agent.

11. The method of claim 10, wherein the plating solution further comprises accelerators and suppressors.

12. The method of claim 11, wherein during the plating, a ratio of accelerators to suppressors at the bottom of the opening is between 10:1 and 100:1.

13. The method of claim 11, wherein an overall ratio of accelerators to suppressors by weight in the plating solution is between 1:5 and 5:1.

14. The method of claim 9, further comprising:
leveling upper surfaces of the first gate dielectric layer and conductive fill to each other.

15. A method comprising:
removing a dummy gate to form a recess exposing a nanostructure channel region, wherein a height to width ratio of the recess is between 10:1 and 20:1;
depositing a gate dielectric layer on the nanostructure channel region; and
depositing a gate electrode on the gate dielectric layer, wherein depositing the gate electrode comprises:
providing a plating solution into the recess, the plating solution including chemical accelerators and chemical suppressors, and
reducing a metal from the plating solution to deposit the metal in the recess.

16. The method of claim 15, wherein the gate electrode comprises a compound material of the chemical suppressors and oxygen or a compound material of the chemical accelerators and oxygen.

17. The method of claim 15, wherein the gate electrode is free of fluorine.

18. The method of claim 15, wherein the gate electrode comprises an oxide of the metal.

19. The method of claim 15, wherein the metal comprises tungsten, cobalt, or nickel, further comprising:
prior to depositing the gate electrode, deposing a gate work function layer, the gate work function layer comprising a p-metal work function tuning layer; and
depositing a glue layer over the gate work function layer.

20. The method of claim 15, wherein, while providing the plating solution into the recess, a ratio of the chemical accelerators to the chemical suppressors is between 10:1 and 100:1 at a bottom of the recess.

* * * * *